(12) United States Patent
Berg, Jr. et al.

(10) Patent No.: US 7,324,348 B2
(45) Date of Patent: Jan. 29, 2008

(54) TELECOMMUNICATIONS CHASSIS AND CARD

(75) Inventors: Robin Berg, Jr., Shakopee, MN (US); Todd Husom, Crystal, MN (US); Derek Sayres, Lonsdale, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 11/171,081

(22) Filed: Jun. 28, 2005

(65) Prior Publication Data

US 2006/0002098 A1  Jan. 5, 2006

Related U.S. Application Data

(63) Continuation of application No. 10/636,365, filed on Aug. 7, 2003, now Pat. No. 6,940,730, which is a continuation of application No. 09/860,653, filed on May 18, 2001, now Pat. No. 6,707,686, which is a continuation-in-part of application No. 09/825,163, filed on Apr. 3, 2001, now Pat. No. 6,590,782, which is a continuation-in-part of application No. 09/795,656, filed on Feb. 28, 2001, now Pat. No. 6,637,845.

(51) Int. Cl.
*H05K 5/00* (2006.01)
(52) U.S. Cl. .................. 361/752; 361/756; 361/800
(58) Field of Classification Search ............ 361/752, 361/790, 800–802, 727, 756, 797, 748, 737; 211/41; 312/223
See application file for complete search history.

(56) References Cited

U.S. PATENT DOCUMENTS 4,328,897 A   5/1982  Weiss ................... 211/41
4,501,368 A   2/1985  Gill ..................... 211/186

(Continued)

FOREIGN PATENT DOCUMENTS

DE    1271793    7/1968

(Continued)

OTHER PUBLICATIONS

ADC Transport Systems Group Complete Product Catalog, ADC Telecommunications, Inc., Sep. 1998.

(Continued)

*Primary Examiner*—Tuan T. Dinh
*Assistant Examiner*—Hung S Bui
(74) *Attorney, Agent, or Firm*—Merchant & Gould P.C.

(57) ABSTRACT

A chassis and associated telecommunication circuit card are disclosed. The chassis has heat dissipation and flame containment features while accommodating a high density of the circuitry cards. Embodiments include an inner housing with a double-layer middle floor dividing the chassis into top and bottom chambers. Each layer has partially aligned slots, and an air gap is provided between the two layers. Embodiments also include a double-layer mesh cover with an air gap existing between the two mesh layers. Projections and grooves are provided on the inner surfaces of the inner housing to receive circuit cards having a guide on one edge and a fin on another. The circuit card includes conductor structures such as multiple board layers with paired and segregated conductors. The circuit card also includes some components positioned to cooperate with the ventilation features of the chassis and includes some components chosen for low-power consumption or reduced flammability.

6 Claims, 82 Drawing Sheets

U.S. PATENT DOCUMENTS

| | | | |
|---|---|---|---|
| 4,631,641 A * | 12/1986 | Brombal et al. | 361/818 |
| 5,319,520 A | 6/1994 | Sugiyama et al. | 211/41.17 |
| 5,339,362 A | 8/1994 | Harris | 381/86 |
| 5,350,304 A | 9/1994 | Fula et al. | 312/213 |
| 5,394,305 A | 2/1995 | Moral et al. | 361/776 |
| 5,504,657 A | 4/1996 | Bellino et al. | 174/35 R |
| 5,541,586 A | 7/1996 | Wise | 361/800 |
| 5,590,938 A | 1/1997 | De Andrea | 312/265.5 |
| 5,816,673 A | 10/1998 | Sauer et al. | 312/223.2 |
| 5,877,938 A | 3/1999 | Hobbs et al. | 361/724 |
| 5,892,662 A | 4/1999 | Verna | 361/796 |
| 5,893,618 A | 4/1999 | LePage, Jr. et al. | 312/213 |
| 5,940,266 A | 8/1999 | Hamilton et al. | 165/80.3 |
| 5,966,648 A | 10/1999 | Ortberg et al. | 455/347 |
| 5,991,163 A * | 11/1999 | Marconi et al. | 361/788 |
| 6,151,213 A | 11/2000 | Ater et al. | 174/16.1 |
| 6,154,361 A | 11/2000 | Anderson et al. | 312/223.1 |
| 6,164,738 A | 12/2000 | Dane et al. | 312/213 |
| 6,181,570 B1 | 1/2001 | Ellebrecht et al. | 361/797 |
| 6,246,580 B1 | 6/2001 | Weng | 312/223.2 |
| 6,285,548 B1 | 9/2001 | Hamlet et al. | 361/695 |
| 6,317,329 B1 | 11/2001 | Dowdy et al. | 312/332.1 |
| 6,322,175 B1 | 11/2001 | Aggus et al. | 312/223.1 |
| 6,356,444 B1 * | 3/2002 | Pedoeem | 361/692 |
| 6,590,782 B2 | 7/2003 | Fritz et al. | 361/796 |
| 6,637,845 B2 | 10/2003 | Berg, Jr. et al. | 312/223.2 |
| 2004/0036819 A1 * | 2/2004 | Ryu et al. | 349/58 |

FOREIGN PATENT DOCUMENTS

| | | | |
|---|---|---|---|
| DE | 1282758 | 11/1968 | |
| DE | 2164371 | 6/1973 | |
| DE | 2710356 | 9/1977 | 312/213 |
| EP | 0881 871 A2 | 12/1998 | |

OTHER PUBLICATIONS

Soneplex DS3 Remote Control System, ADC Telecommunications, Inc., Jan. 1998.
Soneplex LAN Extension System, ADC Telecommunications, Inc., Feb. 1998.
Soneplex E1 Loop Extender Platform, ADC Telecommunications, Inc., Jan. 1998.
Soneplex Access Multiplexer System, SDH Version,, ADC Telecommunications, Inc., Mar. 1998.
Soneplex Access Multiplexer System, ADC Telecommunications, Inc., Feb. 1998.
Soneplex Loop Extender System, ADC Telecommunications, Inc., Dec. 1998.
Soneplex HDSL Test Kits, ADC Telecommunications, Inc., Aug. 1998.
Soneplex HDSL 239 Repeater, ADC Telecommunications, Inc., Mar. 1998.
Soneplex HDSL Remote Enclosures, ADC Telecommunications, Inc., May 1998.
Soneplex 220 HDSL Single-Position Chassis, ADC Telecommunications, Inc., Nov. 1997.
Soneplex HDSL 819 Repeater, ADC Telecommunications, Inc., Nov. 1997.
Soneplex Radiator HDSL Repeater Housings—A Recipe For Success, ADC Telecommunications, Inc., May 1998.
Soneplex Nx 64 KBPS E1 HDSL System, ADC Telecommunications, Inc., Jan. 1998.
Soneplex HDSL Single Shot Repeater, ADC Telecommunications, Inc., Nov. 1997.
Soneplex 220 HDSL Two-Position Chassis, ADC Telecommunications, Inc., Jan. 1998.
Soneplex 3192 HDSL Module, ADC Telecommunications, Inc., Nov. 1997.
Soneplex T1 Repeater Module, ADC Telecommunications, Inc., Nov. 1997.
Soneplex 220 HDSL Module, ADC Telecommunications, Inc., Nov. 1997.
Soneplex HDSL Central Office Module, ADC Telecommunications, Inc., Mar. 1998.
Soneplex HDSL OEM Subassembly, ADC Telecommunications, Inc., Jun. 1998.
Soneplex High-Powered HDSL Module (HEMI), ADC Telecommunications, Inc., Oct. 1998.
A New Twist On An Old Pair HDSL2: A Total Systems Approach, ADC Telecommunications, Inc., Nov. 1998.
Soneplex E1 Quad Loop Extender Four-Position Remote Chassis, ADC Telecommunications, Inc., Sep. 1998.
Soneplex E1 Quad Loop Extender Two-Position Remote Chassis, ADC Telecommunications, Inc., Sep. 1998.
Soneplex E1 Quad Loop Extender Module (EQLX), ADC Telecommunications, Inc., Sep. 1998.
Soneplex Quad Loop Extender Four Position Remote Chassis, ADC Telecommunications, Inc., Nov. 1997.
Soneplex Quad Loop Extender Two-Position Remote Chassis, ADC Telecommunications, Inc., Nov. 1997.
Soneplex Quad Loop Extender Module (QLX) , ADC Telecommunications, Inc., Oct. 1997.
Soneplex ECX Channel Extender System, ADC Telecommunications, Inc., May 1998.
Soneplex Streaker Module, ADC Telecommunications, Inc., Nov. 1997.
Soneplex Test Access Unit, ADC Telecommunications, Inc., Nov. 1997.
Soneplex Extender Module, ADC Telecommunications, Inc., Nov. 1997.
Soneplex SNMP Management Access Point, ADC Telecommunications, Inc., Feb. 1998.
Soneplex DSI Loop Extender Module, ADC Telecommunications, Inc., Feb. 1998.
Soneplex ADSL Loop Extender, ADC Telecommunications, Inc., Jun. 1998.
Soneplex Radiator Below Ground HDSL Repeater Housing, ADC Telecommunications, Inc., Feb. 1998.
Soneplex Radiator Above Ground HDSL Repeater Case, ADC Telecommunications, Inc., Nov. 1997.
Soneplex Radiator Test Access Card, ADC Telecommunications, Inc.
EZT1/DI Voice and Data Multiplexer, ADC Telecommunications, Inc., Jun. 1998.
EZT1 Voice Multiplexer, ADC Telecommunications, Inc., Mar. 1998.
EZT1/DI—HDSL Voice and Data Multiplexer, ADC Telecommunications, Inc., Jul. 1998.
EZT3 DS3 Access Multiplexer, ADC Telecommunications, Inc., Nov. 1997.
Opera Service Matrix Platform, ADC Telecommunications, Inc., Nov. 1998.
Cellworx STN Service Transport Node, ADC Telecommunications, Inc., Mar. 1998.
Cellworx STN Service Transport Node SDH Version, ADC Telecommunications, Inc., Apr. 1998.
Cellworx Subscriber Access Terminal (SAT-100) ADSL Adapter, ADC Telecommunications, Inc.
Cellworx Subscriber Access Terminal (SAT-150) ADSL Remote Access Unit, ADC Telecommunications, Inc., Jul. 1997.
Fiber-Based ATM Virtual Path Rings—The Right Answer For Distance Learning Networks, ADC Telecommunications, Inc., Jul. 1998.
DS3 Fiber Loop Converter, ADC Telecommunications, Inc., Jan. 1997.
E1 Dual Fiber Loop Converter System, ADC Telecommunications, Inc., May 1997.
E1 Quad Fibre Loop Converter and Universal Mounting Chassis, ADC Telecommunications, Inc., Jan. 1998.
E1 Quad Fibre Loop Converter System B2 Version, ADC Telecommunications, Inc., May 1998.
Network Control Patchwork and PatchSwitch Products-Sixth Edition, ADC Telecommunications, Inc., Nov. 1995.

PatchMare Miniature Chassis, ADC Telecommunications, Inc., Feb. 1997.

FL1000 Customer Premises Fiber Distribution Products, ADC Telecommunications, Inc.

Fiber Cable Management Products, ADC Telecommunications, Inc., Jun. 1998.

FiberGuide Fiber Management Systems, ADC Telecommunications, Inc., Jun. 1998.

Fiber Entrance Cabinet, ADC Telecommunications, Inc., Jul. 1998.

Secure Fiber Entrance Terminal (SFET), ADC Telecommunications, Inc., May 1998.

Optical Test Access Unit (OTAU), ADC Telecommunications, Inc., Mar. 1998.

Value-Added Module System, ADC Telecommunications, Inc., Jun. 1998.

Fiber Optic Couplers, Splitters and Wavelength Division Multiplexer, ADC Telecommunications, Inc., Jul. 1997.

FiberBase Fiber Network Management Software, ADC Telecommunications, Inc., Apr. 1998.

Homeworx Access Platform Telephony System, ADC Telecommunications, Inc., Feb. 1996.

HWX Receiver Modules Forward Path and Dual Return Path Receiver, ADC Telecommunications, Inc., Dec. 1998.

DV6000 Universal Digital Transmission System Dual DS3/DS1 Encoders and Decooders, ADC Telecommunications, Inc., 1996.

DV6000 Universal Digital Transmission System Dual E3/E1 Encoders and Decoders, ADC Telecommunications, Inc., 1996.

DV6000 Intermediate Frequency (IF) Video Encoders and Decoders, ADC Telecommunications, Inc., Dec. 1998.

DV6000 Universal Digital Transmission System DV6000 Repeater Shelf and Controller, ADC Telecommunications, Inc., 1996.

DV6010 Bidirectional Digital Transmission System, ADC Telecommunications, Inc., Jul. 1997.

DV6000 Universal Digital Transmission System DV-6120-DS Dual Optical Switch, ADC Telecommunications, Inc., 1996.

DV6300 Single Channel Digital Transport System, ADC Telecommunications, Inc., Jun. 1997.

DV6000 Universal Digital Transmission System Serial Digital Video (D1) Interface Cards, ADC Telecommunications, Inc., 1996.

DV6000 Dense Wavelength Division Multiplexing (DWDM) with DV6000, ADC Telecommunications, Inc., Jun. 1997.

DV6000 PAL IF Encoders and Decoders, ADC Telecommunications, Inc., Dec. 1998.

DV6000 MMDS Optimized Intermediate Frequency (IF) Encoders and Decoders, ADC Telecommunications, Inc., Dec. 1998.

DV6000 DVFE Fast EtherRing Switch 10Base-T and 100Base-TXFX, ADC Telecommunications, Inc., Dec. 1998.

Homeworx Transport Platform Forward Path Headend Optical Transmitter, ADC Telecommunications, Inc., 1996.

Homeworx Transport Platform RL1/RL9 Forward Path Optical Receivers, ADC Telecommunications, Inc., 1996.

Homeworx Transport Platform Reverse Path QUAD Receiver and QUAD RF A/B Switch, ADC Telecommunications, Inc., 1996.

Homeworx Transport Platform Targeted Services Distribution Shelf, ADC Telecommunications, Inc., 1996.

Homeworx HWX Transmission System HWX 1550 nm Transmitter and Amplifier, ADC Telecommunications, Inc., 1996.

Homeworx HWX Transmission System HWX 750 MHz 1310 nm DFB Transmitter, ADC Telecommunications, Inc., 1996.

Homeworx HWX Transmission System HWX 1310/1550 nm Equipment Shelf, ADC Telecommunications, Inc., 1996.

Homeworx HWX Transmission System HWX Power Supply/Controller Module, ADC Telecommunications, Inc.

Homeworx HWX Transmission System HWX 860 MHz 1310 nm DFB Transmitter, ADC Telecommunications, Inc.

Homeworx HWX Integrated Fan and Power Supply, ADC Telecommunications, Inc., Nov. 1997.

Smart-Nett Advanced Network Management, ADC Telecommunications, Inc., Nov. 1997.

OSWORX Commander, ADC Telecommunications, Inc., Dec. 1998.

DSX-1 Digital Signal Cross-Connect Modules, Panels and Accessories (Sixth Edition), , ADC Telecommunications, Inc., May 1998.

DSX-1 Digital Signal Cross-Connect Super High Density Bays High Density Bays (Sixth Edition), ADC Telecommunications, Inc., May 1998.

PxPlus DS1 Digital Signal Cross-Connect, ADC Telecommunications, Inc., Jan. 1997.

84 Termination Modular Bantam Jack Panel, ADC Telecommunications, Inc., Sep. 1998.

RZX-3 Reduced Size DSX-3, ADC Telecommunications, Inc., Jul. 1998.

RZX-3 Rear Cross-Connect Products, ADC Telecommunications, Inc., Jul. 1998.

Mini DSX-3 Products, ADC Telecommunications, Inc., Jun. 1997.

Mini DSX-3 Cross Aisle and Interbay Patch Panels, ADC Telecommunications, Inc., Feb. 1997.

Enteraprise 6000 High Performance Patch Cords, ADC Telecommunications, Inc., Oct. 1998.

Enteraprise 5000E Multimedia Outlets, ADC Telecommunications, Inc., Oct. 1998.

Enteraprise 5000E Patch Panels, ADC Telecommunications, Inc., Aug. 1998.

Enteraprise Structured Connectivity Systems FL1000 Product Family, ADC Telecommunications, Inc., Nov. 1998.

Chassis—Unloaded, Unloaded Chassis, ADC Telecommunications, Inc., Jul. 1998.

U.S. Appl. No. 09/861,187 entitled "Telecommunications Chassis and Card" (02316-1494US01).

* cited by examiner

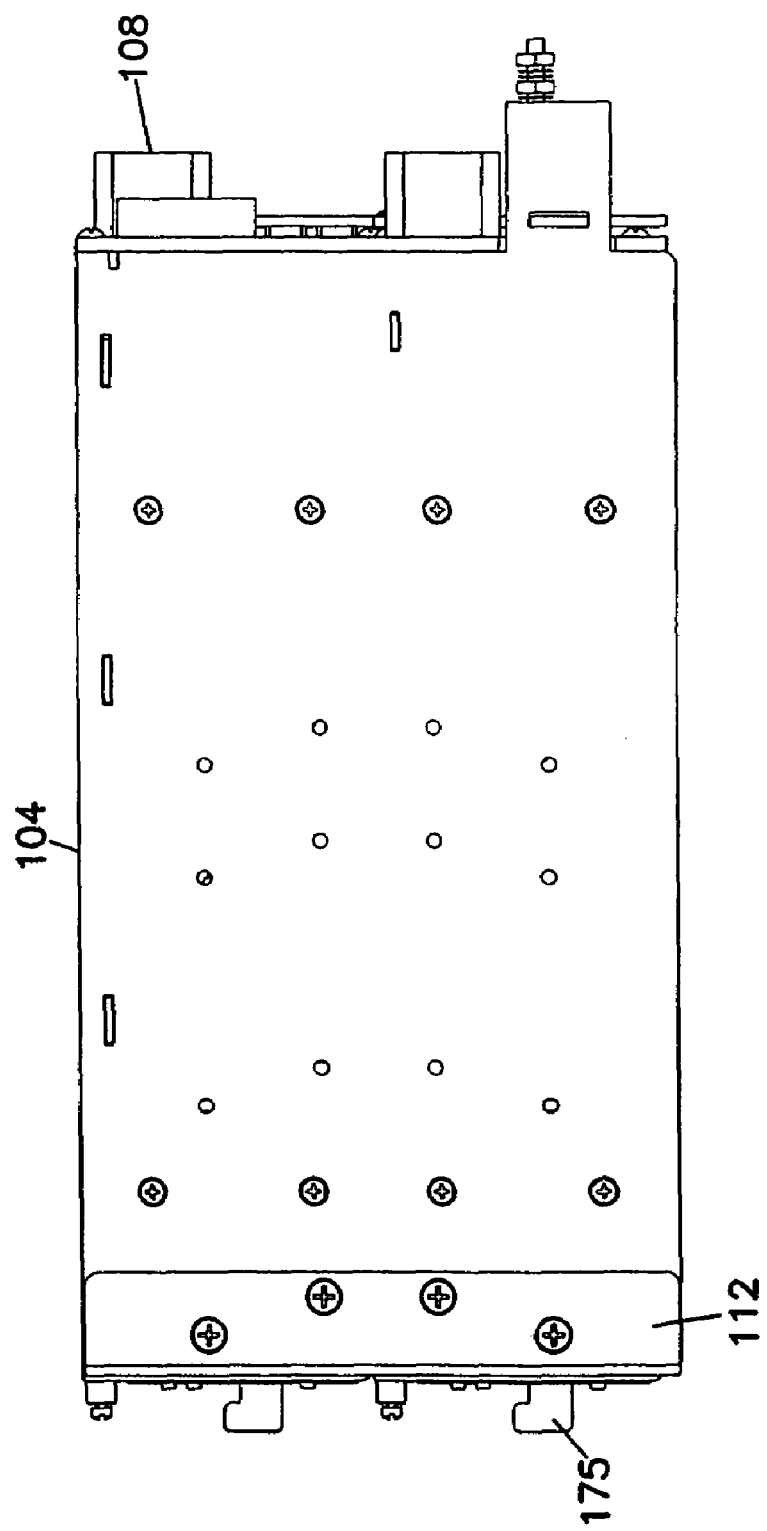

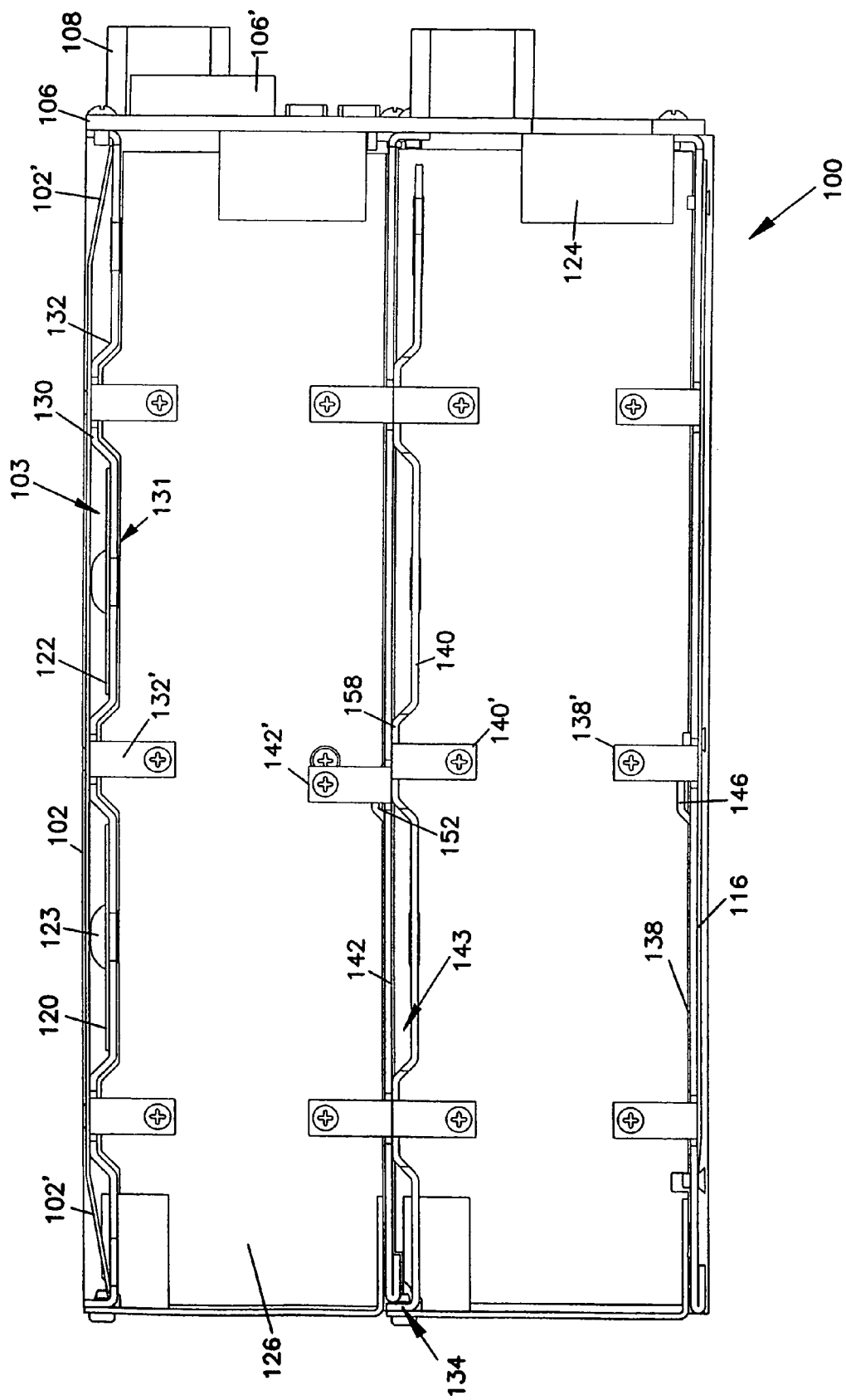

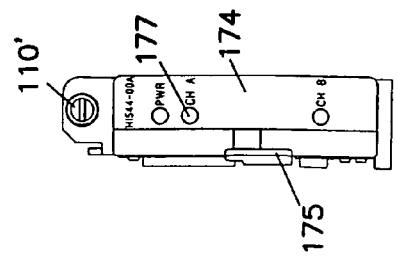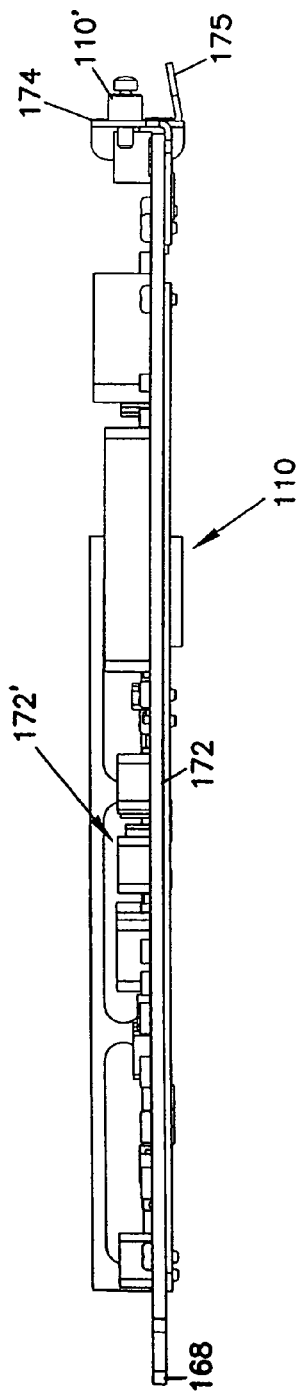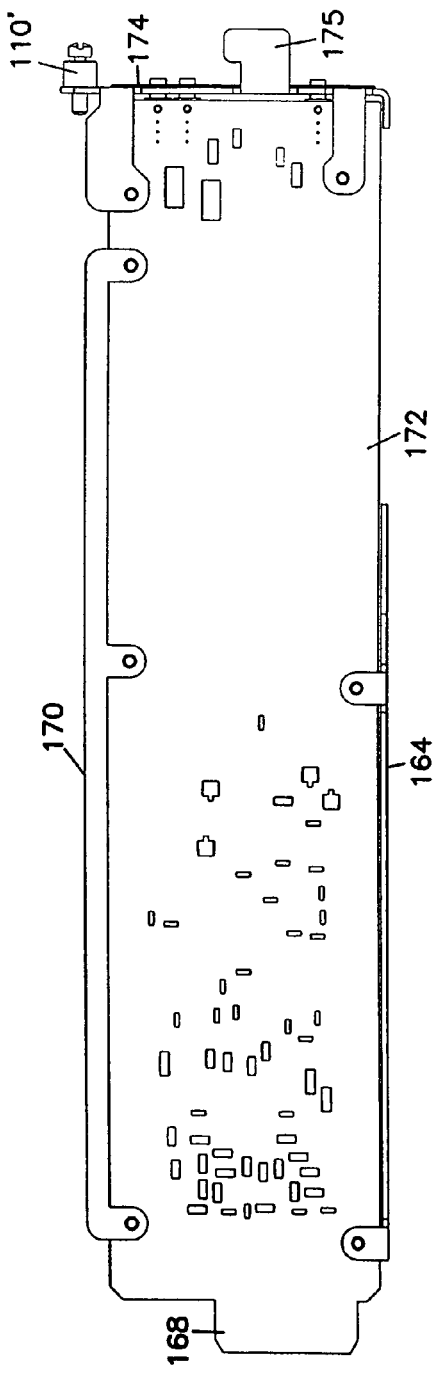

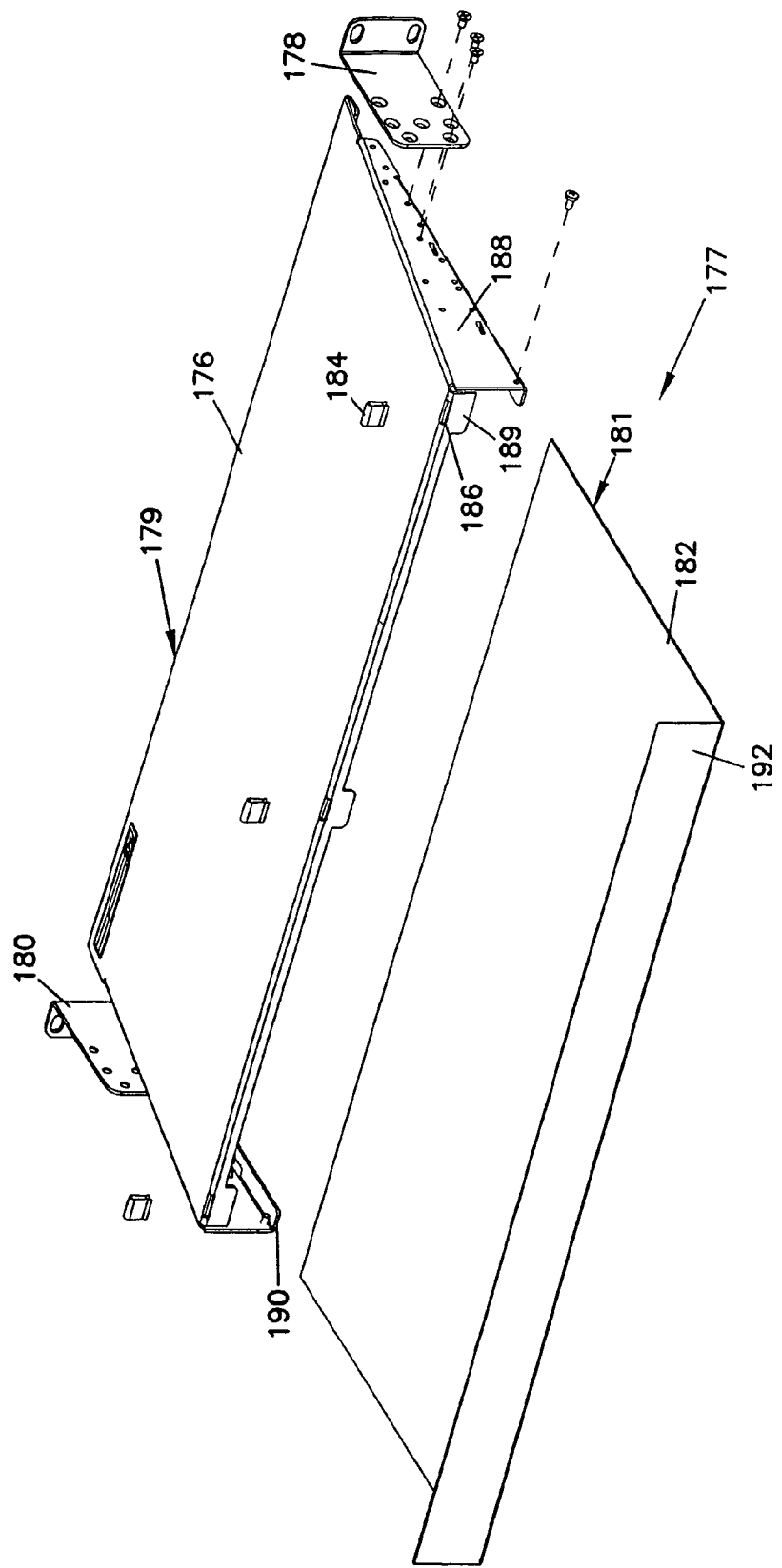

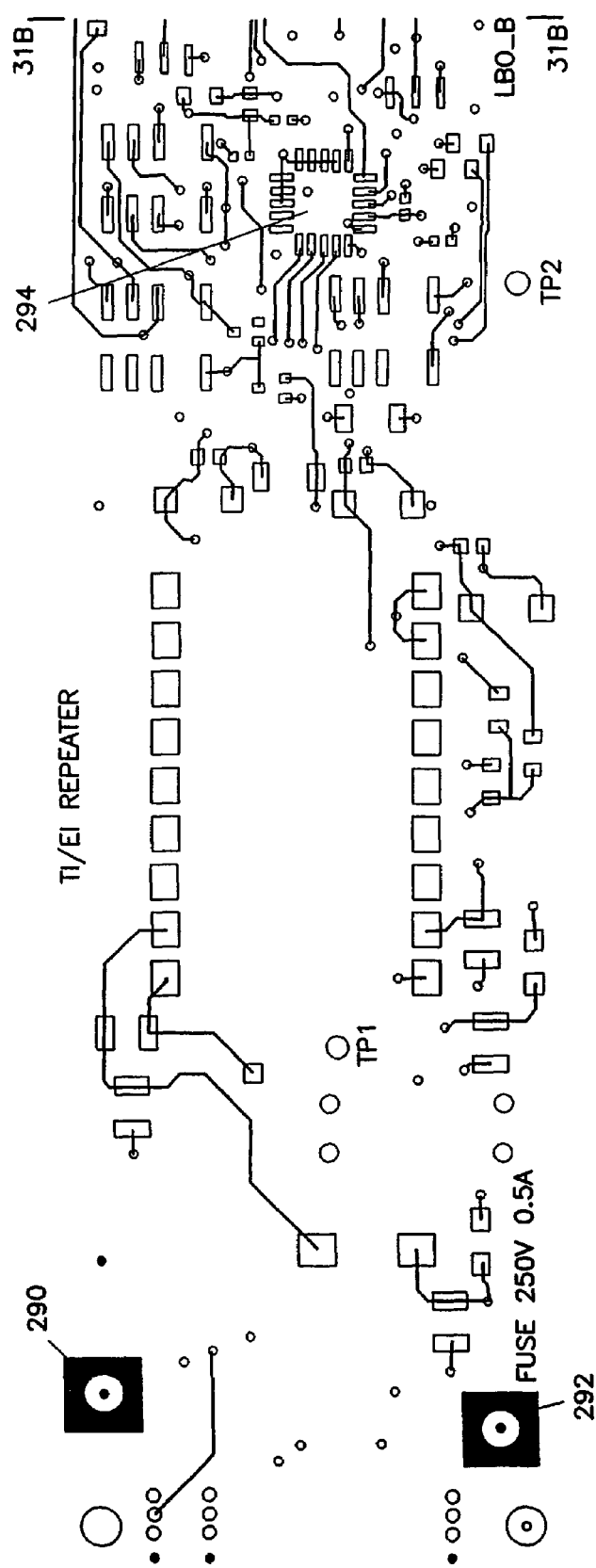

TELECOMMUNICATIONS CHASSIS AND CARD

RELATED APPLICATIONS

This application is a continuation of the application with Ser. No. 10/636,365 filed on Aug. 7, 2003 now U.S. Pat. No. 6,940,730, which is a continuation of application Ser. No. 09/860,653 filed on May 18, 2001 now U.S. Pat. No. 6,707,686, which is a continuation-in-part of the application with Ser. No. 09/825,163 filed on Apr. 3, 2001 now U.S. Pat. No. 6,590,782, which is a continuation-in-part of the application with Ser. No. 09/795,656 filed on Feb. 28, 2001 now U.S. Pat. No. 6,637,845, the entireties of which are hereby incorporated by reference.

TECHNICAL FIELD

This invention relates to chassis for holding telecommunications cards such as repeater circuits. More specifically, the present invention relates to chassis and cards with structures for flame spread containment and/or high card density.

BACKGROUND

It is desirable for a chassis for holding telecommunication circuit cards to support a high density of cards, yet the chassis must effectively dissipate heat developed during operation while containing the spread of flames should a fire be imposed within the chassis. The cards installed in the chassis perform electrical operations, such as signal transception and amplification that generate a significant amount of heat. Typically, a chassis is installed in a rack that contains several other chassis stacked above and below. The heat and flames that may develop within a chassis in the rack have the potential to harm circuit cards housed in the chassis above and below the chassis where the heat and/or flames emanate from, and the flames should be contained to avoid damaging cards in the other chassis.

The chassis must also provide external protection for the circuit cards it houses. Thus, the chassis cannot freely expose the circuit cards to areas outside the chassis when attempting to dissipate heat and flames. Additionally, the chassis must provide a structural interconnection that maintains electrical continuity between the circuit cards and external transmission mediums such as copper wires or fiber optic cables while facilitating insertion and removal of the cards. A sufficient structure must be used to facilitate this circuit card modularity, which further limits the chassis' ability to provide outlets for heat and flames.

Additionally, to reduce the chassis size for a given number of circuits, the circuit card density must be increased. Increasing circuit card density is difficult not only due to heat dissipation and potential flame spread, but also because of electromagnetic noise that must be contained. Generally, increasing circuit card density involves employing smaller cards, and smaller cards require higher component density within the cards. Achieving effective heat dissipation with adequate flame spread and electromagnetic noise containment may even be more difficult for smaller card designs with higher component densities.

Thus several factors must be accounted for in the chassis and card design. Chassis designs with large interior spaces for directing heat and flames away from circuit cards may be undesirable because the chassis may become too large when accommodating a high density of circuits. Chassis designs with open exteriors for directing heat and flames away from the circuit cards may be undesirable because the circuit cards may not be sufficiently protected from externalities such as falling objects or heat and flames spreading from a chassis positioned above or below in the rack. Card designs that are relatively large require a larger chassis to house the same quantity of cards.

Thus, there is a need for a chassis and card design whereby the chassis may contain a high density of readily removable circuit cards while providing effective heat dissipation and flame and electromagnetic noise containment.

SUMMARY

The present invention provides a chassis and card design that may accommodate a high density of readily removable circuits while providing heat dissipation and flame and electromagnetic noise containment features. Ventilation and containment structures are employed to direct heat away from internal circuitry while preventing flames from spreading within the chassis. Additionally, chassis designs of the present invention may provide exterior features that establish protection from externalities and prevent the harmful spread of heat and flames to chassis or other equipment stacked above or below. Card designs of the present invention may provide conductor structures for containing electromagnetic noise and/or individual components placed in locations for coordination with the ventilation structures of the chassis.

The present invention may be viewed as a chassis for housing repeater cards. The chassis includes an inner housing with vertical sidewalls, a first surface, and a second surface. The first surface and the second surface have a first and second row of openings. The chassis also includes one or more repeater cards positioned between the first surface and the second surface. The one or more repeater cards has a DC-DC converter, a transceiver, and a first amplifier with the DC-DC converter being positioned between a first opening of the first row of the first surface and a first opening of the second row of the second surface at least partially aligned with the first opening of the first row of the first surface. The transceiver is positioned between a first opening of the second row of the first surface and a first opening of the second row of the second surface at least partially aligned with the first opening of the second row of the first surface.

The present invention may also be viewed as a repeater card. The repeater card includes a printed circuit board having a ground layer and a power layer separated by a dielectric with the ground layer having a chassis ground plane, a logic ground plane, and a first channel ground plane, and with the power layer having a logic power plane and a first channel power plane. The logic ground plane substantially overlaps with the logic power plane and the first channel ground plane substantially overlaps with the first channel power plane. A DC-DC converter is mounted to the printed circuit board and electrically linked to the logic ground plane, the logic power plane, the first channel ground plane, the first channel power plane, and the chassis ground plane. A transceiver is mounted to the printed circuit board and is electrically linked to the DC-DC converter through the logic ground plane, the logic power plane, the first channel ground plane, and the first channel power plane. A first amplifier is mounted to the printed circuit board and is electrically linked to the transceiver with the first amplifier also being electrically linked to the DC-DC converter through the first channel ground plane and the first channel power plane.

The present invention may be viewed as another chassis for housing telecommunications cards. The chassis includes first and second horizontal surfaces separated by first and second vertical sidewalls, with the first horizontal surface having a first ridge substantially perpendicular to the first and second vertical sidewalls. The first horizontal surface also has a plurality of grooves extending across at least a portion of the first horizontal surface, each groove of the plurality being substantially perpendicular to the first ridge.

DESCRIPTION OF THE DRAWINGS

FIG. 4C is a right side view of the loaded chassis.

FIG. 7 is a side view of the empty chassis with the outer sidewall removed.

FIG. 19A is a top view of a repeater circuit card.

FIG. 19B is a left side view of the repeater circuit card.

FIG. 19C is a front view of the repeater circuit card.

FIG. 21 is an exploded top rear perspective view of a heat baffle.

DETAILED DESCRIPTION

Figure 1A:
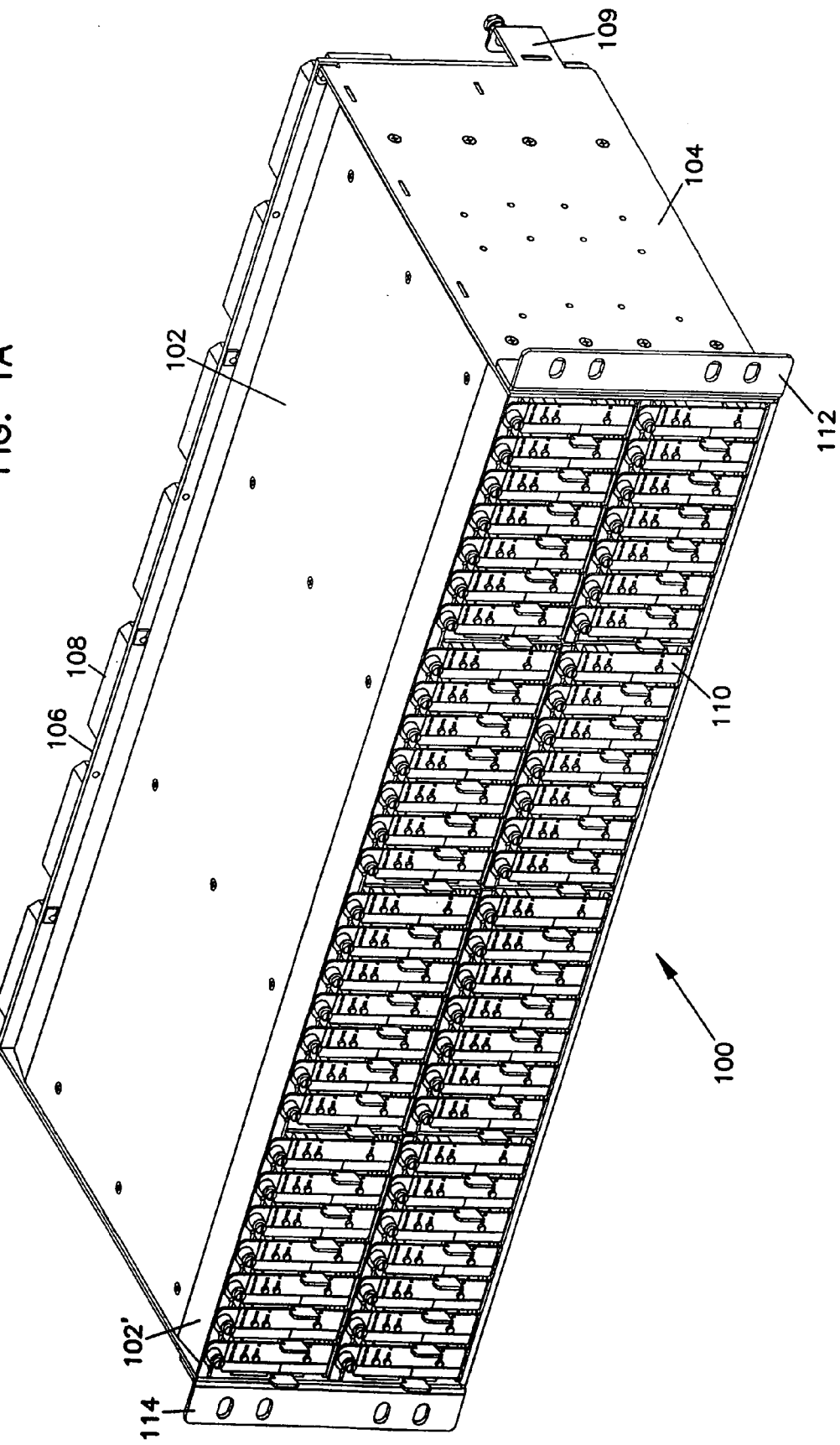
FIG. 1A is a top front perspective view of a chassis loaded with repeater cards.

Various embodiments of the present invention will be described in detail with reference to the drawings, wherein like reference numerals represent like parts and assemblies through the several views. Reference to various embodiments does not limit the scope of the invention, which is limited only by the scope of the claims attached hereto.

Figure 1B:
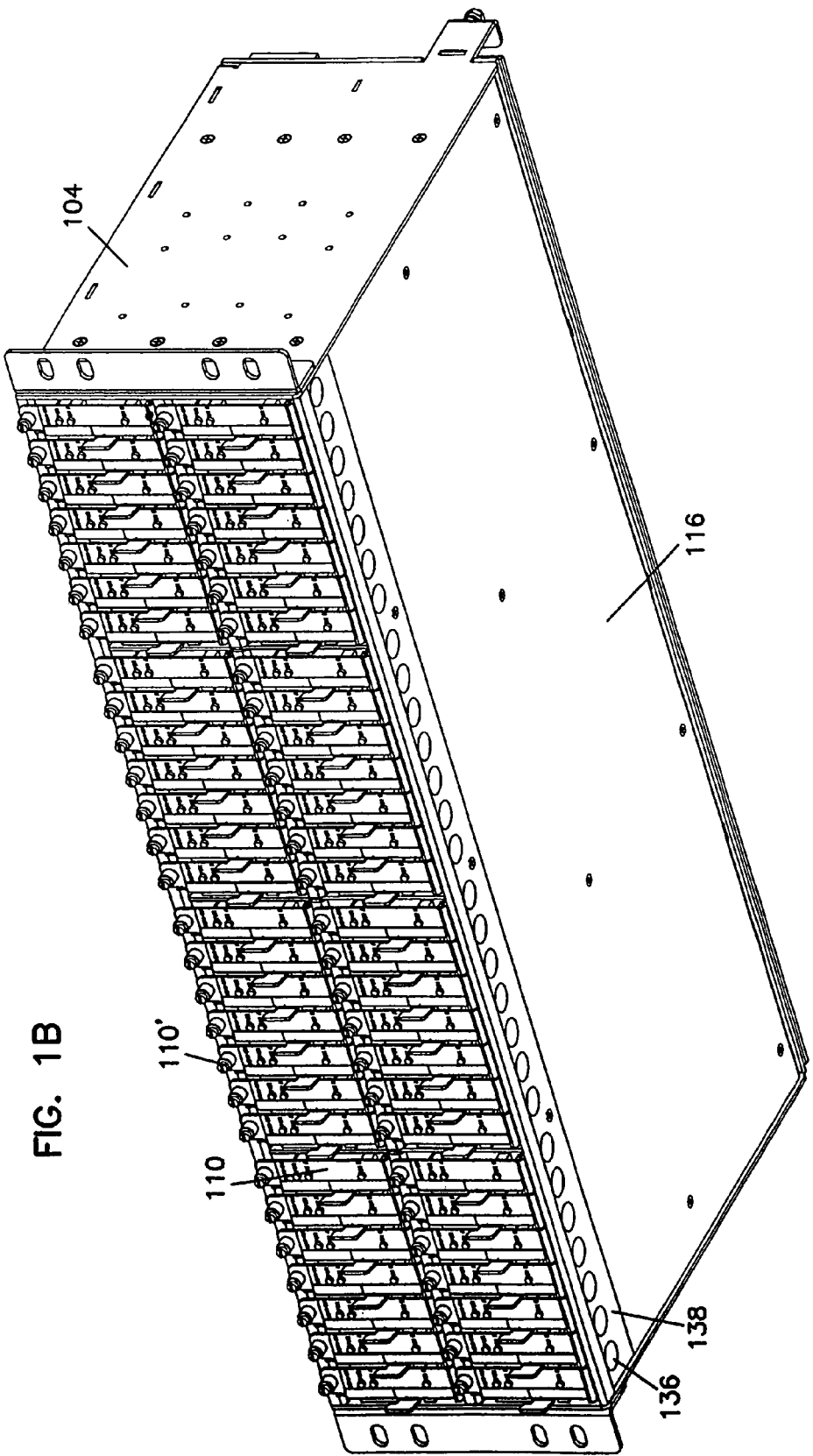
FIG. 1B is a bottom front perspective view of the chassis loaded with repeater cards.

FIGS. 1A and 1B show a loaded chassis 100 in accordance with one embodiment of the present invention. The chassis includes vertical sidewalls including right sidewall 104. A top mesh cover 102 is included, and this cover, as well as other mesh covers discussed below, typically are perforated cold rolled steel wherein the perforations provide air passages. An exemplary mesh cover is made of aluminum and has 63% of its surface occupied by relatively small and densely positioned air passages, but other materials and air passage percentages for the mesh covers are also applicable. Cover 102 may have angular portions 102'. As with all surfaces of the chassis 100, the cold rolled steel may be used and may have a clear chromate plating to reduce electromagnetic interference. The chassis 100 also has a bottom mesh cover 116 that covers the bottom of the chassis 100.

A backplane 106 having external connectors 108 is included for establishing electrical communication between the circuit cards 110 housed by the chassis 100 and external cabling passing through the chassis rack. The external connectors 108 may be a terminal block, but other connector types are suitable as well. The cards typically have a mounting screw 110' that secures the card to the chassis 100. The chassis 100 includes mounting flanges 112 and 114 for installation of the chassis 100 in a rack. A ground connector 109 is included for providing chassis ground.

Figure 2:
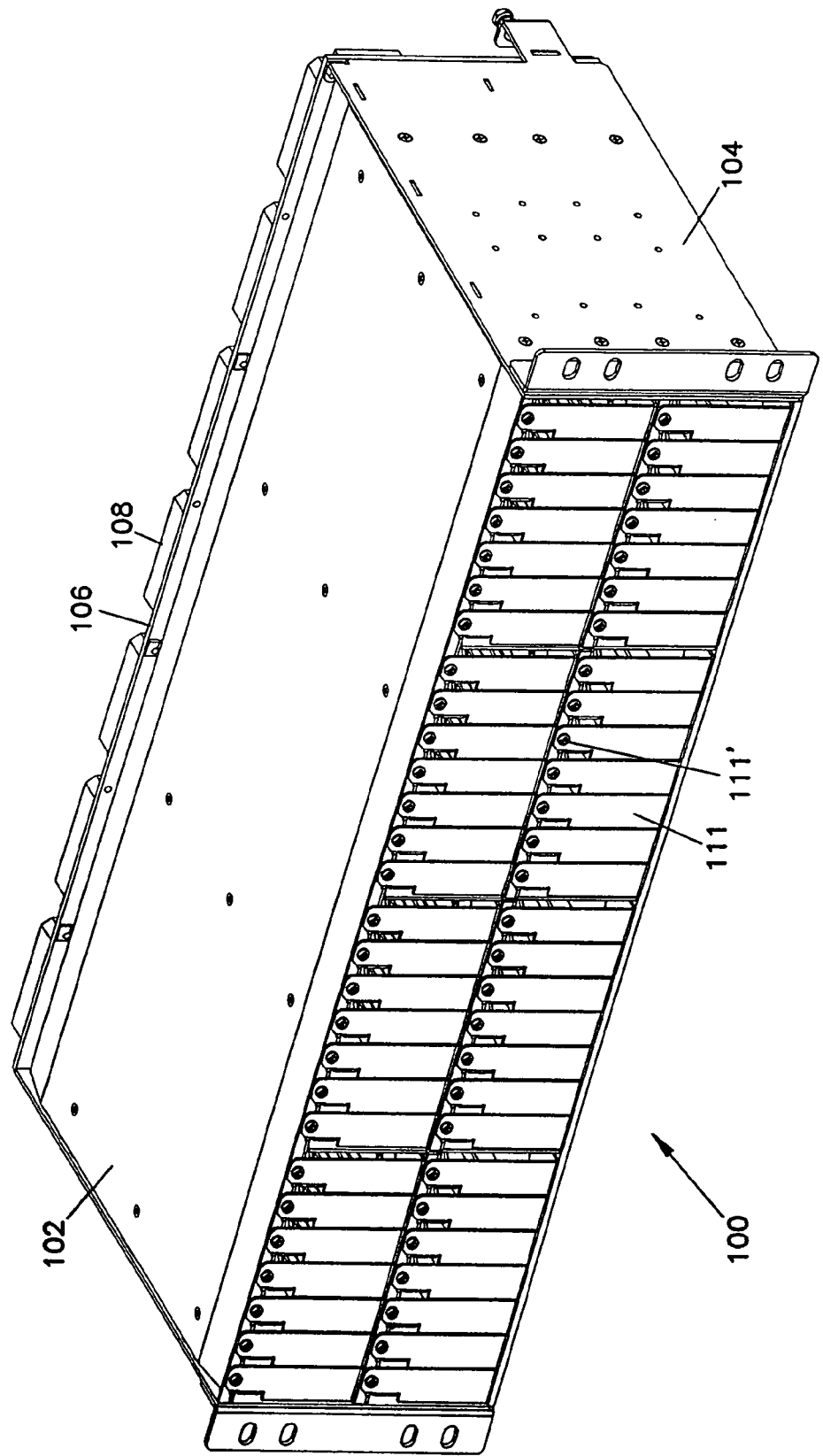
FIG. 2 is a top front perspective view of an empty chassis with card slot covers in place.
Figure 3A:
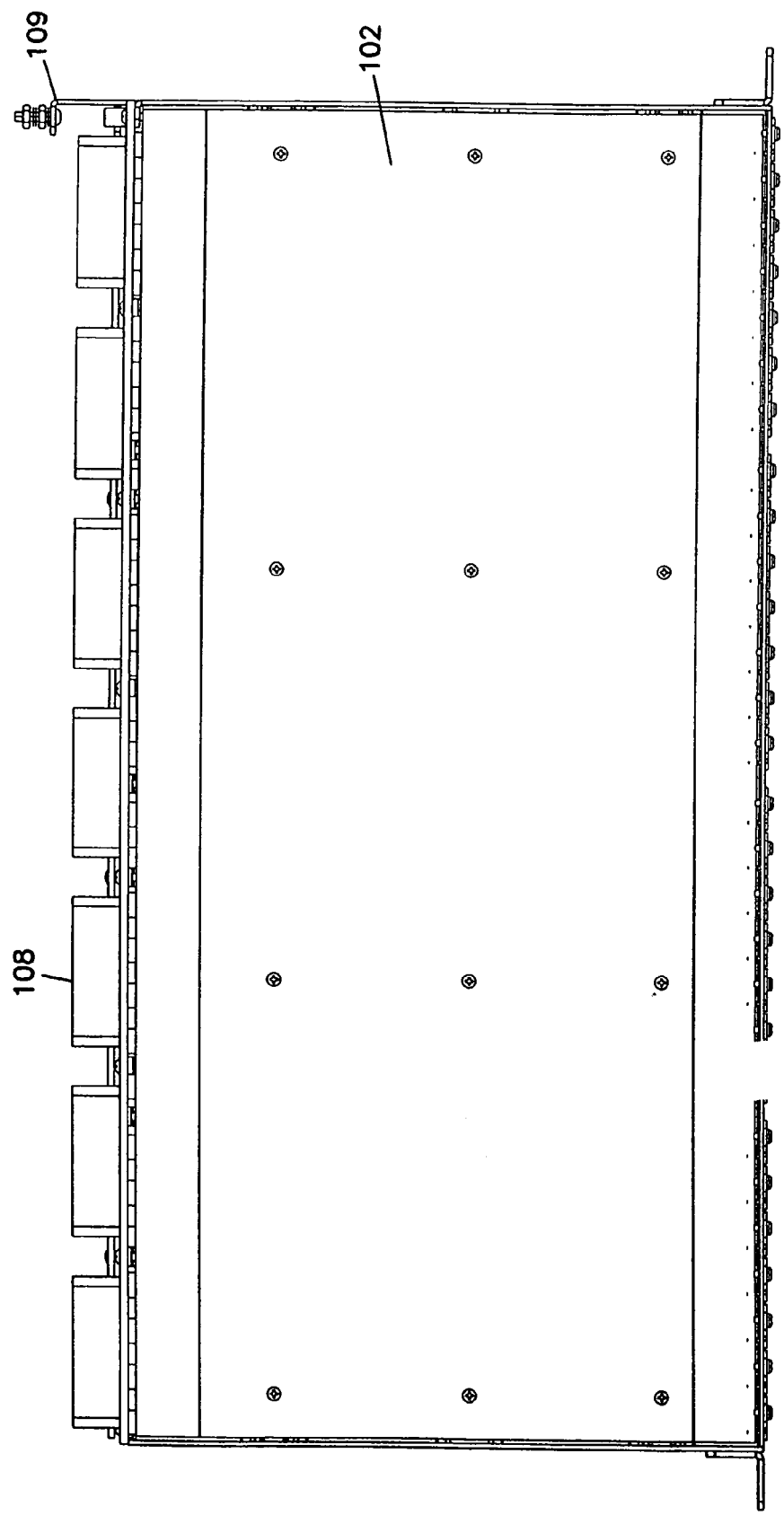
FIG. 3A is a top view of the empty chassis.
Figure 3B:
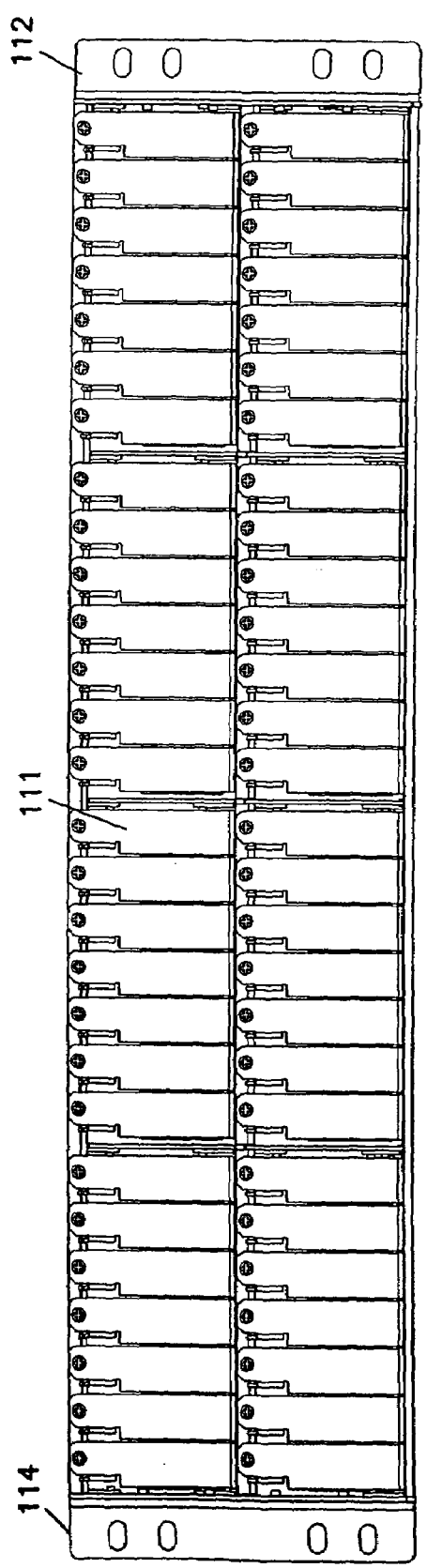
FIG. 3B is a front view of the empty chassis.
Figure 3C:
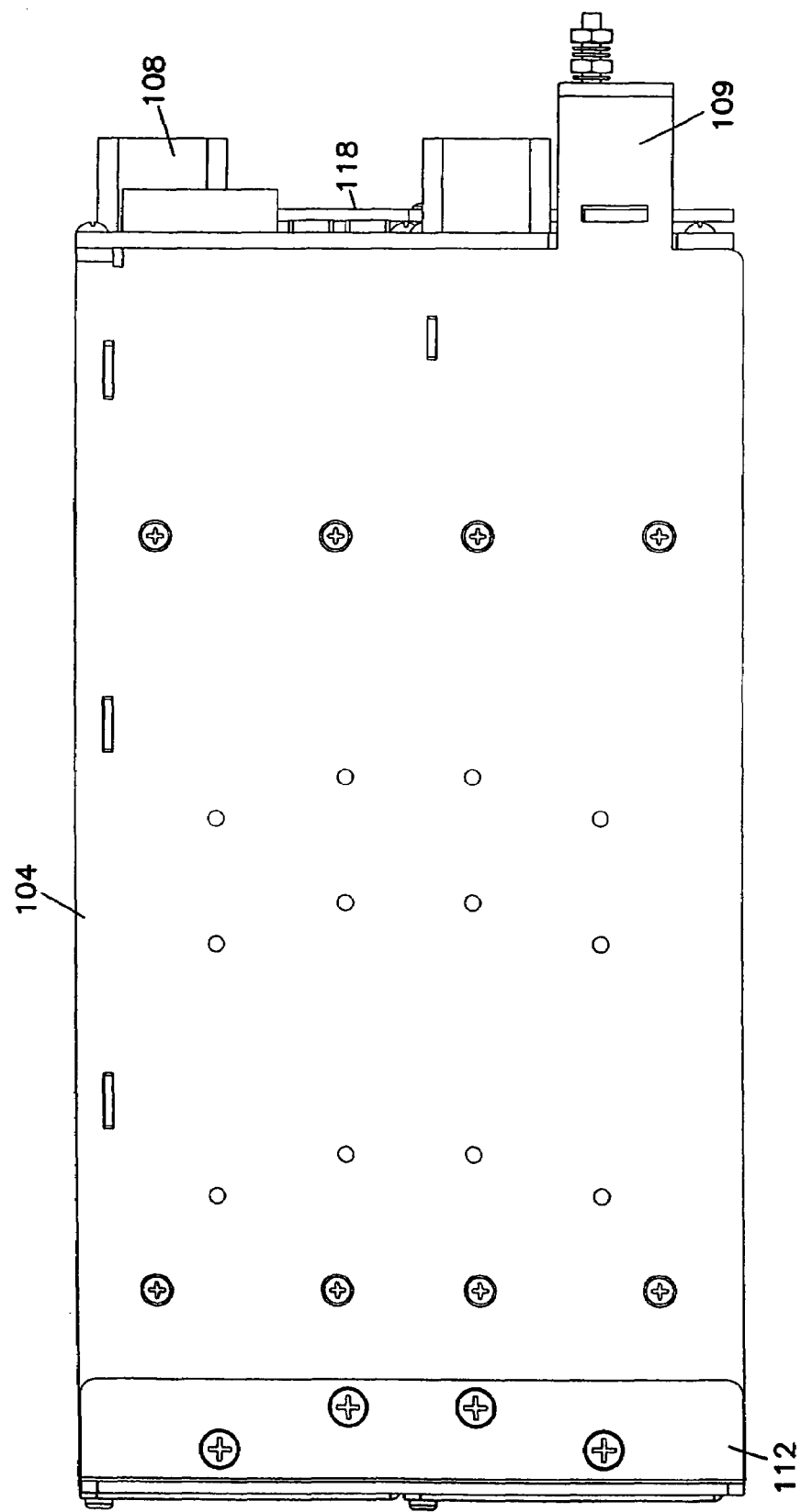
FIG. 3C is a right side view of the empty chassis.
Figure 5A:
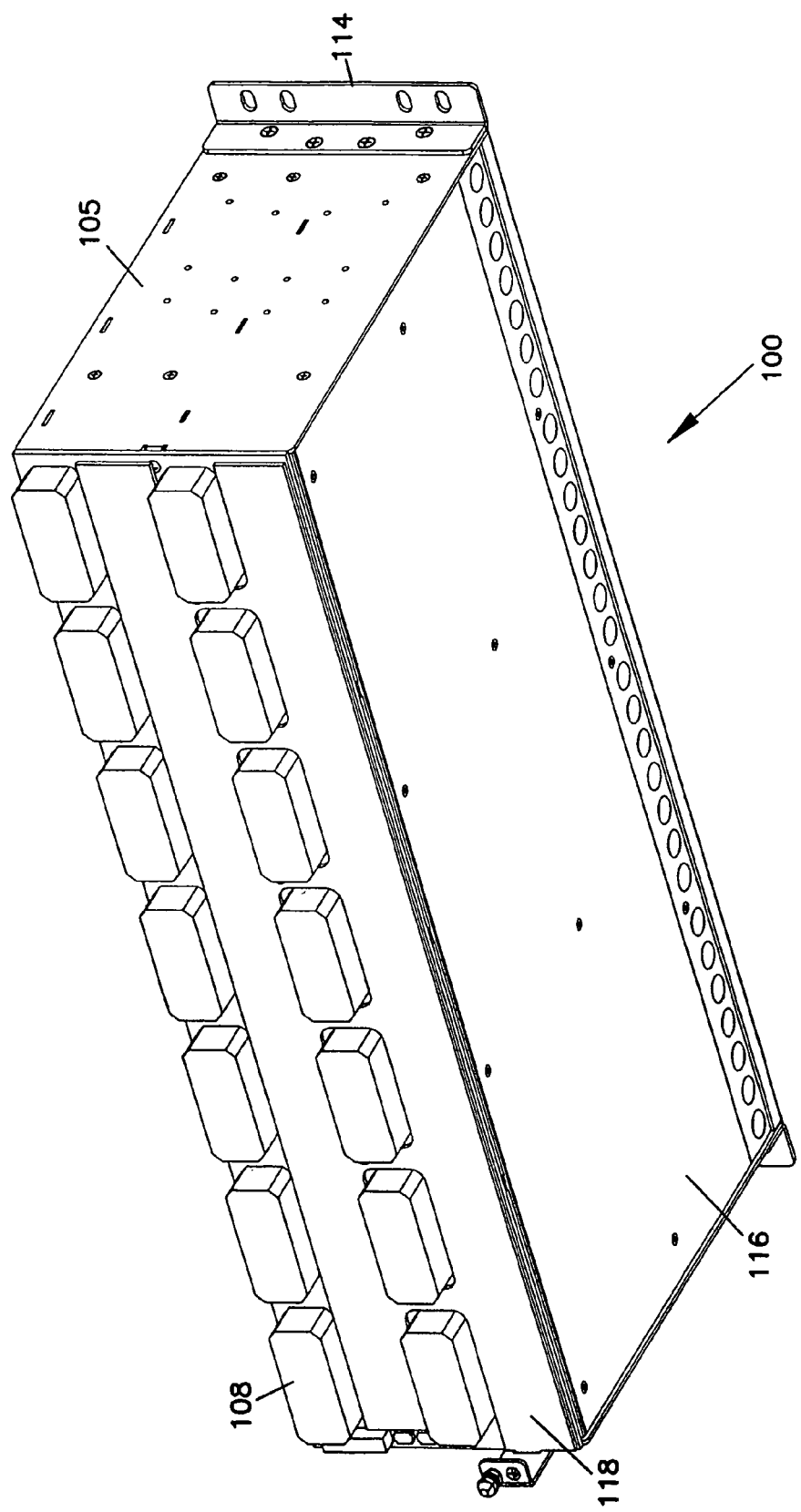
FIG. 5A is a bottom rear perspective view of the loaded chassis.
Figure 5B:
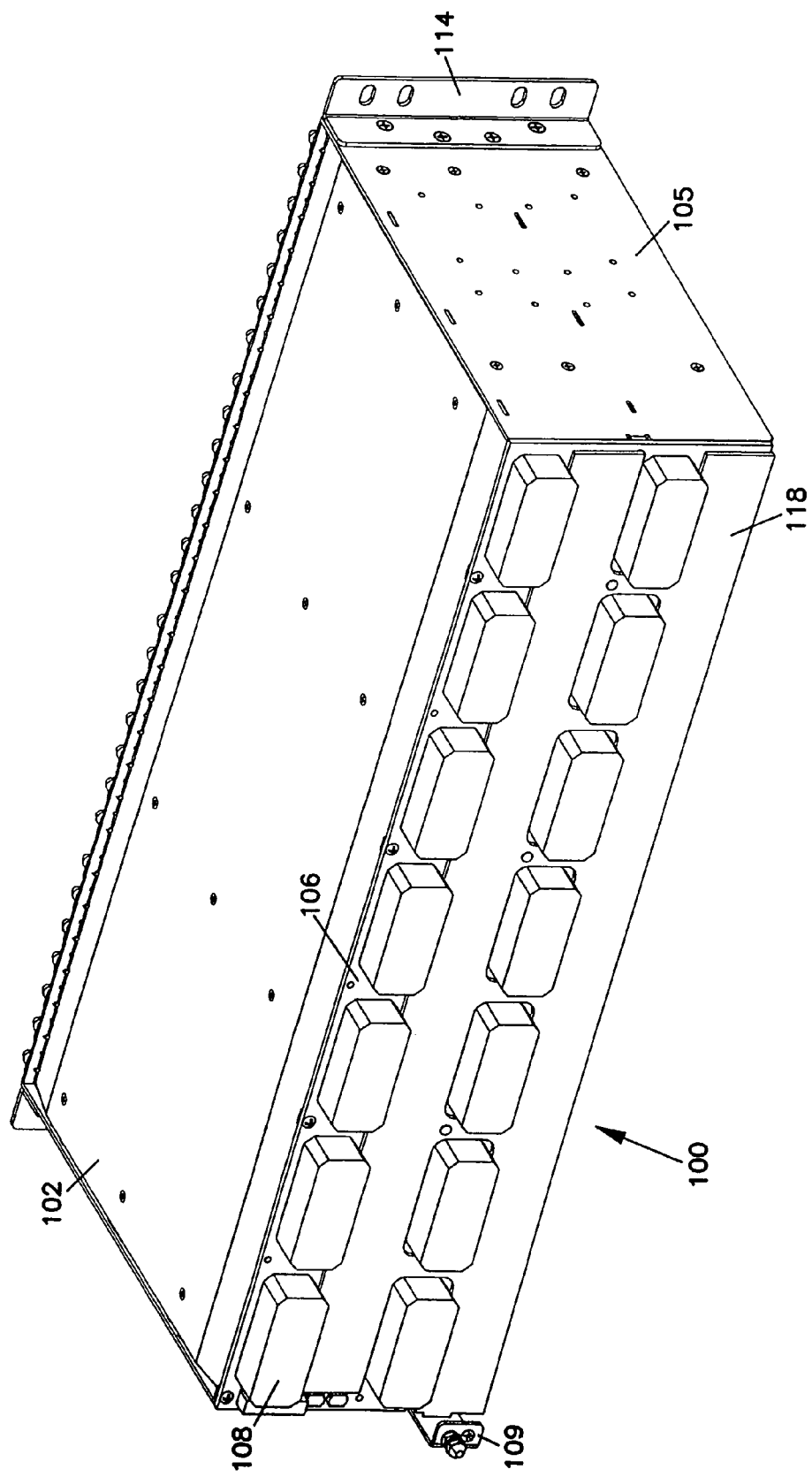
FIG. 5B is a top rear perspective view of the loaded chassis.
Figure 6A:
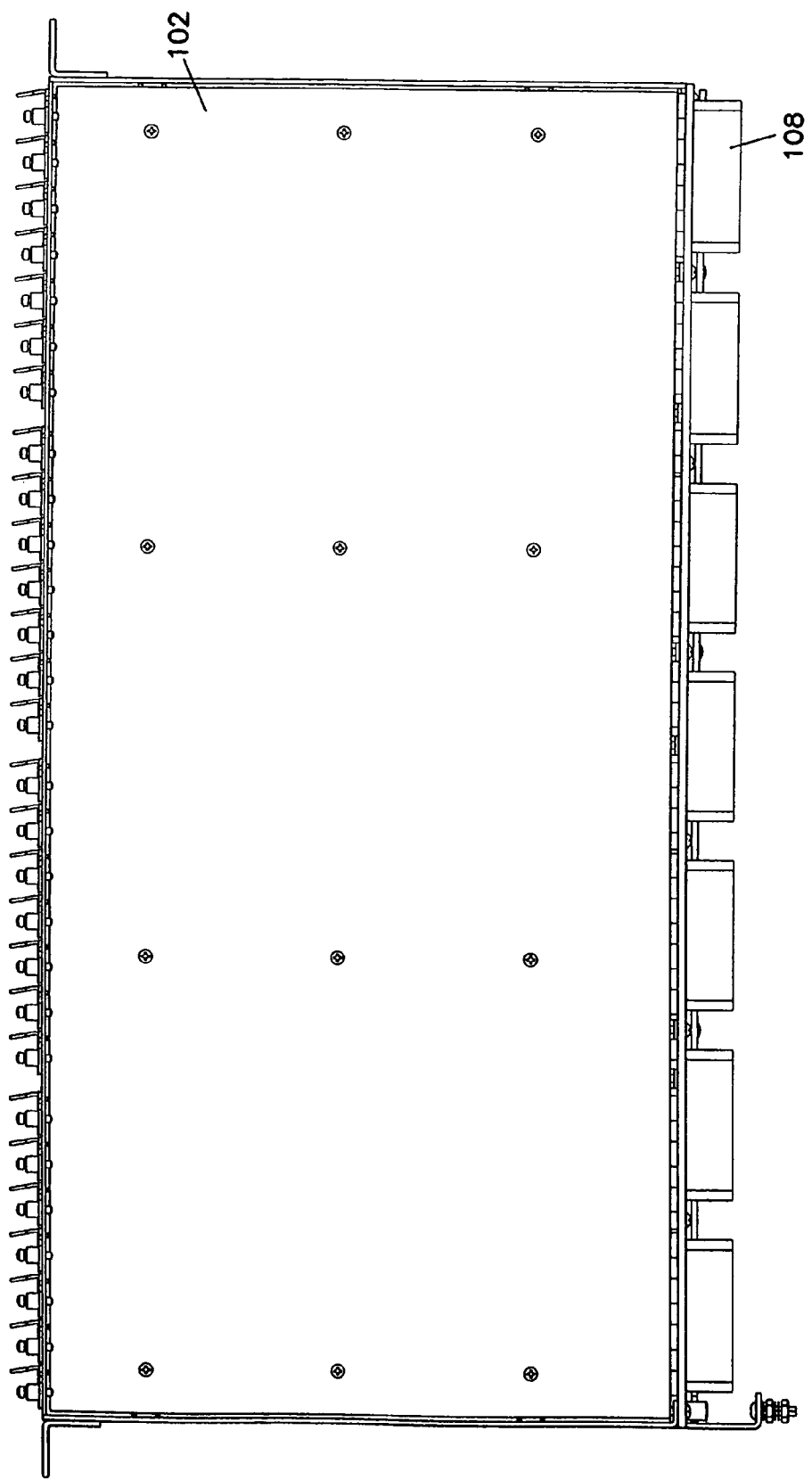
FIG. 6A is another top view of the loaded chassis.
Figure 6B:
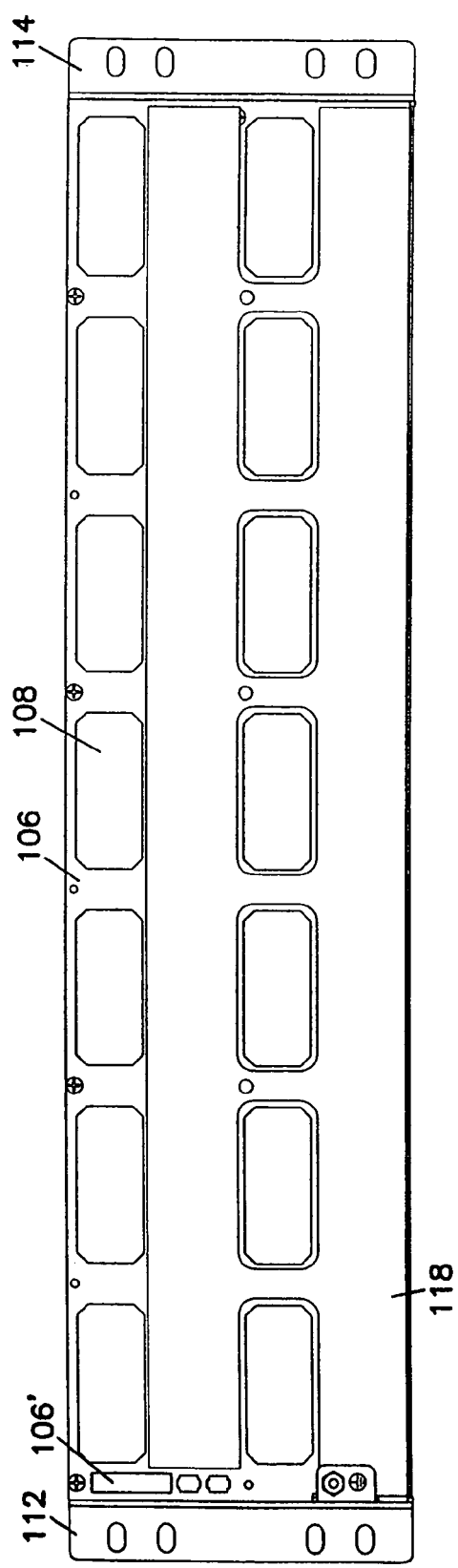
FIG. 6B is a rear view of the loaded chassis.
Figure 6C:
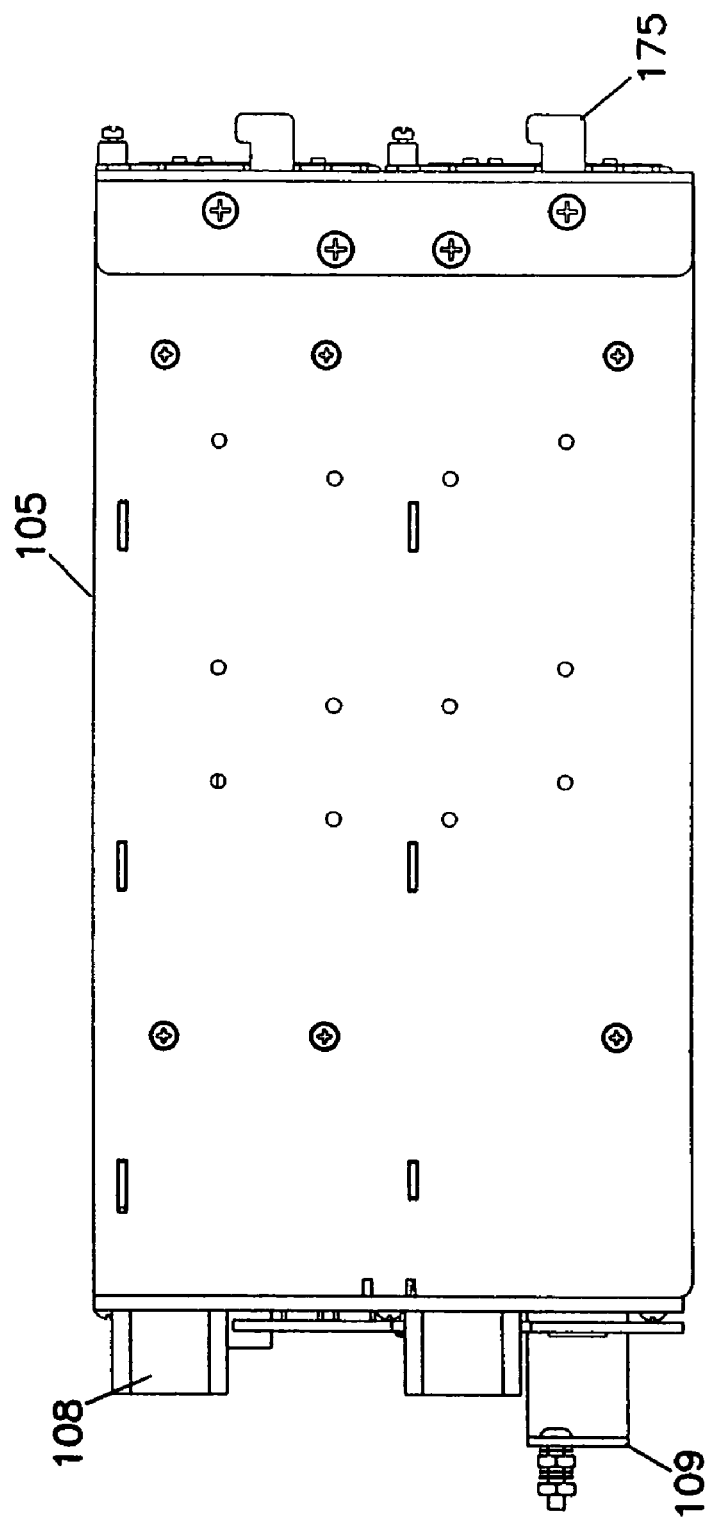
FIG. 6C is a left side view of the loaded chassis.

FIGS. 2-3C show an empty chassis 100. The empty chassis 100 has card slot covers 111 that cover each card slot reserved for a circuit card 110. The card slot covers are held in place by a screw 111' that is secured to the chassis 100. FIGS. 3A and 3C also show a backplane cover 118 that is more clearly shown in FIGS. 5A and 5B. The backplane cover 118, typically made of lexan, prevents exposure of circuit leads and pins on the backside of the backplane 106.

Figure 4A:
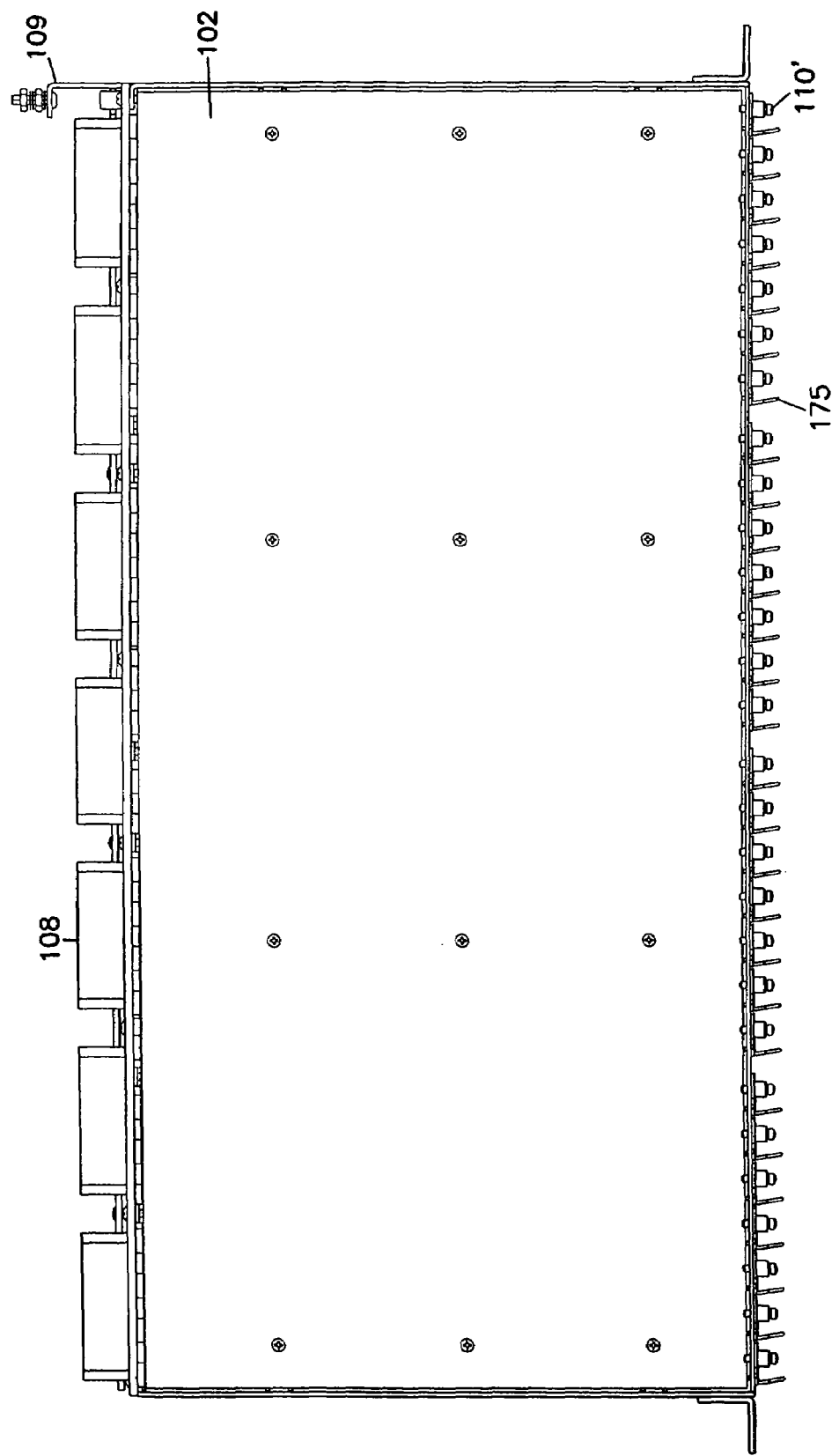
FIG. 4A is a top view of the loaded chassis.
Figure 4B:
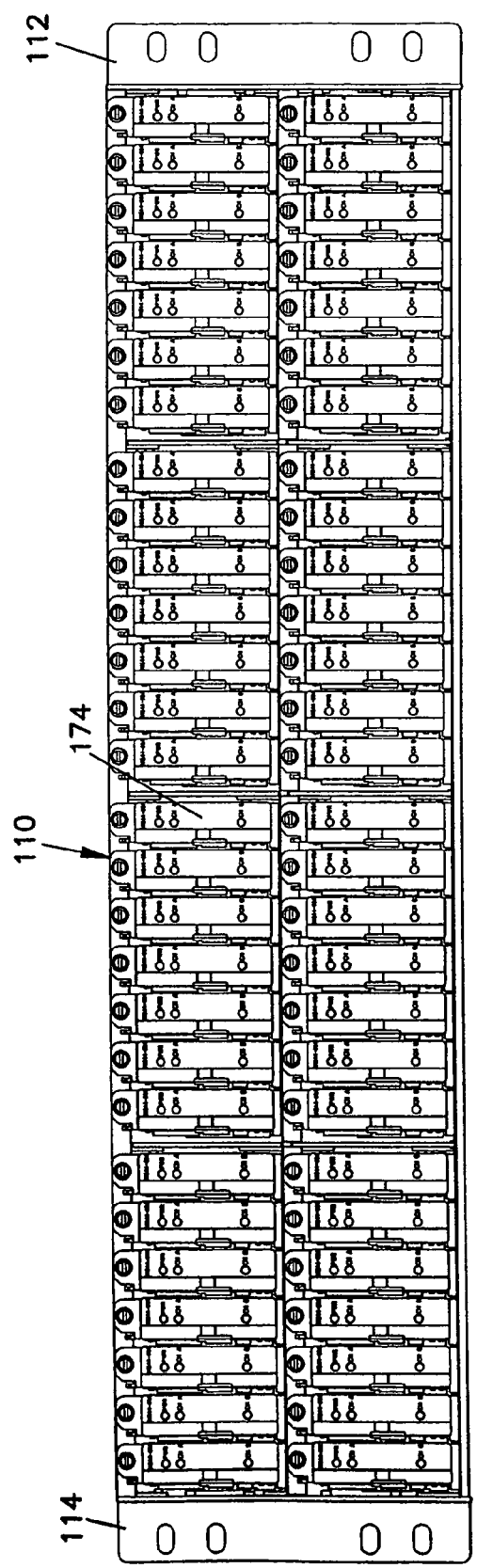
FIG. 4B is a front view of the loaded chassis.

FIGS. 4A-C show a loaded chassis 100. The loaded chassis 100 is filled with circuit cards 110 held in place by the fastener 110'. The circuit cards 110 have a finger 175 extending from a faceplate 174. The finger 175 provides a handle for an operator to grip when inserting or removing the circuit cards 110 from the chassis 100. The finger 175 and circuit card 110 are shown and described in more detail below.

FIGS. 5A-6C illustrate the chassis 100 with the focus shifted to the rear portion where the backplane 106, external connectors 108, and backplane cover 118 are located. The vertical sidewall 105 is also visible in these views. Also visible in these views is a backplane power connection 106' that generally mates to a power connection in a rack to provide power to circuit cards 110 through internal connectors discussed below and receive alarm signals generated by the circuit cards 110.

FIG. 7 shows a side view of the chassis 100 with the sidewall 104 removed. As can be seen, the chassis 100 consists of several layers including the top mesh cover 102, an air gap 103, a second mesh cover layer 120 and 122, a top surface 132, a middle floor 134, and the bottom surface 138. The second mesh cover layer 120 and 122 overlays the top surface 132, and the top mesh cover 102 overlays the second mesh cover layer 120 and 122. The air gap 103 is established by ridges 130 formed in the top surface 132 that create recessed portions 131 in the top surface. Cover projections 123 are provided to maintain spacing between cover layer 102 and the underlying mesh strips 120 and 122. The sidewalls 104, 105, the middle floor 134, and the top surface 130 and bottom surface 138 are held together by fasteners 132', 142', 140', and 138'.

The middle floor includes a top plate 142 and a bottom plate 140 separated by an air gap 143. The top plate 142 overlays the bottom plate 140. Similar to air gap 103, ridges 158 in the bottom plate 140 create recessed portions 141 that establish the air gap 143 in the middle floor 134. The bottom mesh cover 116 directly underlays the bottom surface 138. The relationship of these layers relative to the inner housing 101 is further illustrated in FIG. 8.

Figure 8:
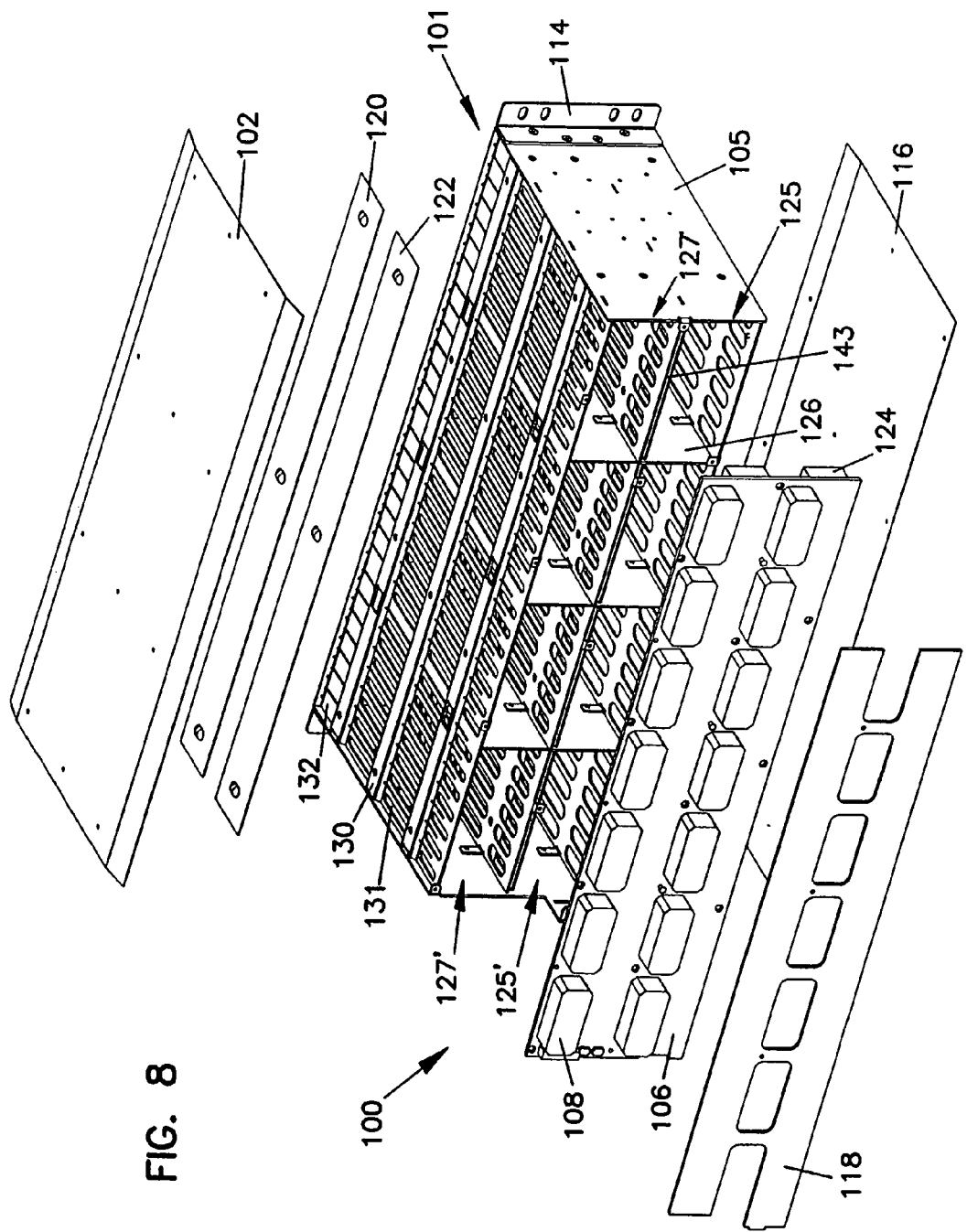
FIG. 8 is an exploded top rear perspective view of the empty chassis.

FIG. 8 shows the exploded view from a top rear perspective of the chassis 100. The underlying mesh cover layer 120 and 122 is shown as two individual strips of mesh material. These two strips 120 and 122 lie within the recesses 131 formed in the top surface 132 between the ridges 130. Inner sidewalls 126 within inner housing 101 are also visible in FIG. 8. These inner sidewalls 126 create compartments 125 and 127 within a bottom chamber 125' and top chamber 127', respectively, within the inner housing 101. Internal connectors 124 located on the inner side of backplane 106 are also visible and are used to mate with the circuit card 110. The air gap 143 in the middle floor 134 is also shown.

Figure 9:
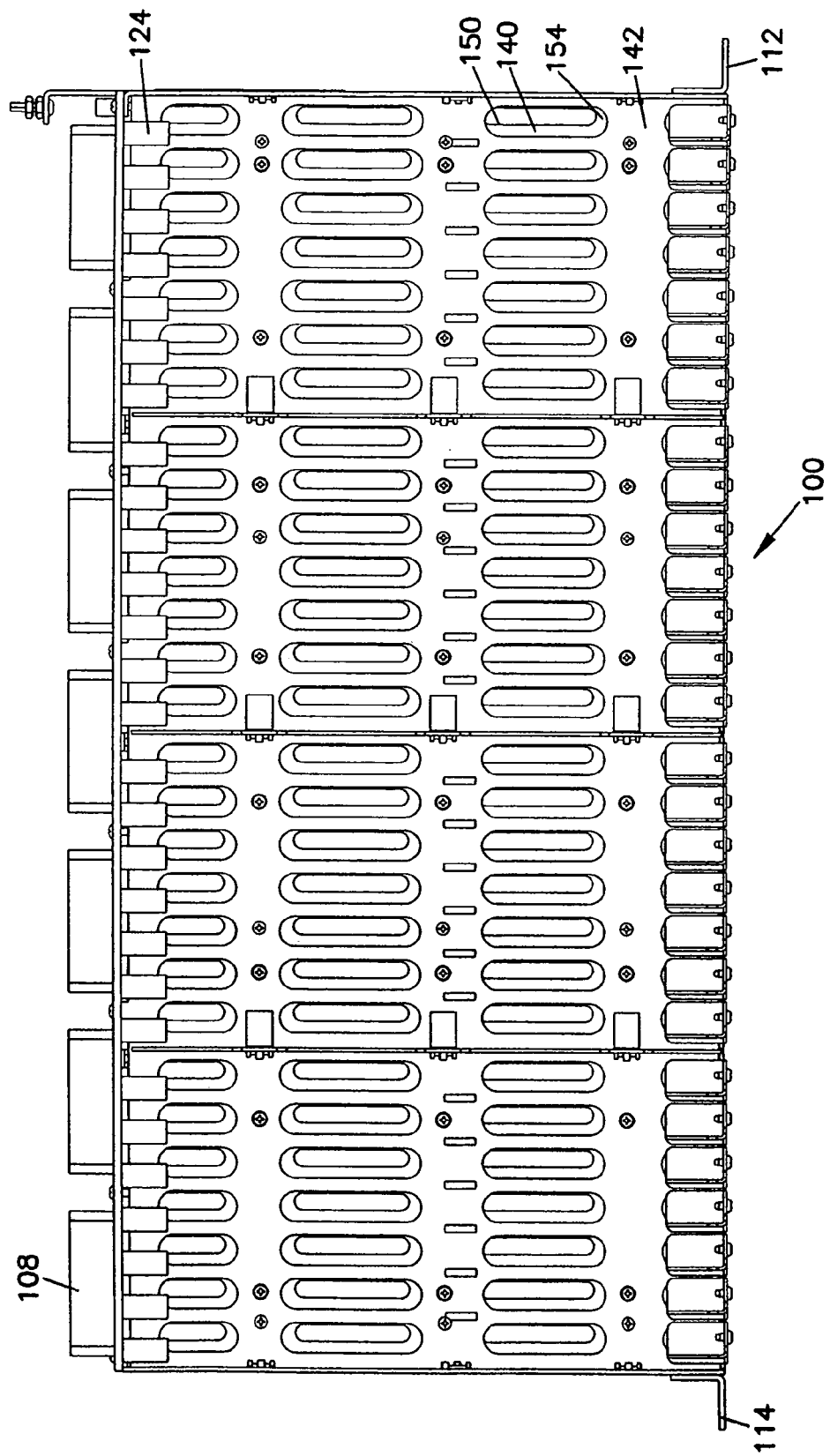
FIG. 9 is a top view of the empty chassis with the top cover layers and top surface of the inner housing removed.

FIG. 9 shows a top view of the chassis 100 with the top cover 102, second cover layer strips 120 and 122, and the top surface 132 of the inner housing 101 removed. The top plate 142 is visible and openings including slots 154 are visible. The bottom plate 140 is partially visible through the slots 154 where the bottom plate's slots 150 are not in perfect alignment due to shape, position, or size with the slots 154 of the top plate 142. As described below, these slots 150 and 154 permit heat from circuit cards 110 in bottom chamber 125' to be dissipated while containing flames emanating from the bottom chamber 125'.

Figure 10:
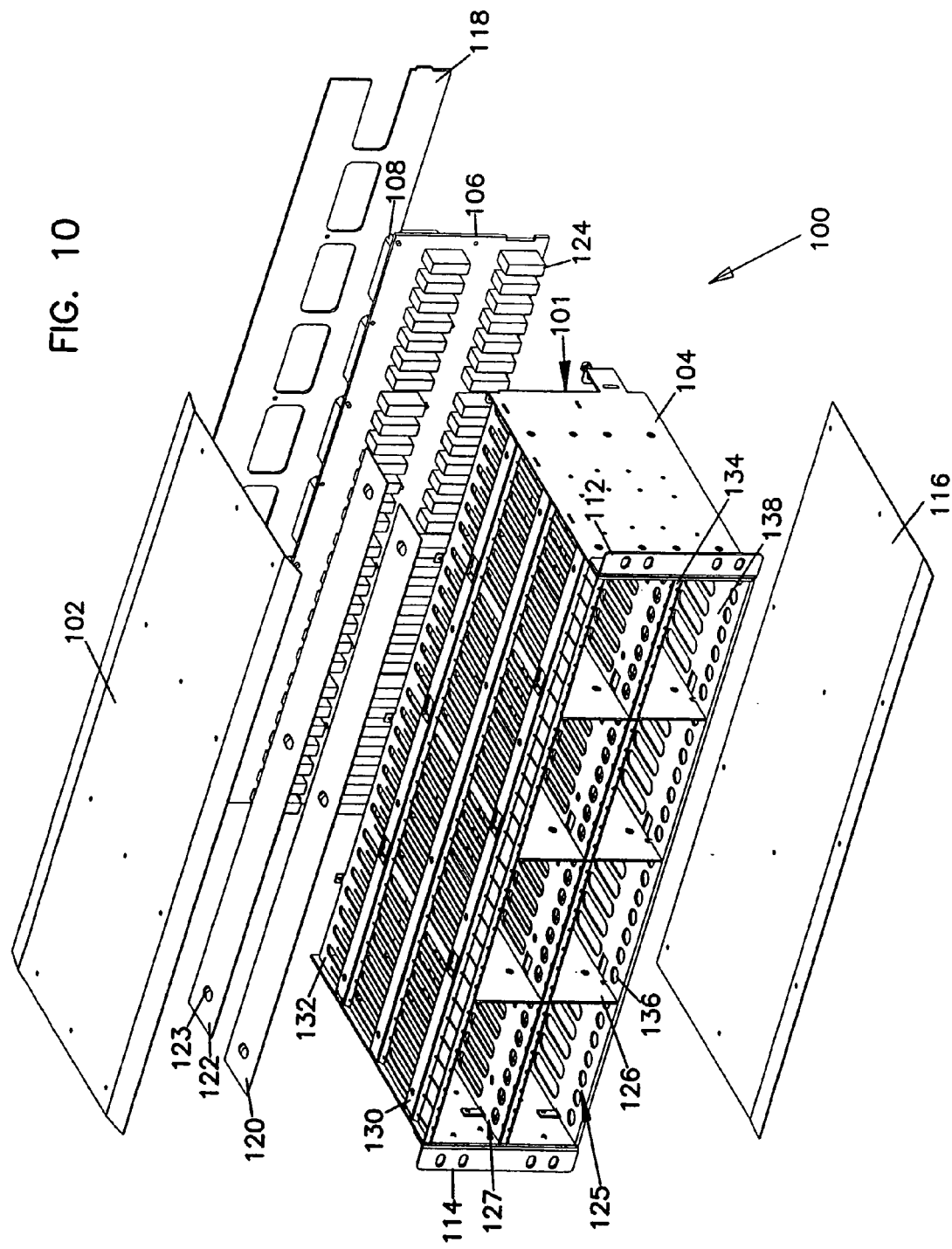
FIG. 10 is an exploded top front perspective view of the empty chassis.

FIG. 10 shows an exploded view of the chassis 100 with the inner housing intact from a top front perspective. The internal connectors 124 are shown. The internal connectors fit within the compartments 125 and 127 and the circuit cards 110 slide into the inner housing 110 from the front. A connector on the circuit card 110 then slides into engagement with the internal connector 124. Generally, one card corresponds to one internal connector 124. As shown, seven cards fit into a single compartment 125 or 127. Also shown in FIG. 10 are cover projections 123 on the mesh cover layer formed by the individual mesh strips 120 and 122. The cover projections 123 assist in maintaining the air gap 103 formed between the top mesh cover 102 and the mesh strips 120, 122.

Figure 11A:
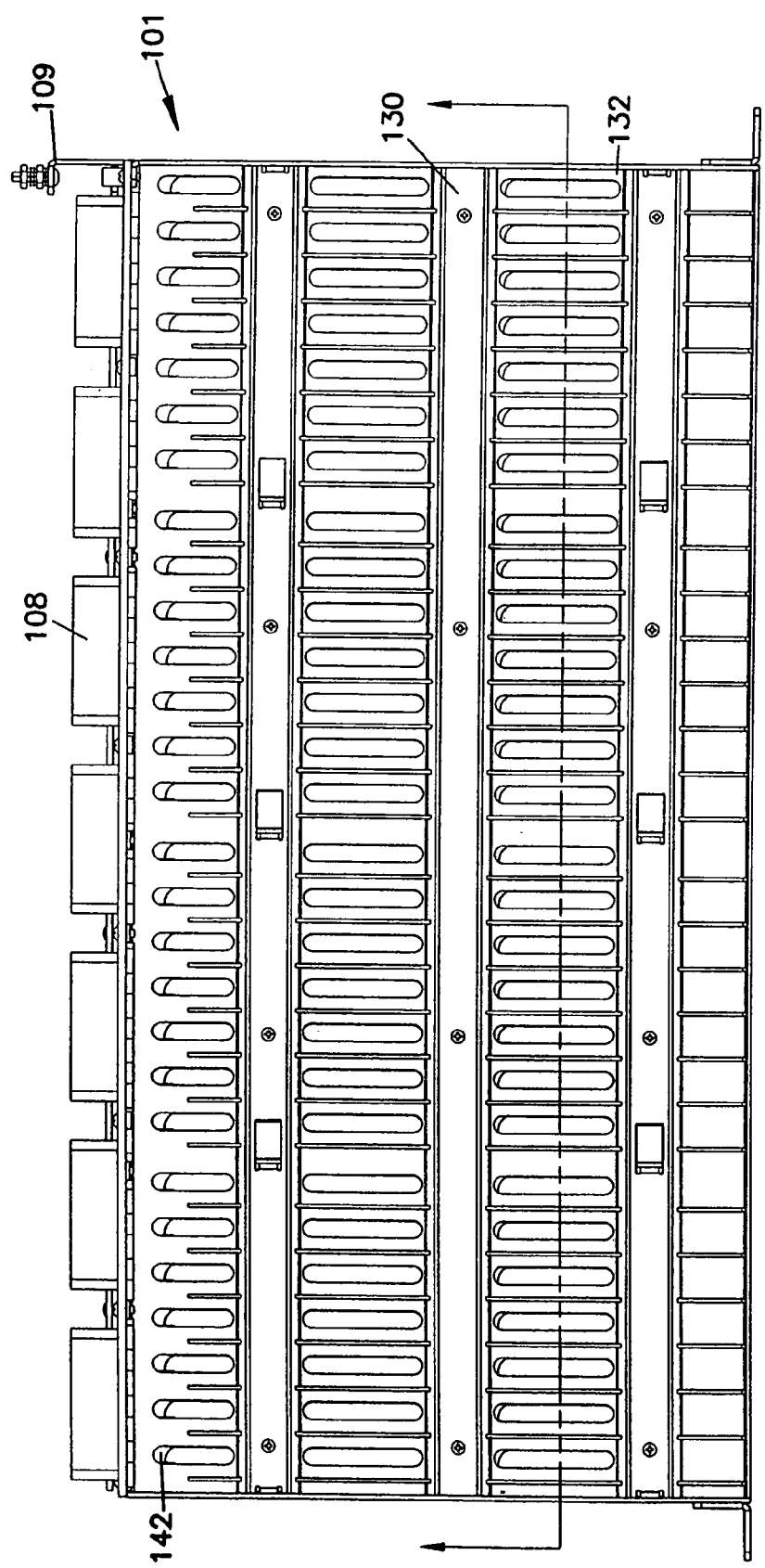
FIG. 11A is a top view of the empty inner housing of the empty chassis.
Figure 11B:
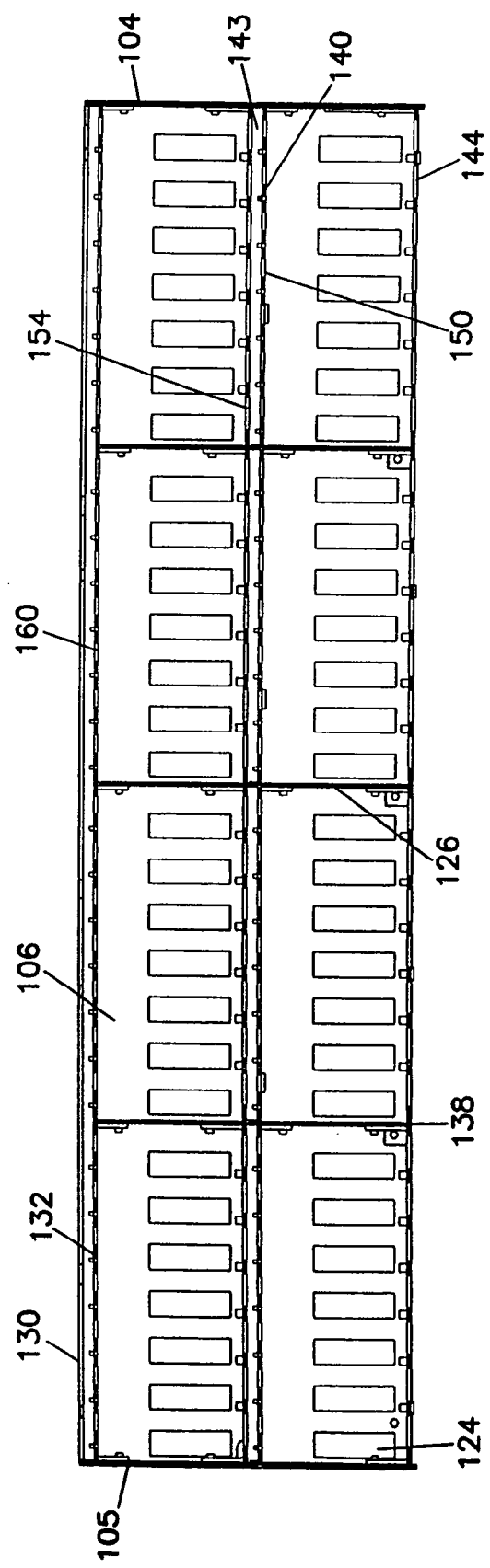
FIG. 11B is a cross-sectional front view of the empty inner housing of the empty chassis along lines A-A of FIG. 11A.
Figure 11C:
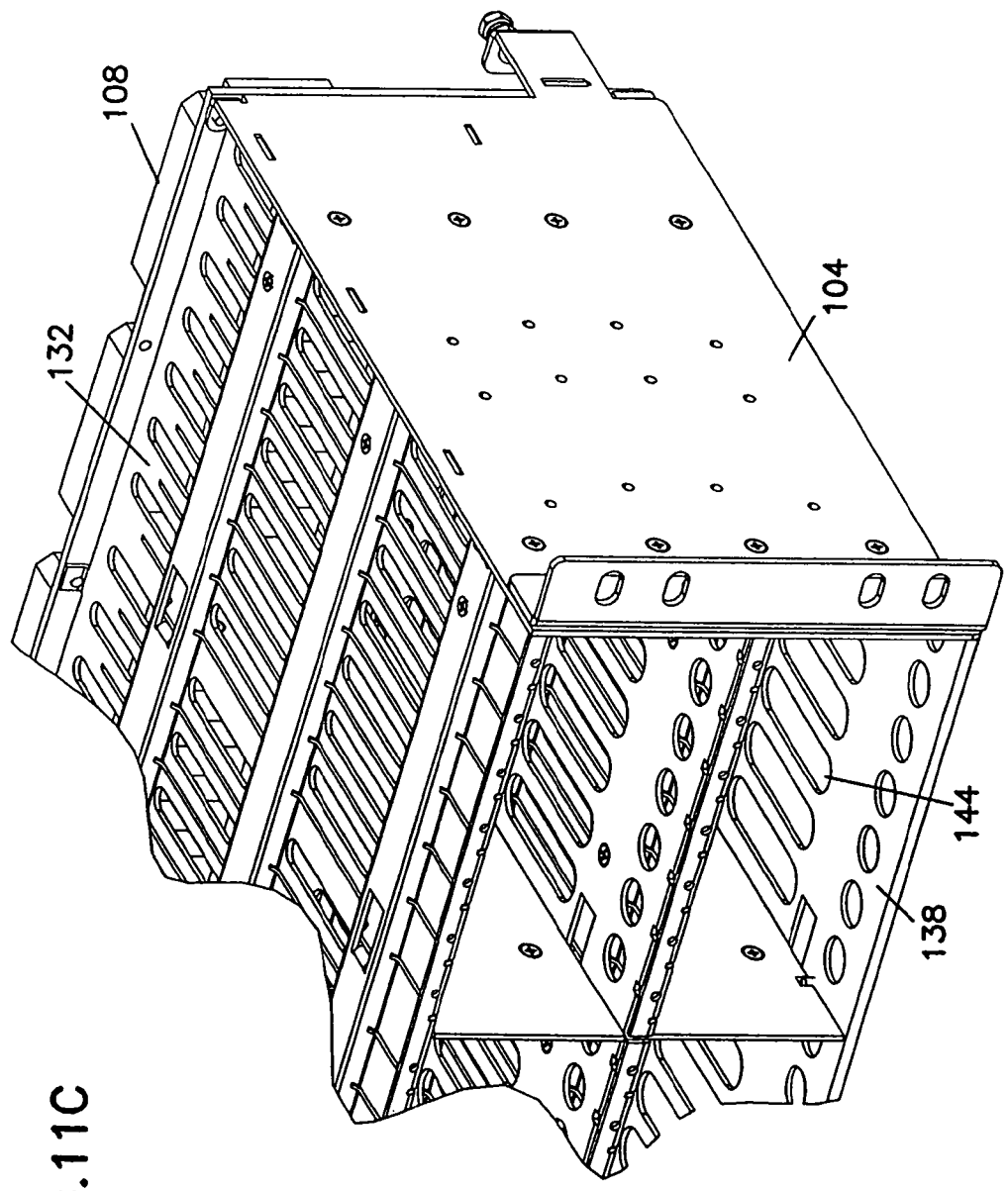
FIG. 11C is a partial top front perspective view of the empty inner housing of the empty chassis.
Figure 12:
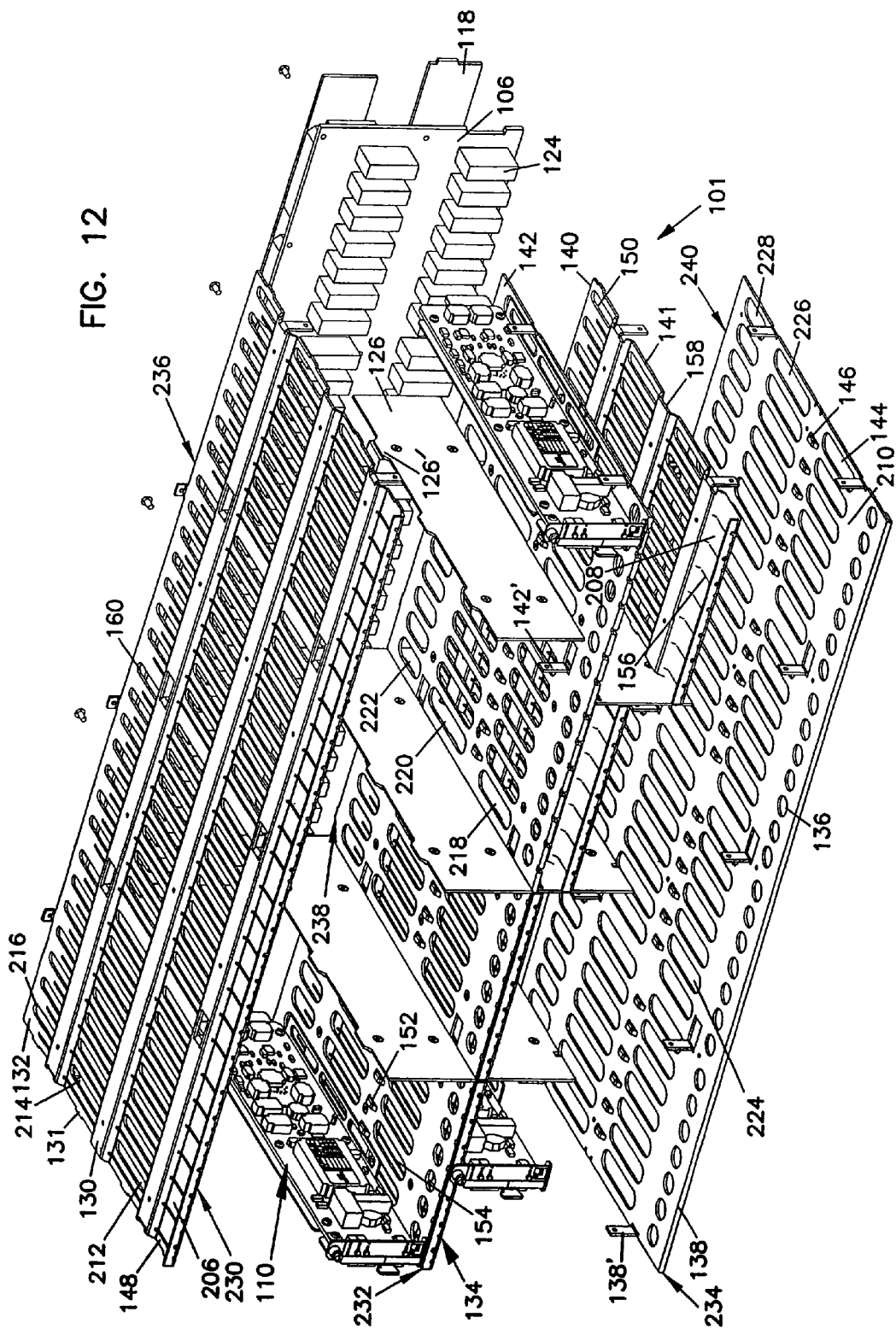
FIG. 12 is a top front exploded perspective view of the inner housing of the chassis loaded with three cards.
Figure 13:
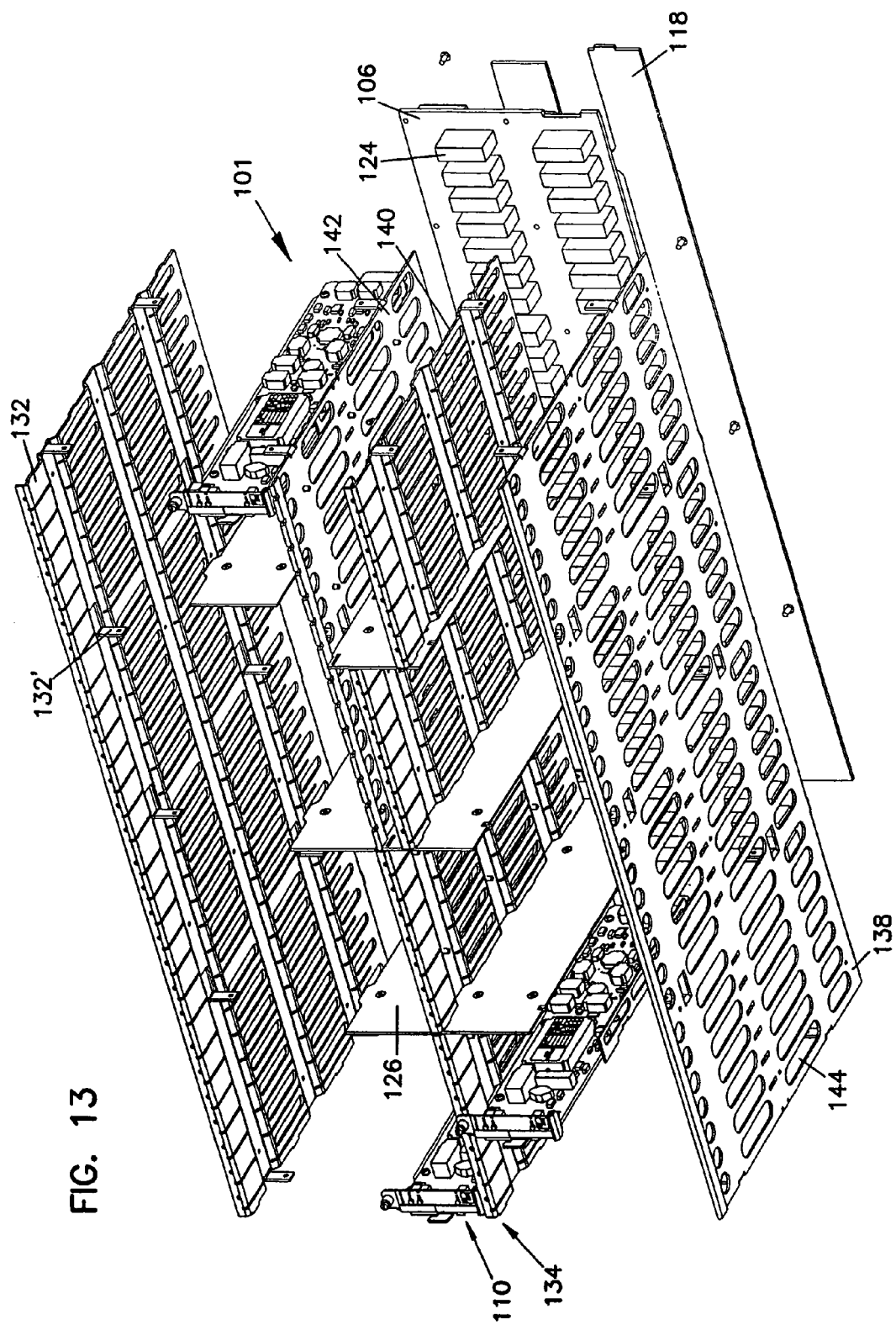
FIG. 13 is a bottom front exploded perspective view of the inner housing of the chassis loaded with three cards.
Figure 14:
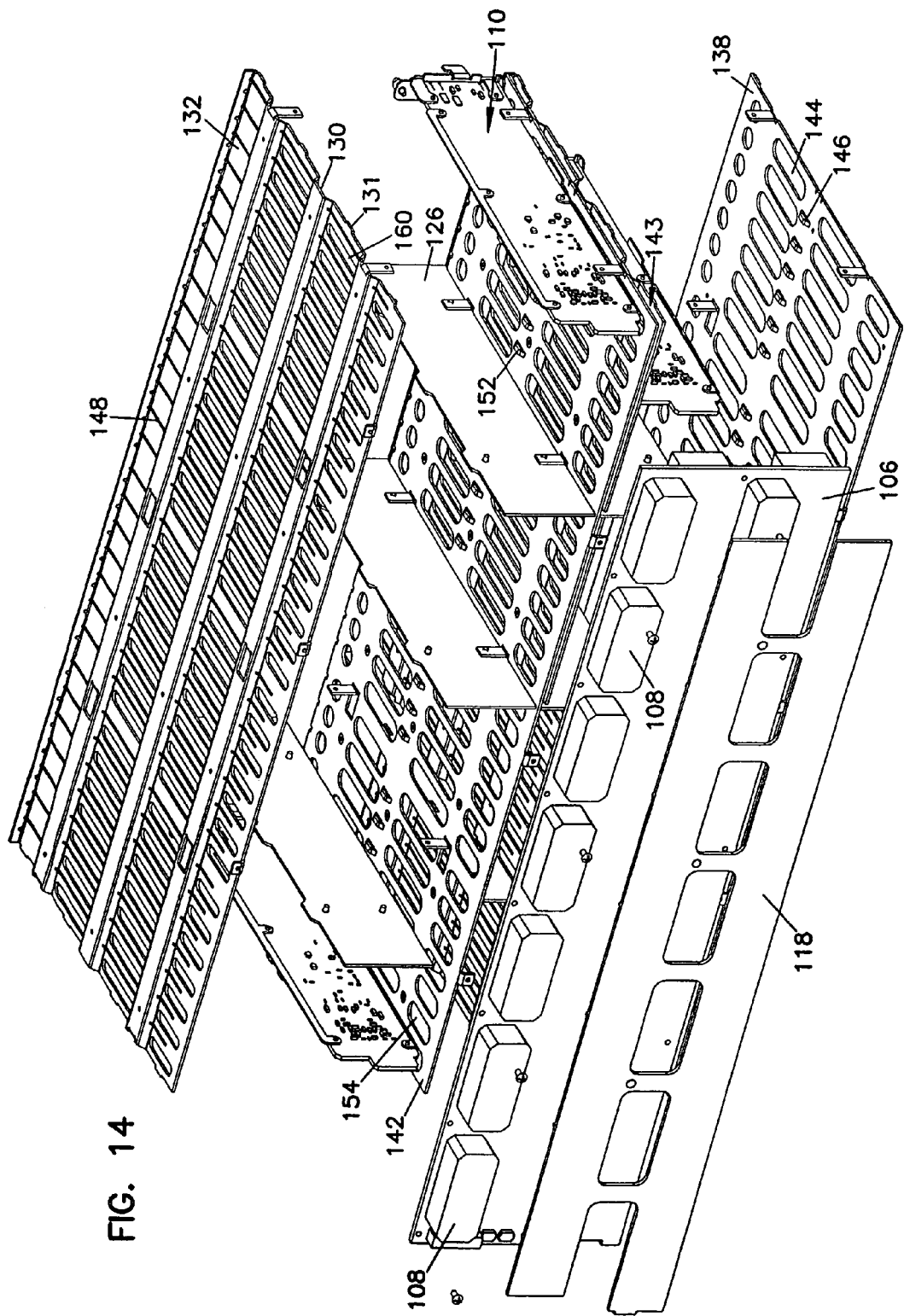
FIG. 14 is a top rear exploded perspective view of the inner housing of the chassis loaded with three cards.
Figure 15:
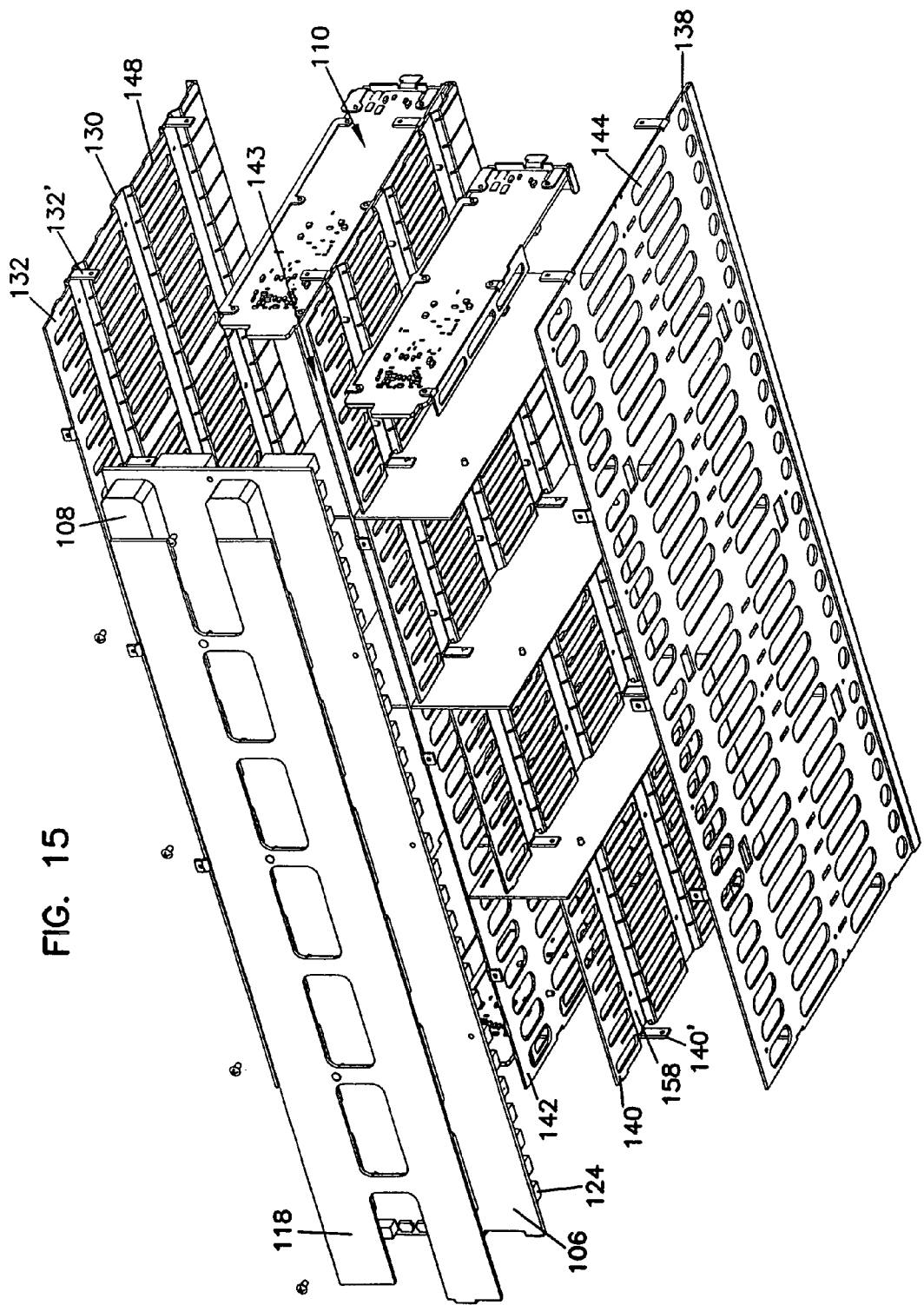
FIG. 15 is a bottom rear exploded perspective view of the inner housing of the chassis loaded with three cards.
Figure 16A:
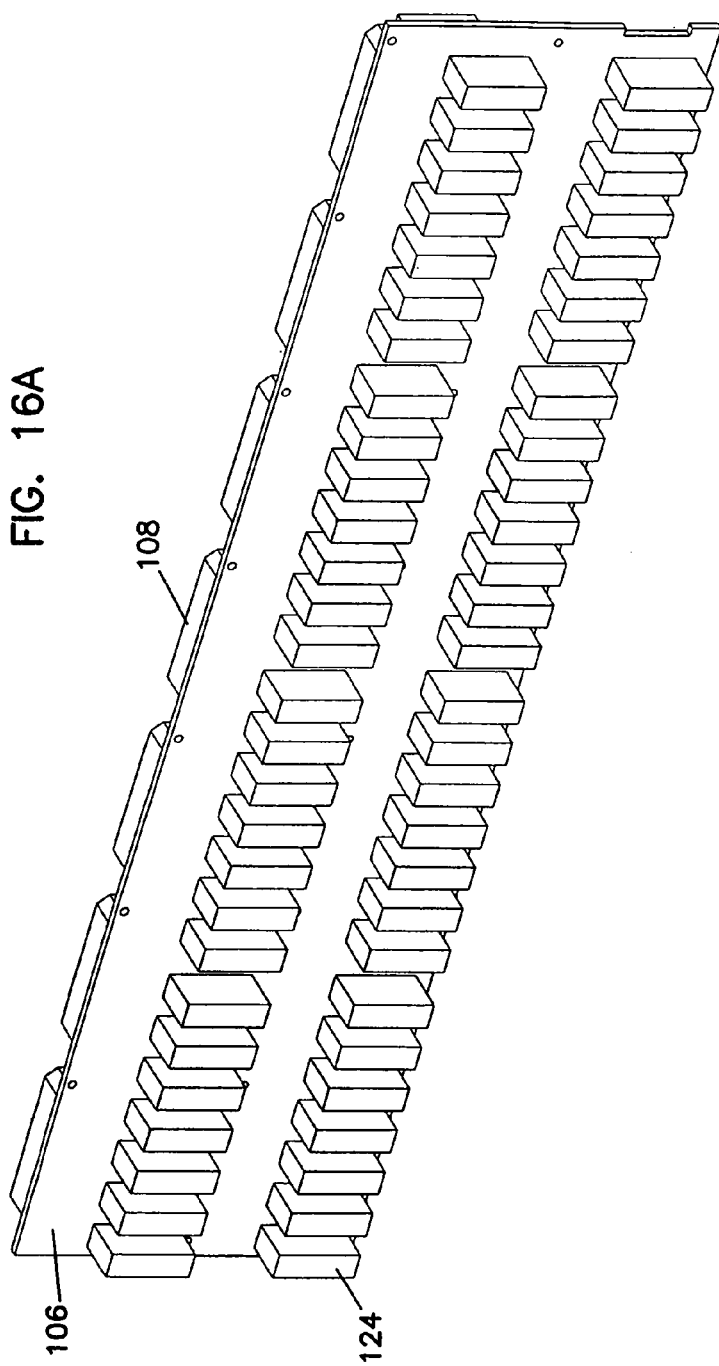
FIG. 16A is a top front perspective view of the backplane of the chassis.
Figure 16B:
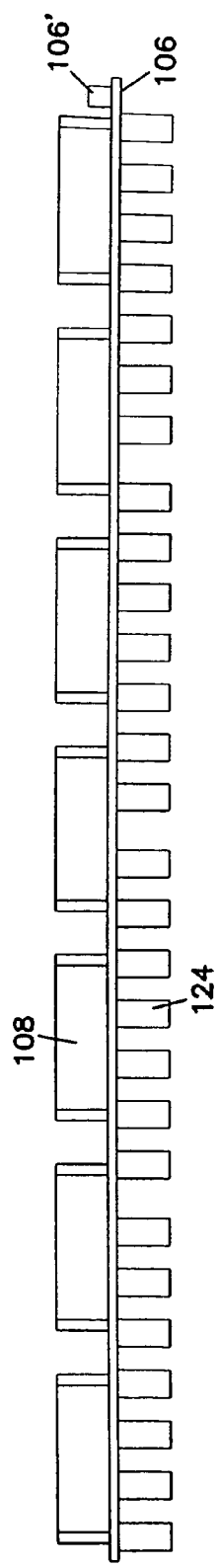
FIG. 16B is a top view of the backplane of the chassis.
Figure 16C:
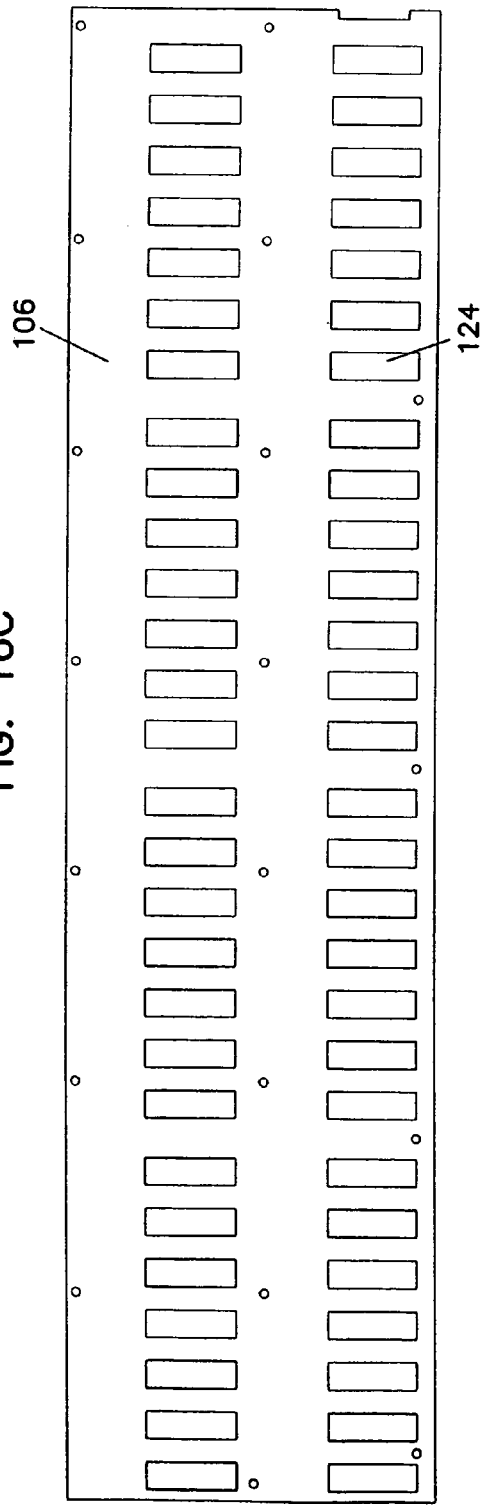
FIG. 16C is a front view of the backplane of the chassis.
Figure 16D:
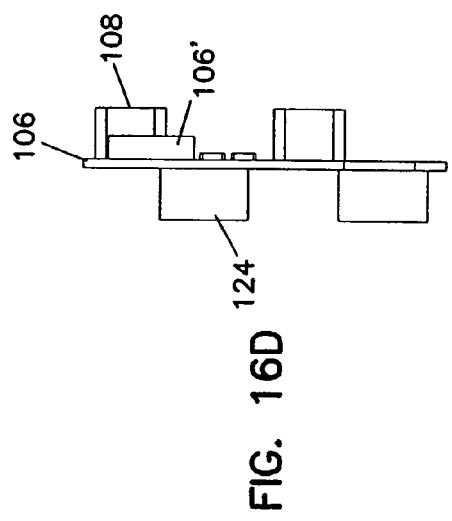
FIG. 16D is a right side view of the backplane of the chassis.

FIGS. 11A-11C show the inner housing 101 from several views. In FIG. 11A, looking down onto the top surface 132, a slight misalignment between the slots 154 of the top plate 142 and be seen because top plate 142 is visible through slots 160 in the top surface 132 of the inner housing 101. As discussed above, misalignment of the slots may result from different sizes or shapes of the slots in one surface relative to those of another or may result from slots of the same size and shape not having a common position in one surface relative to the slot position in another surface. As shown, slots 144 in the bottom surface 116 and slots 154 in the top plate 142 have the same size, shape and common position and are aligned but misalignment is introduced by slots 150 in bottom plate 140 because slots 150 in the bottom plate have a different size. Similarly, slots 150 in the bottom plate and slots 160 in the top surface have the same size, shape, and common position and are aligned, but slots 154 in the top plate have a different size and therefore, introduce misalignment. This misalignment facilitates the flame containment while allowing heat dissipation to occur.

FIG. 11B shows a front cross-sectional view taken through line A-A of FIG. 11A. The air gap 143 can be seen in this view. Also visible is the side-to-side alignment of openings 144 and 154 in the bottom surface 116 and the top plate 142, respectively. The side-to-side alignment of openings 150 and 160 in the bottom plate and the top surface, respectively, can also be seen. Misalignment between openings 144 and 150, between openings 150 and 154, and between 154 and 160 is visible as well.

FIGS. 12 through 15 show exploded views of the inner housing 101 from top front, bottom front, top rear, and bottom rear perspectives, respectively. Several circuit cards 110 are shown in installed positions relative to the top plate 142 or the bottom plate 140. Inner side walls 126 include ribs 126' that are sized to fit within ridges 130 of the top surface 132 or 158 of the bottom plate 140. Ribs 126' prevent flames from spreading over the inner sidewall 126 through the ridge 130 or 158 and into adjacent compartments and further support the middle floor 134 and the top surface 132. Mounting tabs 138' on the bottom surface 138 and mounting tabs 142' on the top plate 142 extend vertically upward to contact the vertical sidewalls 126, 104, 105 and hold them in place. Similarly, mounting tabs 132' on the top surface 132 and mounting tabs 140' on the bottom plate extend vertically downwardly to contact the vertical sidewalls 126, 104, 105 and hold them in place.

As shown, the inner housing 101 provides eight compartments including four top chambers and four bottom chambers, with each chamber holding up to seven circuit cards 110. Thus, for the chassis 100, the inner housing 101 shown can accommodate fifty-six circuit cards 110. It is to be understood that the number of chambers spanning the width of chassis 100 may vary from the number shown, as may the number of chambers that span the height. Four are shown spanning the width and two are shown spanning the height only as an example. Furthermore, it is to be understood that the number of circuit cards per compartment may vary and that seven are shown only as an example.

To hold each circuit card, the bottom surface 138 is provided with projections 146 shown as lances that hold guides on the circuit cards 110. The top plate 142 of middle floor 134 also has projections 152 to hold guides on the circuit cards 110 installed above the middle floor 134. To provide guidance for the top of the circuit cards 110 installed in the bottom chamber 125, a bottom plate 140 of the middle floor 134 has grooves or fin slots 156 running from the front edge where the cards 110 are inserted to the back edge where the backplane 106 is located. The leading edge of the top plate 142 of middle floor 134 is also grooved or slotted to align with the grooves or fin slots 156 of the bottom plate 140. The top surface 132 of the inner housing 101 also has grooves or fin slots 148 that provide guidance to the top of the circuit cards 110. The separation 143 in the middle floor 134 aids in the ability to provide grooves or fin slots 156 on the bottom side while providing projections 152 on the top side.

The ventilation slots 144 of the bottom surface 138 allow air passing up through the bottom mesh cover 116 to pass between the circuit cards 110 in the bottom chambers 125. Slots 150 of the bottom plate 140 at least partially align with the slots 144 in the bottom surface 138 and air passing up between the circuit cards 110 located in the bottom chambers 125 may pass through the slots 150 in the bottom plate 140. The top plate 142 has slots 154 that are at least partially aligned with the slots 150 of the bottom plate 140 and air passing up through the slots 150 in the bottom plate pass through the separation and then through the slots 154 in the top plate 142.

After air has passed through the middle floor 134, it may rise between circuit cards 110 installed in the top chambers. Slots 160 of the top surface 132 allow the air to pass through the top surface 132. The mesh cover created by the mesh strips 120 and 122 allows the air to pass into the separation between the mesh strips 120, 122 and the top mesh cover 102. Air then may pass through the top mesh cover 102.

Thus, air can be successfully channeled through the bottom cover 116 up through the chassis 100 and out through the top cover 102. When chassis are stacked, air passing out the top mesh cover 102 of the lower chassis 100 passes into the next chassis 100 through the bottom mesh cover 116. This continues until air passes out of the top mesh cover 102 of the highest stacked chassis 100. Heat generated by the circuit cards 110 is channeled up through each chassis passing through the small separation between cards 110 until it exits out of the rack.

The slots 144 may be provided in several rows on the bottom surface 138, and three rows are shown including a first row 224, a second row 226, and a third row 228. A solid area 210 on the bottom surface 138 may be included, such as between the first row 224 of slots and a first edge 234 of the bottom surface 138. The third row 228 of slots of the bottom surface 138 may be positioned between the second row 226 of slots and a second edge 240 that is opposite the first edge 234 of the bottom surface 138.

Similarly, the slots 150 and 154 of the middle floor 134 may be positioned in several rows, such as the three-row configuration shown. The slots of first row 218 of the middle floor 134 at least partially overlap with the slots of the first row 224 of the bottom surface 138. The slots of second row 220 of the middle floor 134 at least partially overlap with the slots of the second row 226 of the bottom surface 138. The slots of the third row 222 at least partially overlap with the slots of the third row 228 of the bottoms surface 138.

The middle floor 134 may also include a solid area 208 that is positioned between the first row 218 of slots and a first edge 323 of the middle floor 134. The third row 222 of slots of the middle floor 134 may be positioned between the second row 220 of slots and a second edge 238 opposite the first edge 232 of the middle floor 134. The solid area 208 at least partially overlaps with the solid area 210 of the bottom surface 138.

The slots 160 of the top surface 132 may be positioned in several rows as well, including the three adjacent rows that are shown. The slots of the first row 212 of the top surface 132 at least partially overlap with the slots of the first row 218 of the middle floor 134. The slots of the second row 214 of the top surface 132 at least partially overlap with the slots of the second row 220 of the middle floor 134. The slots of the third row 216 of the top surface 132 at least partially overlap with the slots of the third row 222 of the middle floor 134.

The top surface may also include a solid area 206 that is positioned between the first row 212 of slots and a first edge 230 of the top surface 132. The third row 216 of slots may be positioned between the second row 214 of slots and a second edge 236 of the top surface 132 opposite the first edge 230. The solid area 206 at least partially overlaps with the solid area 208 of the middle floor 134.

The spacing between the top plate 142 and the bottom plate 140 of the middle floor 134 diffuses flames emanating from circuit cards 110 in the bottom chamber 125' before they may pass into the top chamber 127'. Likewise, mesh strips 120, 122 and the separation between the mesh strips 120, 122 and the mesh cover 102 diffuse flames emanating from circuit cards 110 in the top chamber 127'. Additionally, the bottom mesh cover 116 of the next chassis up in the rack assists in diffusing any flames not fully diffused by the mesh cover layers in the top of the chassis 100. Inner side panels 126 create barriers to flames escaping to the sides of the chambers so that the flame becomes trapped within a chamber between the two side panels 126, the floor, and the ceiling.

In the event of a fire, material on a given circuit card burns, soot is formed and rises. The soot may collect in the perforations of the mesh covers to clog the holes. This clogging effect assists in choking the fire. Furthermore, the bottom cover 116 catches material as it would fall from a burning card. The mesh strips 120, 122 are positioned so that they overlay the first and second rows of slots of the top surface 132, middle floor 134, and bottom surface 138. Thus, the third row of slots of the top surface 132, middle floor 134, and bottom surface 138 are not covered by the mesh strips 120, 122 but only by the mesh cover 102. As a result, a less resistive pathway is created through up through the third row and additional ventilation is provided through the third row 228, 222, and 216.

The opposite effect is created by providing the solid areas of the top surface 132, middle floor 134, and bottom surface 138. The overlapping solid areas 206, 208, and 210 prevent upward air flow. As a result, air is channeled from the front edges 234, 232, and 230 toward the third row 228, 222, and 216 and eventually up through the mesh cover 102. Electrical components, such as large capacitors that tend to burn but do not produce significant amounts of heat may be positioned between the overlapping solid areas so that less ventilation is provided across them.

Figure 17A:
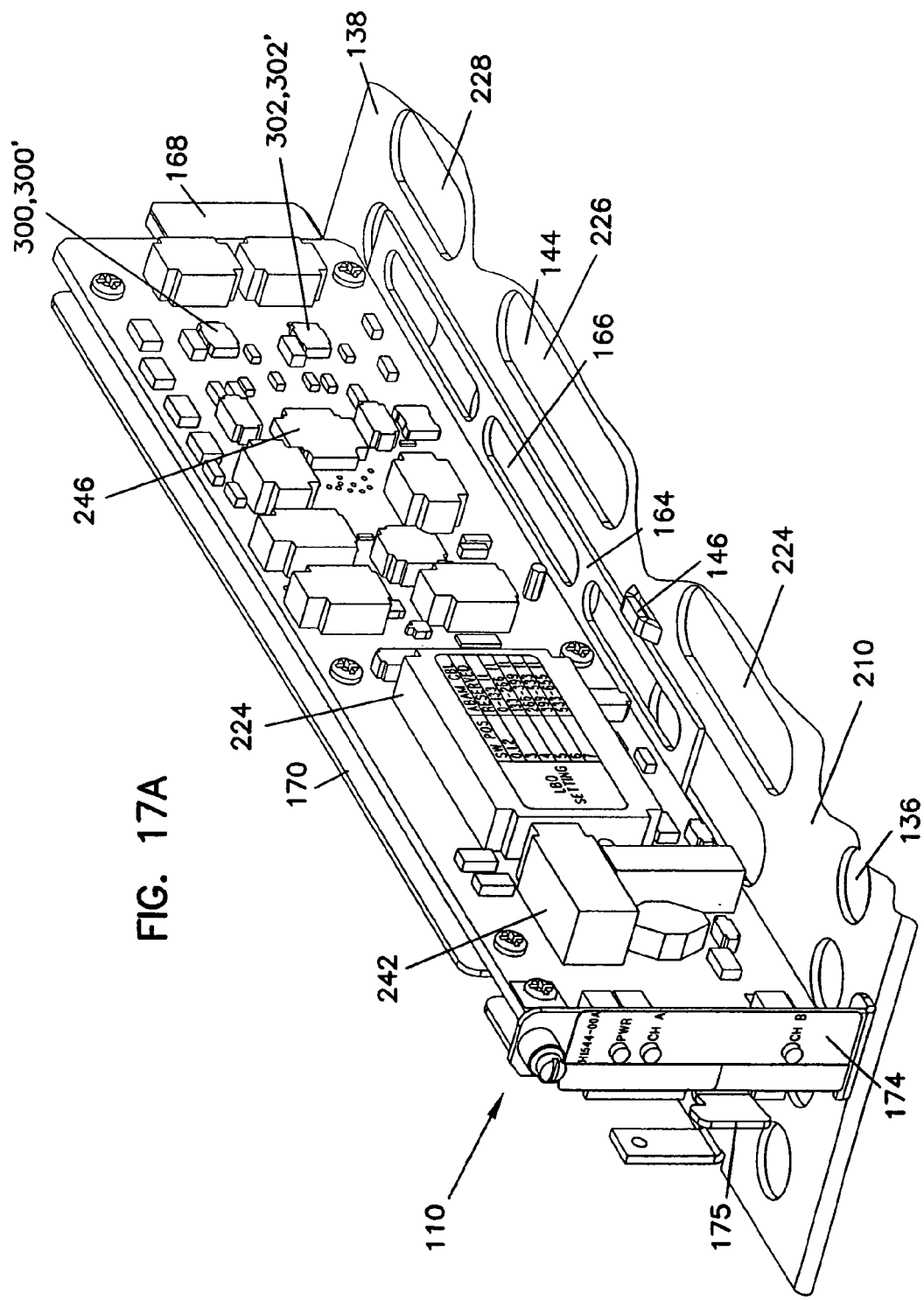
FIG. 17A is a partial top front perspective view of a card mounted to a floor surface of the inner housing of the chassis.
Figure 17B:
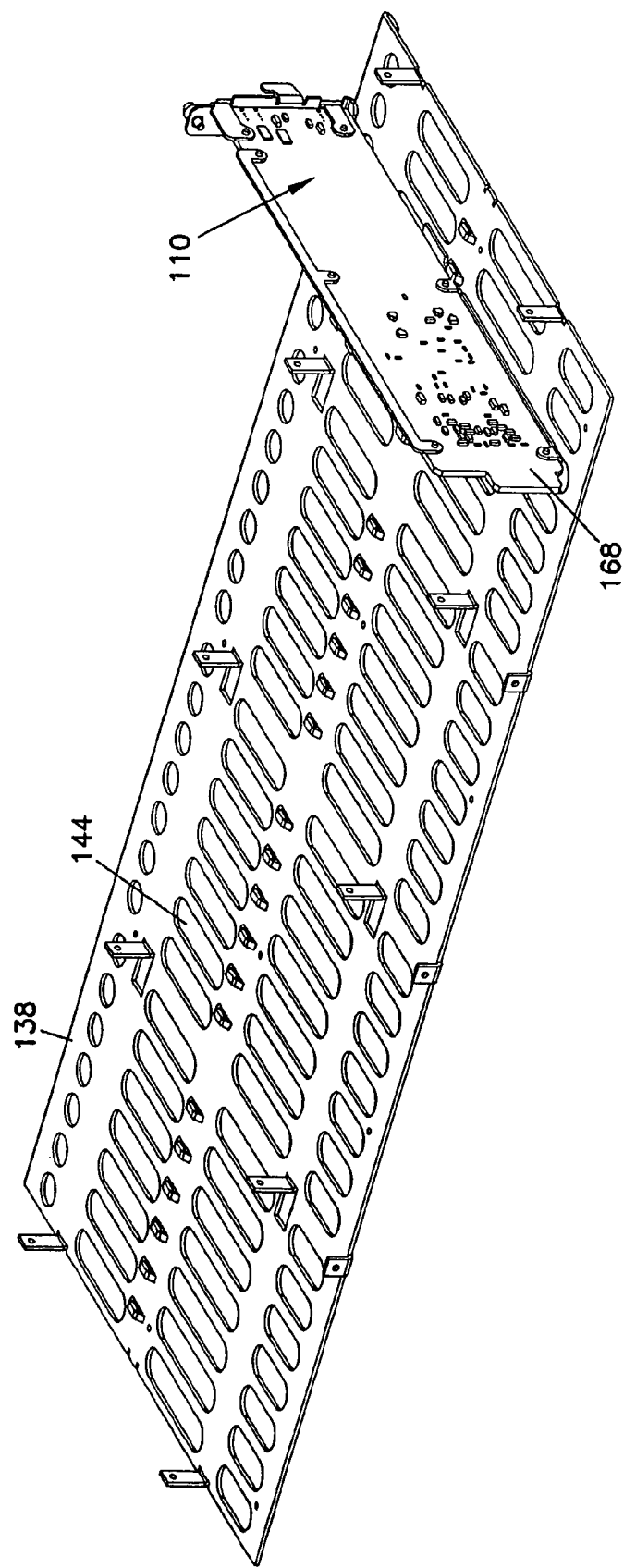
FIG. 17B is a top rear perspective view of a card mounted to a floor surface of the inner housing of the chassis.
Figure 17C:
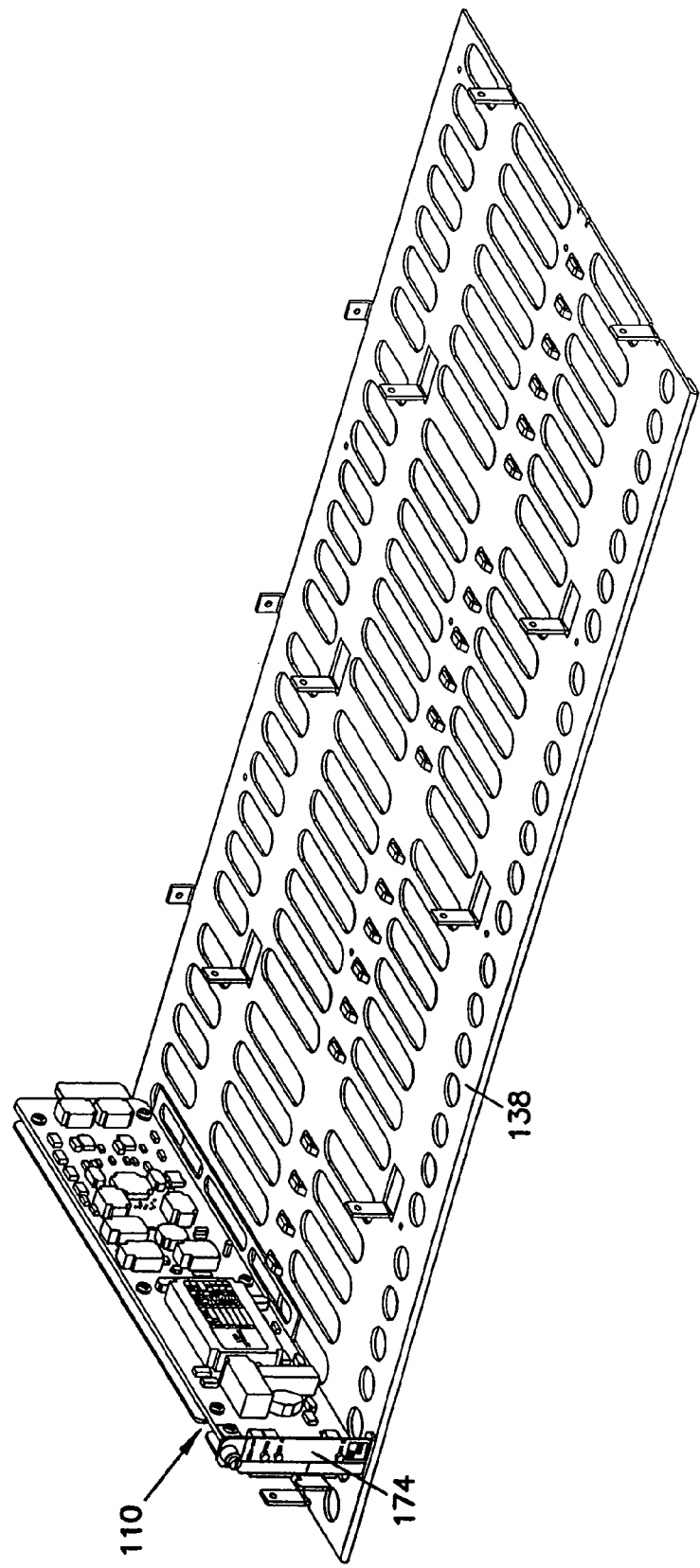
FIG. 17C is a top front perspective view of a card mounted to a floor surface of the inner housing of the chassis.
Figure 17D:
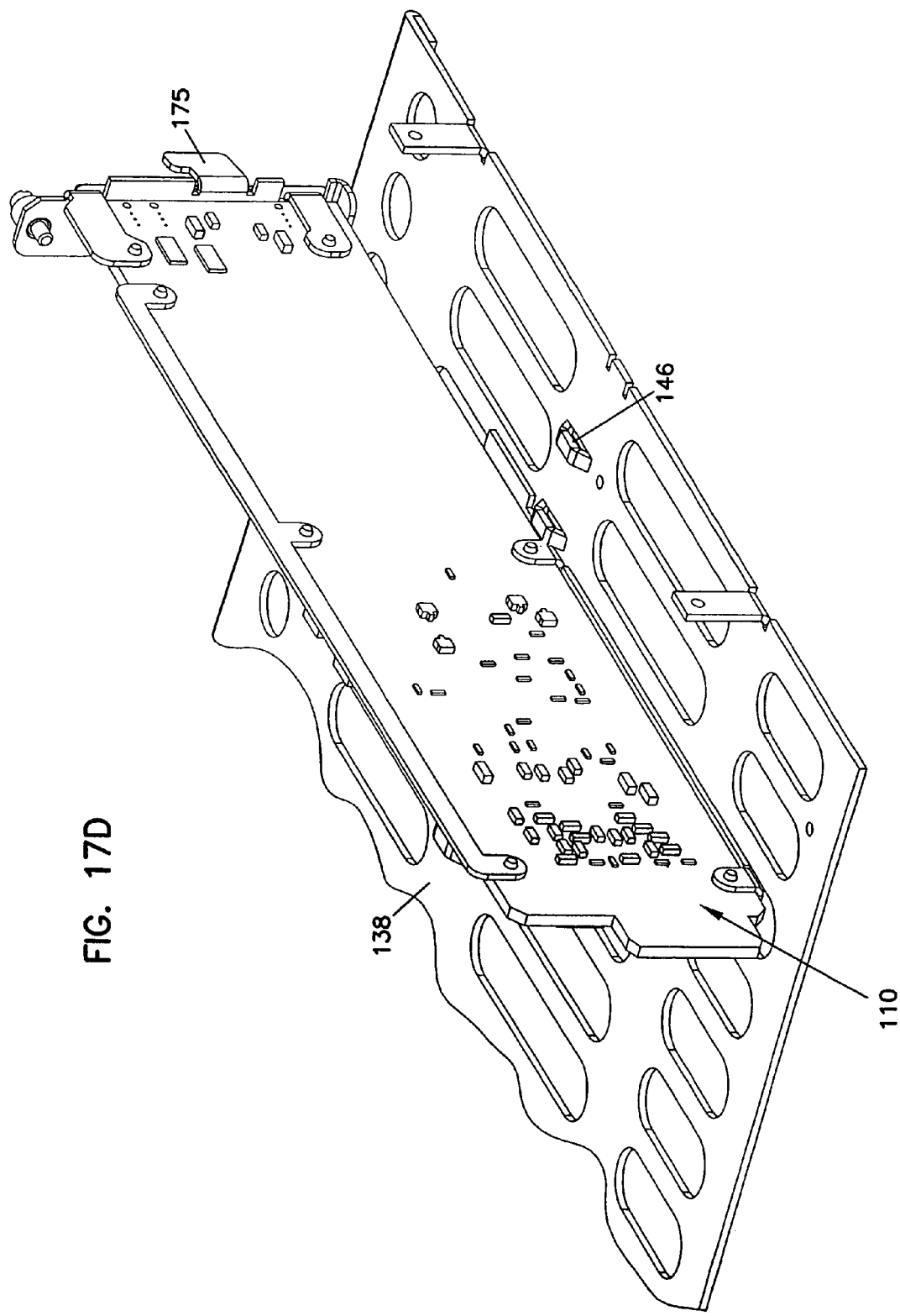
FIG. 17D is a partial top rear perspective view of a card mounted to a floor surface of the inner housing of the chassis.
Figure 18A:
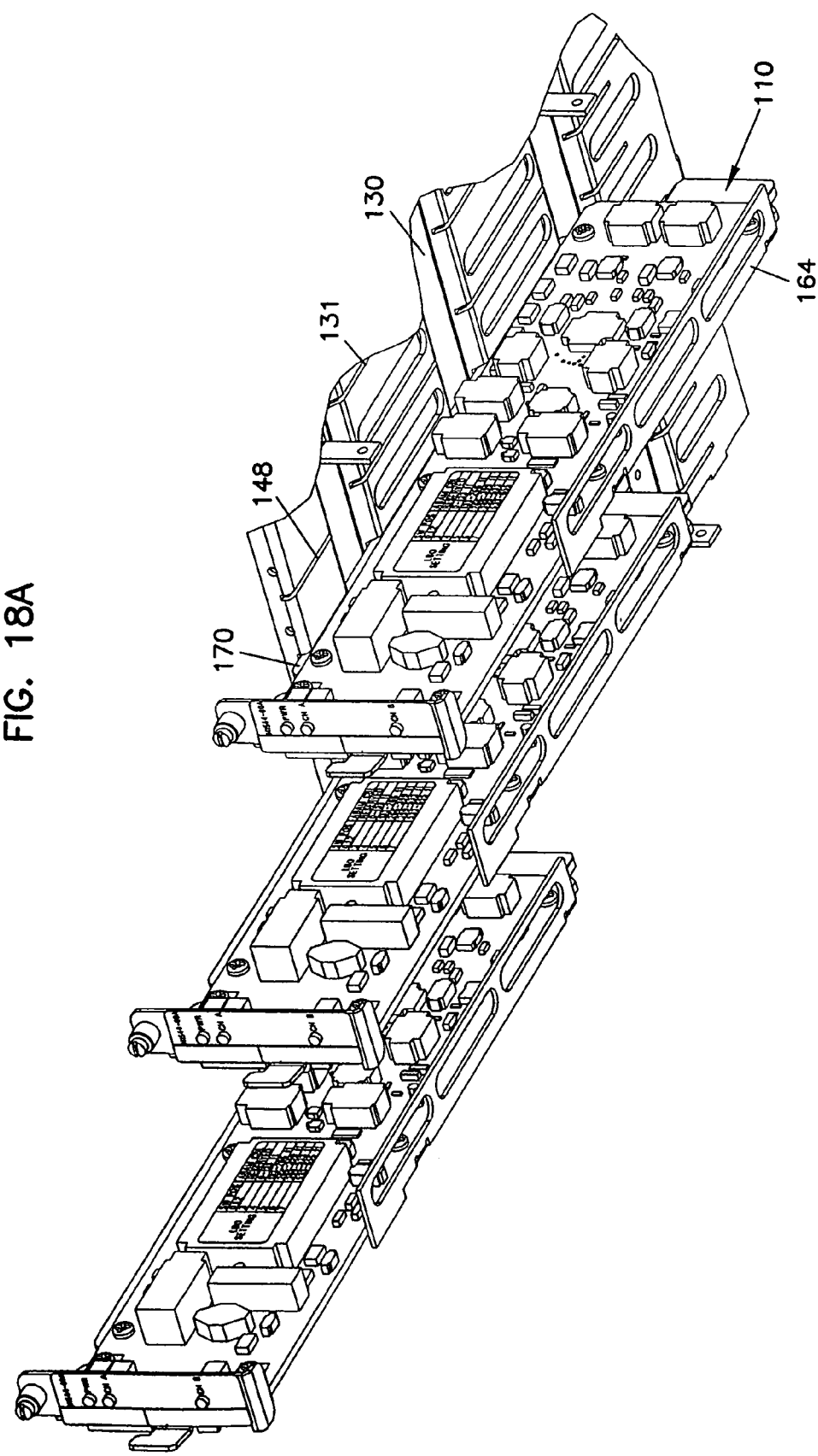
FIG. 18A is a partial bottom front perspective view of cards partially installed relative to a ceiling surface of the inner housing of the chassis.
Figure 18B:
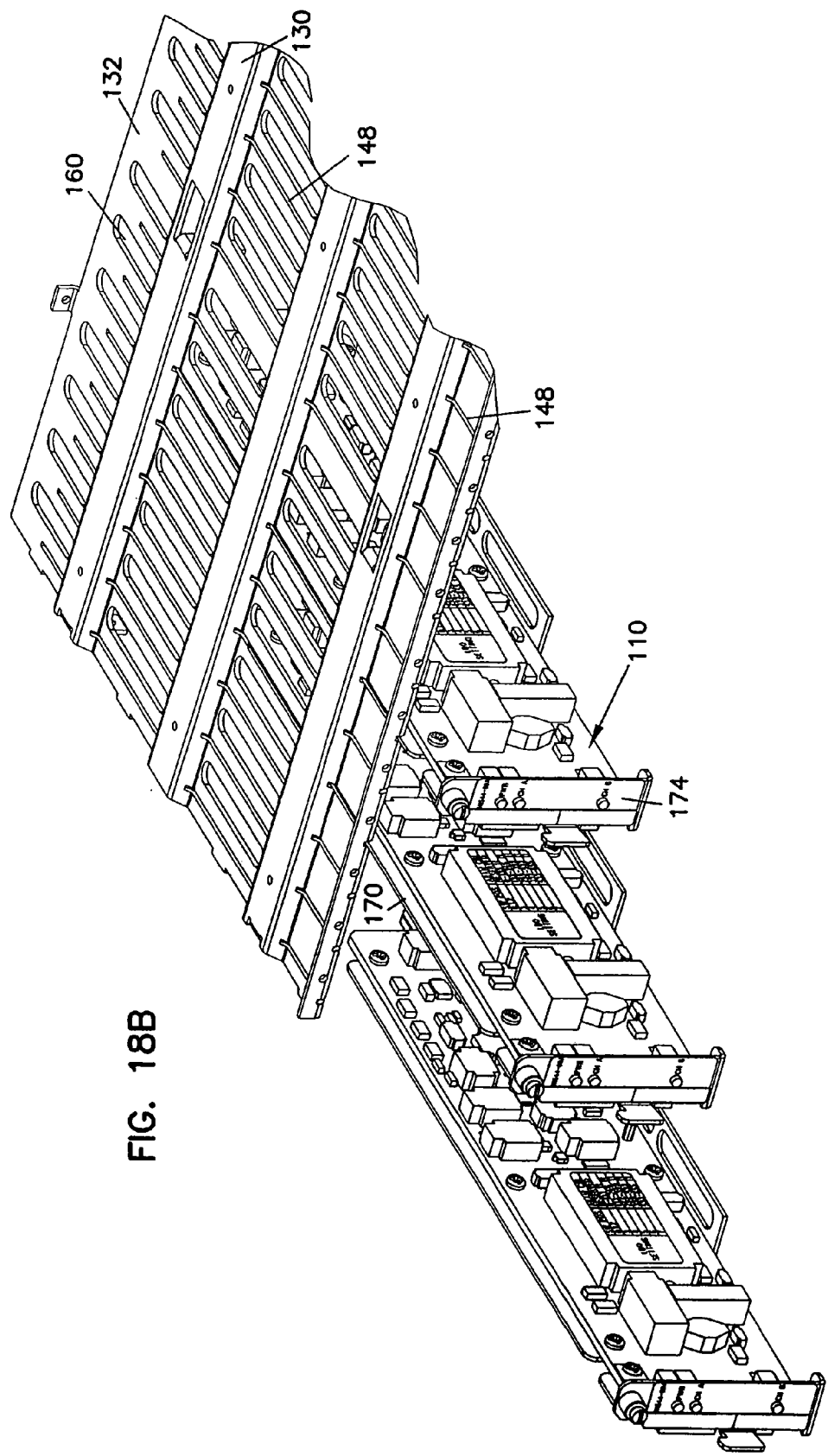
FIG. 18B is a partial top front perspective view of cards partially installed relative to a ceiling surface of the inner housing of the chassis.
Figure 18C:
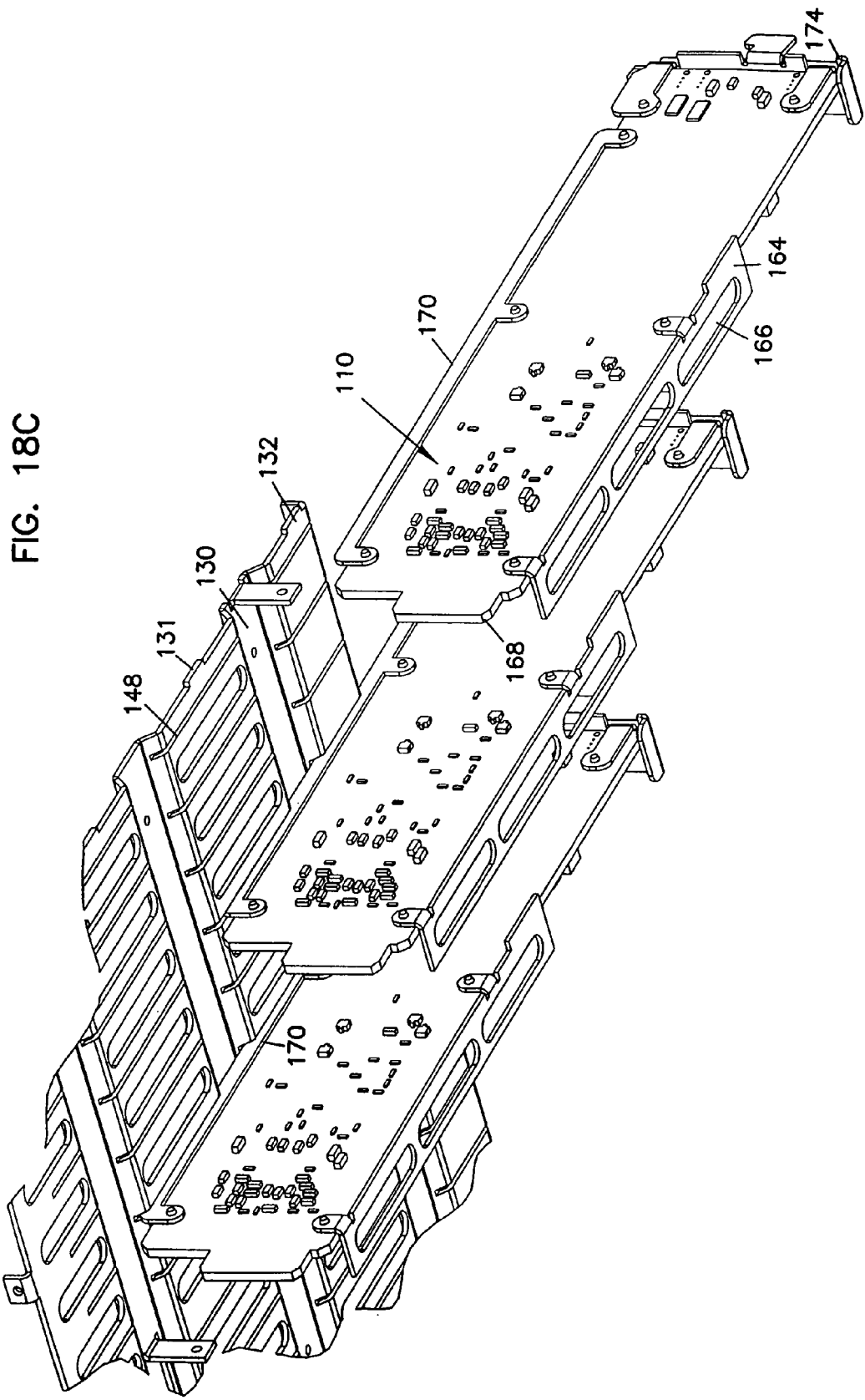
FIG. 18C is a partial bottom rear perspective view of cards partially installed relative to a ceiling surface of the inner housing of the chassis.
Figure 18D:
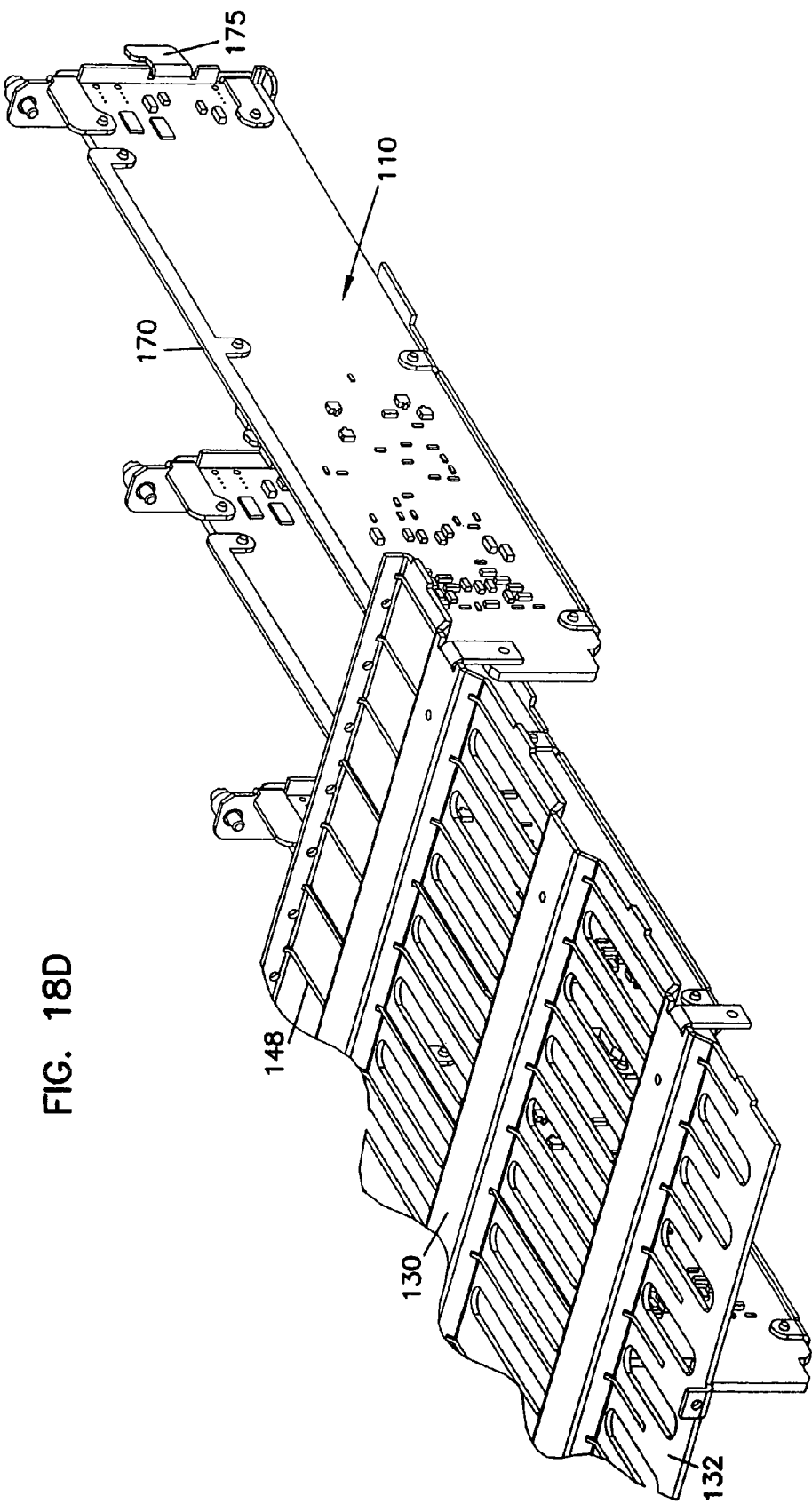
FIG. 18D is a partial top rear perspective view of cards partially installed relative to a ceiling surface of the inner housing of the chassis.
Figure 20A:
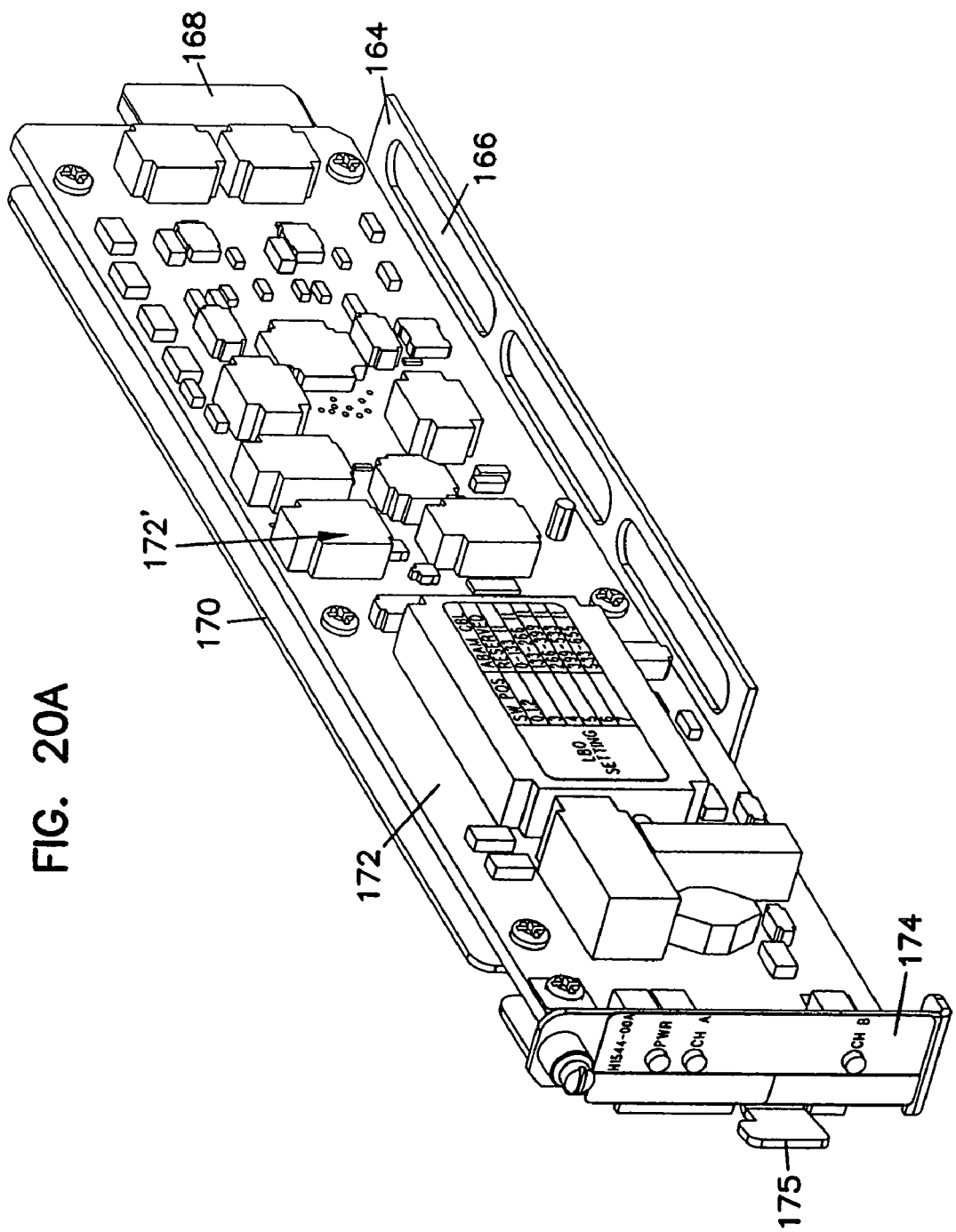
FIG. 20A is a top front perspective view of the repeater circuit card.
Figure 20B:
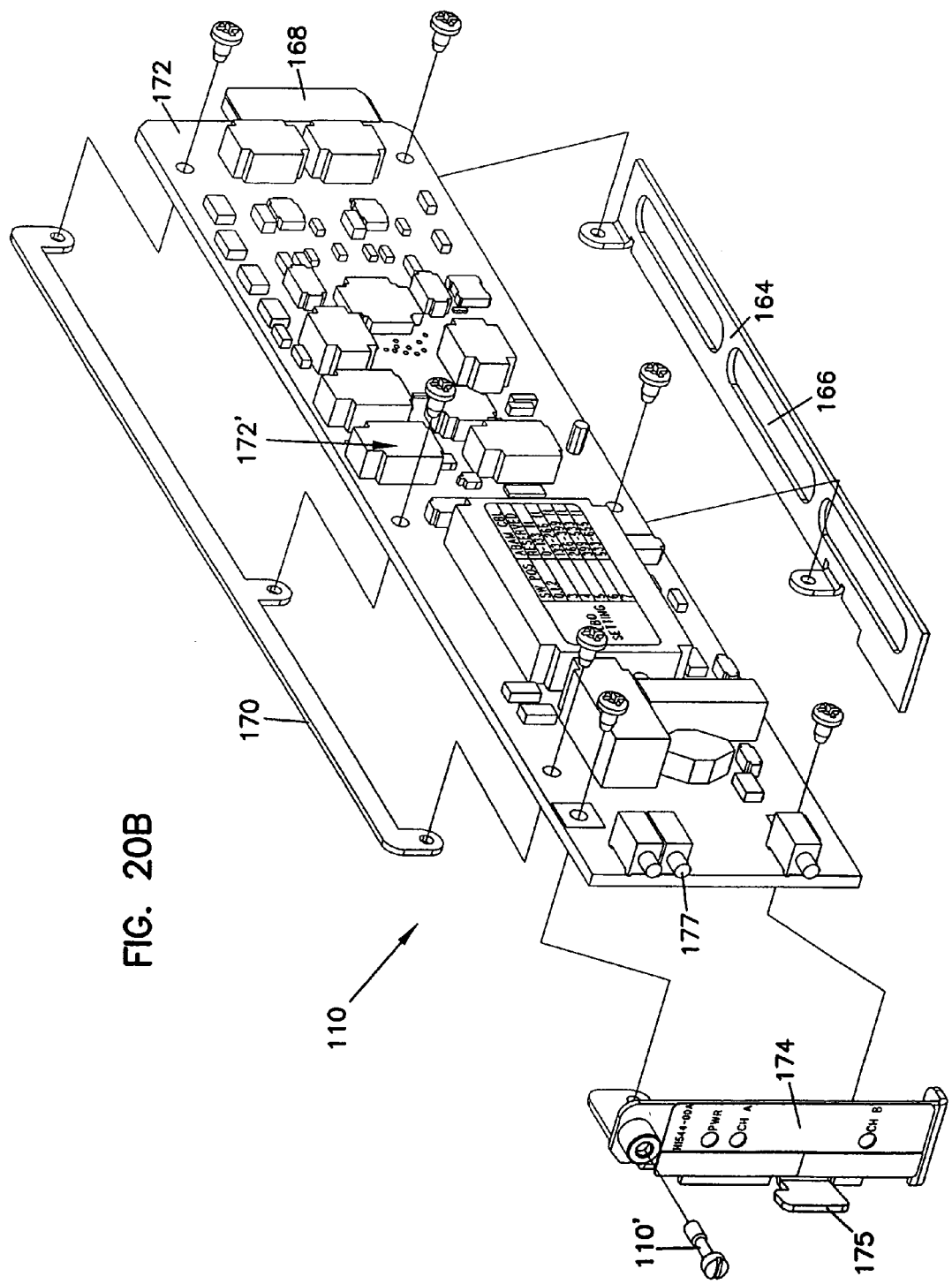
FIG. 20B is an exploded top right perspective view of the repeater circuit card.
Figure 20C:
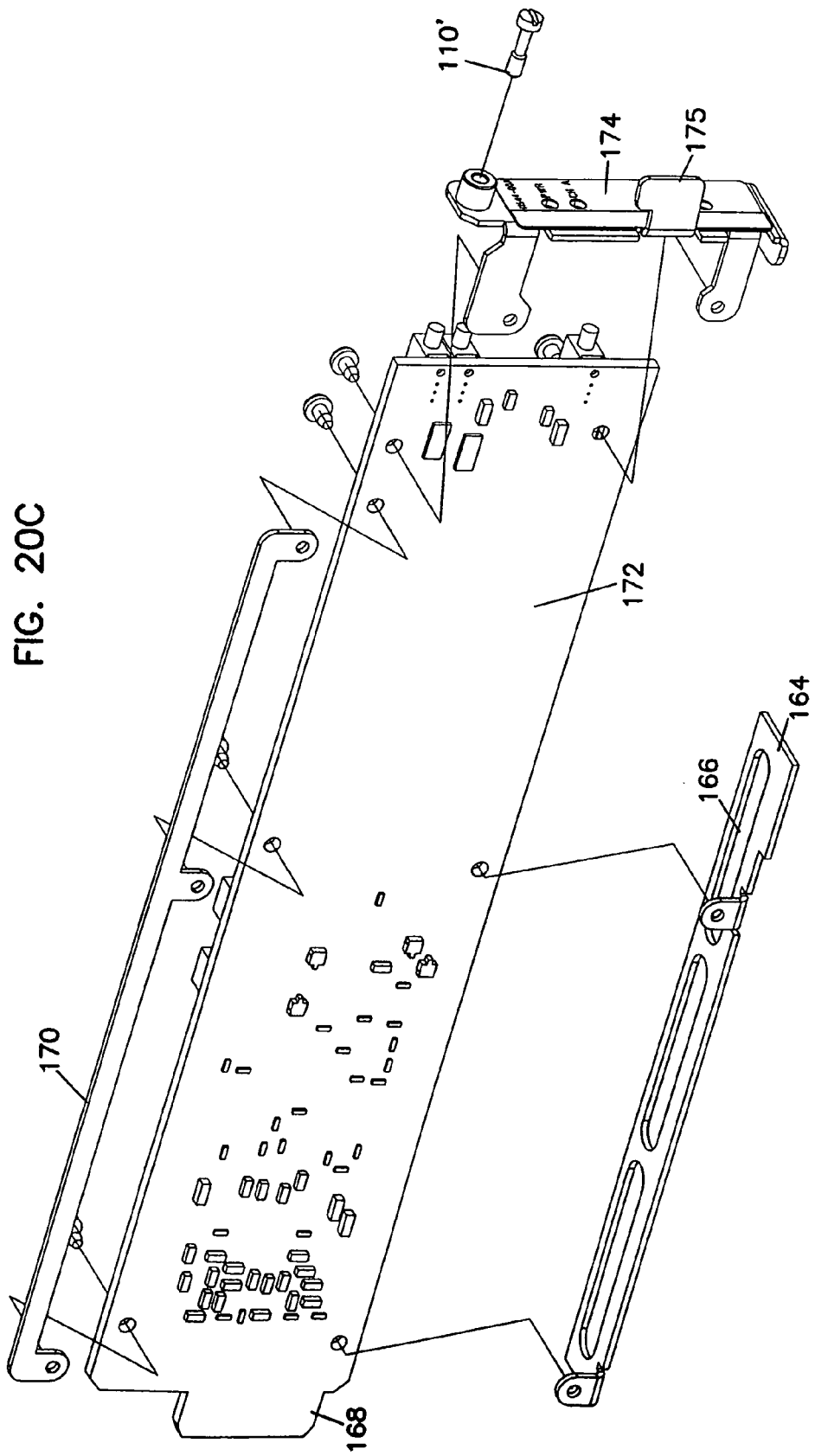
FIG. 20C is an exploded top left perspective view of the repeater circuit card.

Electrical components that do produce significant amounts of heat may be positioned between the overlapping rows of slots so that ventilation is adequate. Electrical components that may produce heat and are susceptible to some burning may be positioned between the overlapping first rows or between the overlapping second rows so that ventilation is provided, but mesh strips 120, 122 provide additional flame diffusion. Layout of a repeater circuit card as it relates to the slots and solid areas of the chassis 100 is discussed below with reference to FIGS. 17A and 25.

FIGS. 16A-16D show the backplane. As previously discussed, the backplane 106 provides several internal connectors 124 sized to engage an electrical connector on the circuit card 110. The connectors 124 generally provide signals to the circuit card 110 and/or receive signals from it. The connectors 124 pass signals between the card and the external connectors 108. The external connectors are sized to engage electrical cables passing up through a chassis rack.

As shown, fourteen external connectors 108 are provided and fifty-six internal connectors 124 are provided. Thus, each external connector communicates with four internal connectors 124. A power connector 106' is also located on the backplane and is sized to engage a power connector in the chassis rack. The power connector 106' provides power to each of the internal connectors 124 that then channel the electrical power to the circuit card 110.

FIGS. 17A-17D show several views of the repeater circuit card 110 installed relative to the bottom surface 138 of the inner housing 101 of the chassis 100. The cards 110 mount in the same fashion to the top plate 142. The repeater circuit card 110 has a guide 164 that is generally perpendicular to the card 110 and that fits between the projections 146 of the bottom surface 138 and the projections 152 of the middle floor 134. The guide 164 includes slots 166 that partially align with the slots 144 in the bottom surface. Likewise, the slots 166 partially align with the slots 154 in the top plate 142 of the middle floor 134. Thus, the air passing through the bottom surface 138 and/or through the middle floor 134 passes through the slots 166 in the guide 164 on each circuit card 110 and then between each circuit card 110 and on through the area above.

As discussed above and shown in detail in FIG. 17A, electrical components such as a capacitor 242 that do not produce significant heat but are susceptible to burning may be positioned on specific locations of the card 110. For example, the capacitor 242 may be positioned such that when the card 110 is fully installed in the chassis 100, the component 242 is positioned between solid areas such as above the solid area 210 of the bottom surface 138 and below the solid area 208 of the middle floor 134. Other components that do not generate significant amounts of heat and do not significantly burn, such as input operational amplifiers 300, 300' (one chip) and 302, 302' (another chip) included in various embodiments, may be positioned on the card 110 such that they lie over slots and/or solid areas of the horizontal surfaces of the chassis 100 when the card is inserted. As shown, the amplifiers 300, 300' and 302, 302' lie partially over the third row of slots 228 and the solid area that lies between the third row of slots 228 and the second row of slots 226.

Components that do produce heat such as a DC-DC converter 244 or a transceiver 246, may be positioned on the card 110 such that when the card is fully installed in the chassis 100 the components 244, 246 are positioned between overlapping rows of slots. As shown, the component 244 is positioned between the first row 224 of the bottom surface 138 that overlaps with the first row 218 of the middle floor 134. The component 246 is positioned between the second row 226 of the bottom surface 138 that overlaps with the second row 220 of the middle floor 134. The circuitry including DC-DC converter 244 and transceiver 246 of a repeater circuit card 110 are discussed in more detail below.

The circuit card 110 has a connector 168 that mates with card edge connector 124 on the backplane 106 of the chassis 100 once the card 110 has been fully inserted into a card position in the inner housing 101. A card faceplate 174 abuts the bottom surface 138 of the inner housing 101 and may provide a connection to the middle floor 134 or top surface 132 to lock the card 110 in place. In addition to the guide 164 aligning the card 110 in conjunction with the projections 146, 152 within a card position in the inner housing 101, fin 170 also assists by guiding the top of the card 110 when introduced into a groove or fin slot 148, 156.

FIGS. 18A-18D show various views of repeater cards 110 with a position relative to grooves or fin slots 148 in recessed areas 131 defined by ridges 132 in the top surface 132 of the inner housing 101. As the card 110 is being inserted into a card position in the inner housing 101, the fin 170 must align with the groove 148 for the card to fit perpendicularly relative to the top surface 132. A perpendicular orientation of the card relative to the top surface 132 is used in this embodiment for the guide 164 of the card 110 to seat on the middle floor 134, or bottom surface 116 and fit between the guide projections 146, 152. A perpendicular orientation also permits the card connector 168 to easily slide into and out of the backplane connector 124.

The card 110 is guided by the groove 148 as it is inserted, and once the guide 164 reaches a projection 146, 152, the guide 164 also assists in maintaining the card 110 within a designated card position. Once the card is fully inserted, the card connector 168 maintains electrical connection to the internal backplane connector 124 and the card faceplate 174 abuts the top surface 132.

FIGS. 19A-19C show various plan views and FIGS. 20A-20D show various exploded views of a T1 repeater card 110. It is to be understood that the chassis 100 may accommodate circuit cards 110 having functionality other than that of a repeater circuit. The repeater card 110 has a main printed circuit board 172 housing various electrical circuitry 172'. Typically with a repeater circuit, the card 110 will include a transceiving device to receive and reconstruct a signal having a data component and a clock component. The repeater circuitry 172' also usually includes amplification. This circuitry 172' may generate a significant amount of heat that must be dissipated by the chassis 100.

As shown, the connector 168 received by internal backplane connector 124 is an extension of the printed circuit board 172. The guide 164 with slots 166 that fits between the projections 146, 152 attaches to the bottom edge of the printed circuit board 172 and is positioned transversely relative to the circuit board 172. The guide is typically made of sheet metal. The fin 170 that fits within the groove 148, attaches to the top edge of the printed circuit board 172 and lies in a plane parallel to that of the printed circuit board 172. The fin 170 is also typically made of sheet metal.

Faceplate 174 attaches to a front edge of the repeater card 110. The faceplate typically has light emitting diodes (LEDs) 177 that allow visual inspection of the circuit card's operation. As discussed, the faceplate 174 may establish a fixed connection to the middle floor 134 or the top surface 132 with fastener 110' to hold the card 110 within the inner housing 101. A generally forward positioned finger 175 extending away from the faceplate 174 in a direction opposite to the printed circuit board 172 may be integrated into the faceplate 174 to assist in the insertion and removal of the card 110 from the chassis 100.

FIG. 21 illustrates a heat baffle 177 that may be utilized by an embodiment of the present invention. The baffle 177 has a hood portion 179. The hood portion 179 has a sloped portion 176 and triangular side panels 188. The triangular side panels 188 have mounting flanges 190 that rest on the surface of a chassis 100. The baffle 177 also has a base portion 181 having a floor 182 and a face 192. The base portion 181 lies directly over the top mesh layer 102 and the hood portion 179 directly overlays the base portion 181 with the face 192 being fixed to the sloped region 176 with clips 184 that pass through slots 186 to pinch the face 192 to a lip 189 extending from the sloped region 176. The heat baffle 177 may be utilized by inserting the baffle between chassis 100 stacked in a rack. As heat and/or flames rise from the top cover 102 of a chassis 100, the heat and/or flames are diverted out the front or back of the rack depending upon the orientation of the baffle 177.

The hood portion 179 of the baffle 177 is typically a solid sheet of cold rolled sheet metal. Thus, heat and flames cannot permeate the sloped surface 176 and are redirected. However, the base portion 181 is typically a mesh material such as permeated cold rolled sheet metal that allows heat to pass through while diffusing flames. The hood portion is fixed to the rack holding the chassis 100 with mounting flanges 178 and 180. The mounting flanges 178, 180 are shown as being mounted to a first position used where the front of the chassis 100 extends beyond a rail of the rack. Where the chassis 100 has a front edge flush with the mounting rail of the rack, the flanges 178, 180 attach so that they are flush with the front edge of the baffle 177.

Figure 22:
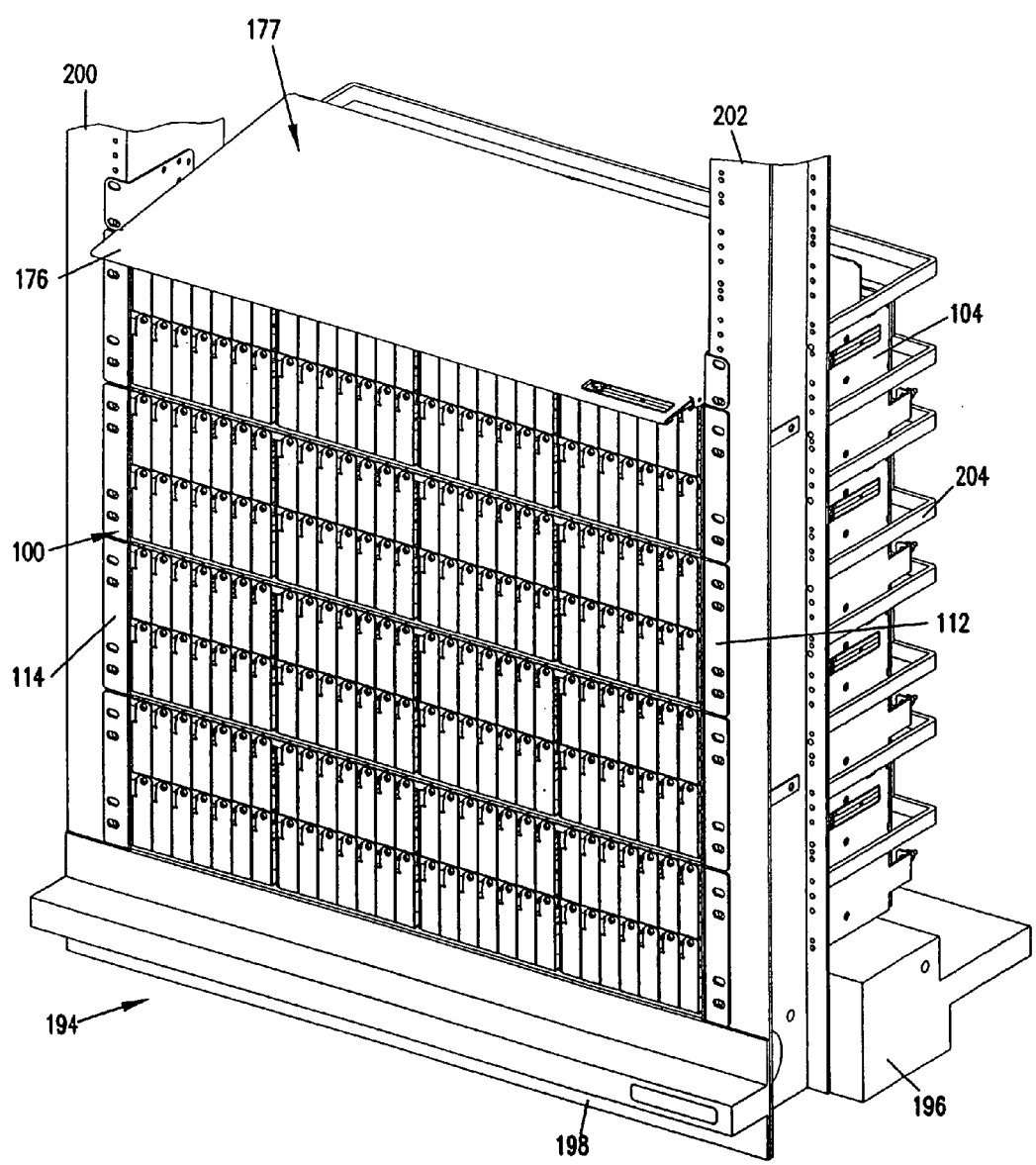
FIG. 22 is top front perspective view of a rack holding multiple chassis and the heat baffle.

FIGS. 22 shows a top front perspective view of a rack 194 holding several chassis 100 with a heat baffle 177 installed. The heat rises through the chassis 100 as previously discussed and exits out the top cover 102 of the top chassis and is redirected to the rear of the rack 194 by the heat baffle 177. The typical chassis includes a base 196 with a front portion 198. Two vertical siderails 200 and 202 are included and are fixed to the base 196. Each chassis 100 and the heat baffle 177 slides into position between the siderails 200 and 202 and mounting flanges 112, 114 of the chassis 100 and the flanges 178, 180 of the baffle 177 abut the rails 200, 202. Cable bars 204 extend from the siderails 200, 202 and wrap behind each chassis 100 and baffle 177.

Figure 23A:
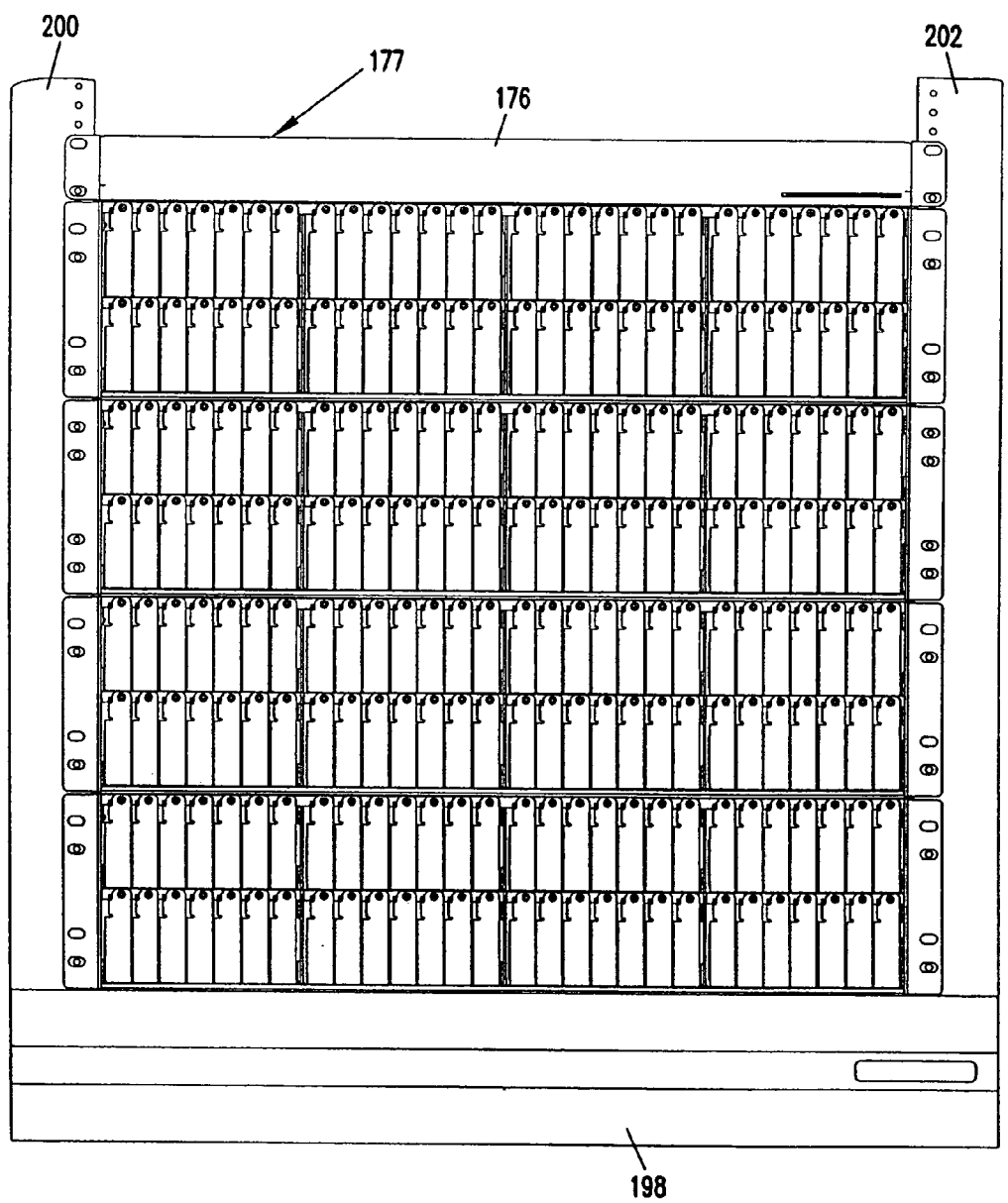
FIG. 23A is front view of a rack holding multiple chassis and the heat baffle.
Figure 23B:
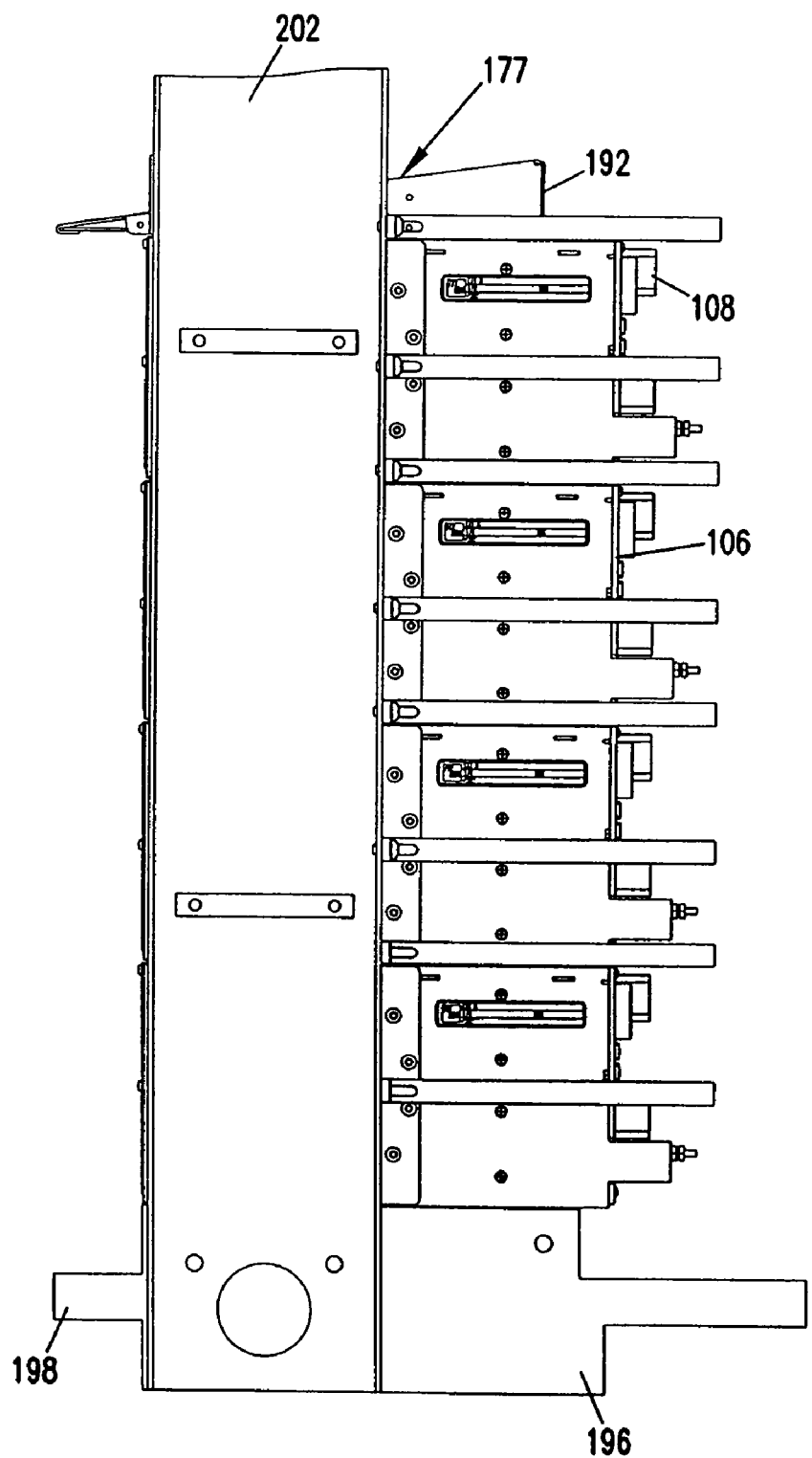
FIG. 23B is a right side view of a rack holding multiple chassis and the heat baffle.
Figure 24A:
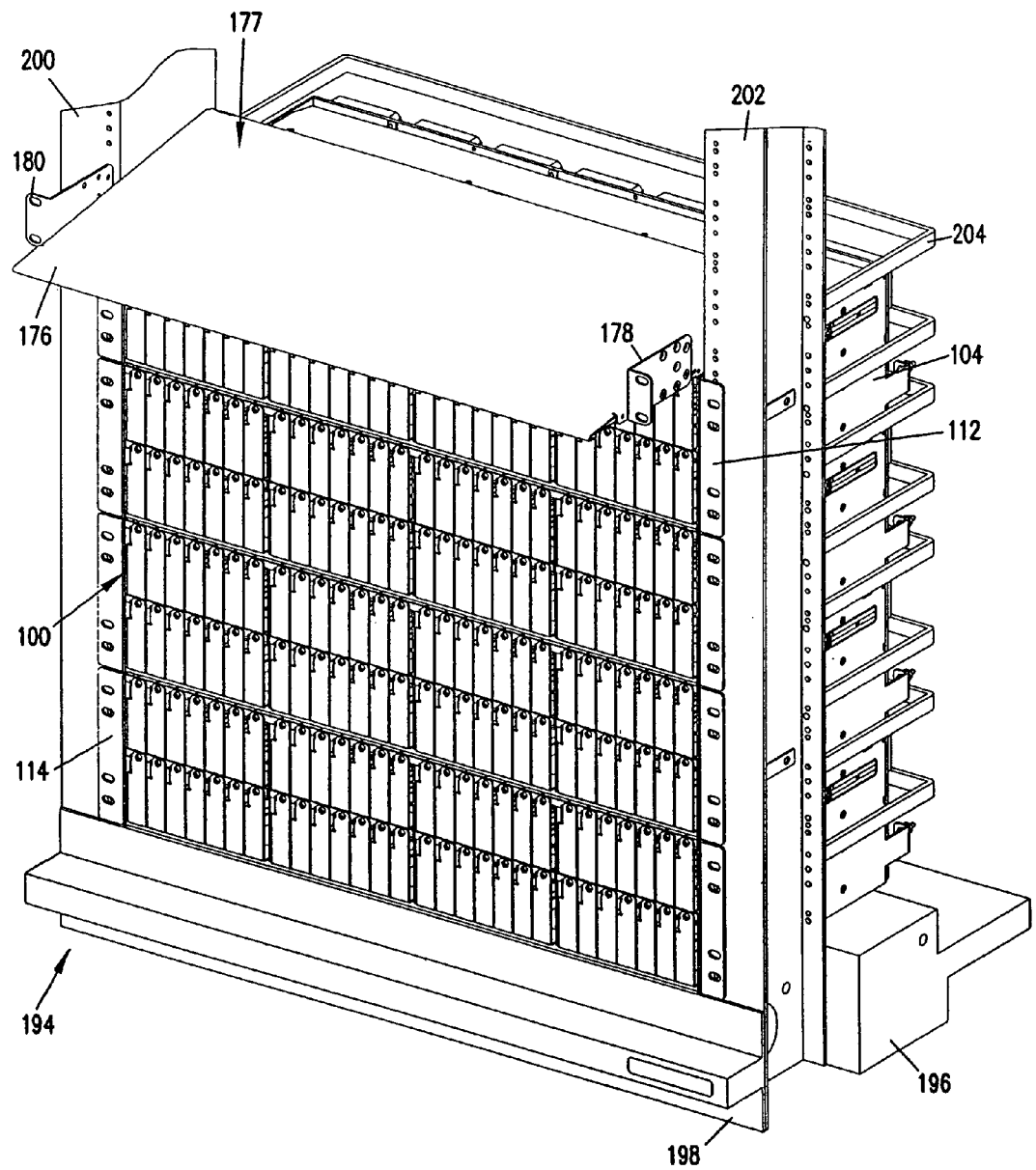
FIG. 24A is top front perspective view of a rack holding multiple chassis and the heat baffle positioned for installation.
Figure 24B:
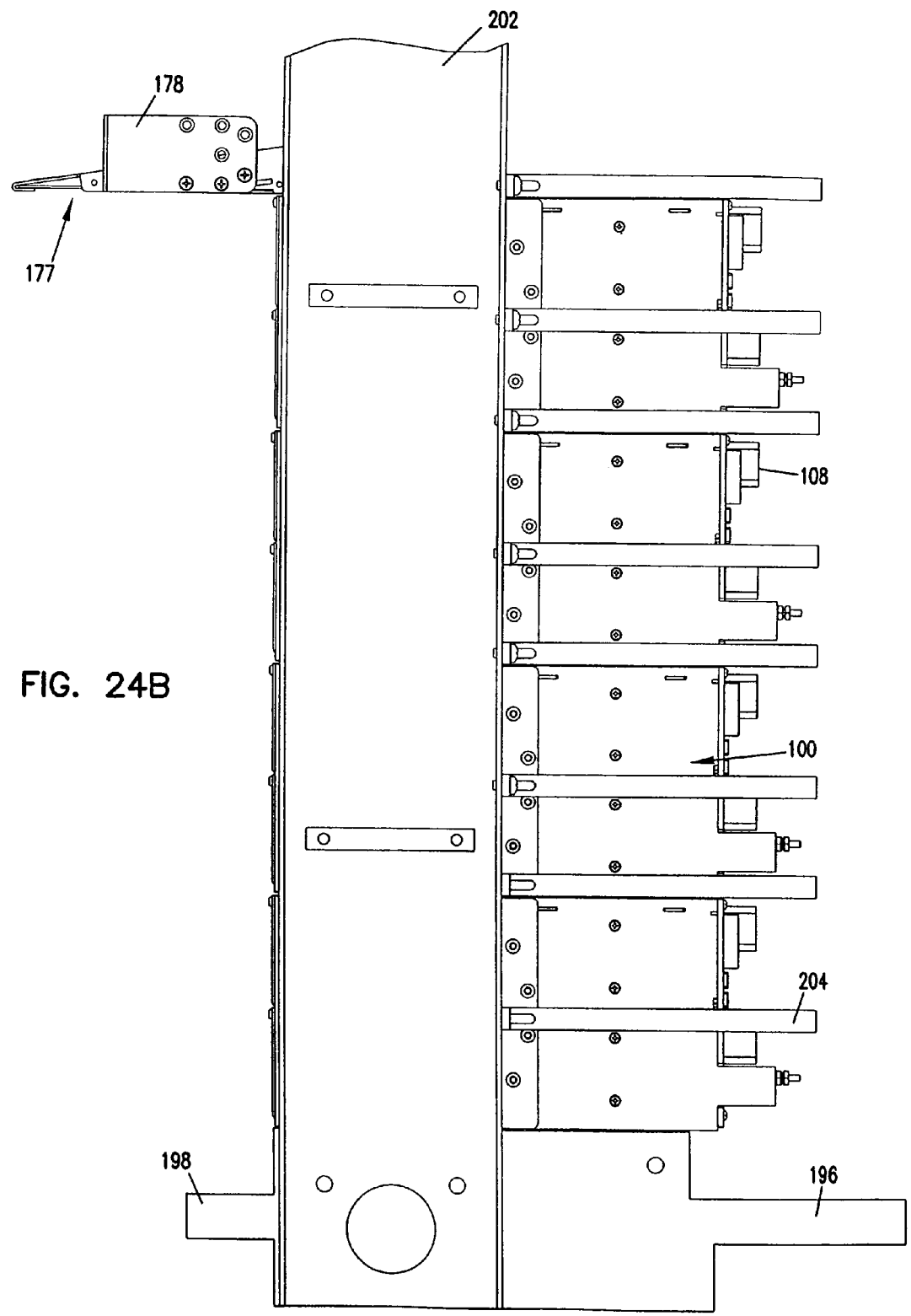
FIG. 24B is right side view of a rack holding multiple chassis and the heat baffle positioned for installation.

FIGS. 23A and 23B show a front and right side view, respectively, of the rack 194 holding several chassis 100 with the heat baffle 177 installed. As shown, the heat baffle 177 is oriented with the face 192 directed to the rear of the rack 194. The front edge of the heat baffle 177 is flush with the front edge of the chassis 100, and the rear edge of the heat baffle. 177 slightly overhangs the rear edge of the chassis 100 to prevent heat and/or flames from curling down directly into the backplane FIGS. 24A and 24B show a top front perspective view and a right side view, respectively, of the rack 194 with the baffle 177 positioned for installation. The baffle 177 slides into the rack 194 above the top-most chassis 100 and rests on the top cover 102 of the top-most chassis 100. The flanges 178, 180 (shown unattached) are attached to the baffle 177 at the front edge so that when the baffle 177 is inserted into the rack, the front edge of the baffle 177 is flush with the front edge of the chassis 100 when the flanges 178, 180 contact the siderails 200, 202, as can be seen in FIG. 22.

Figure 25A:
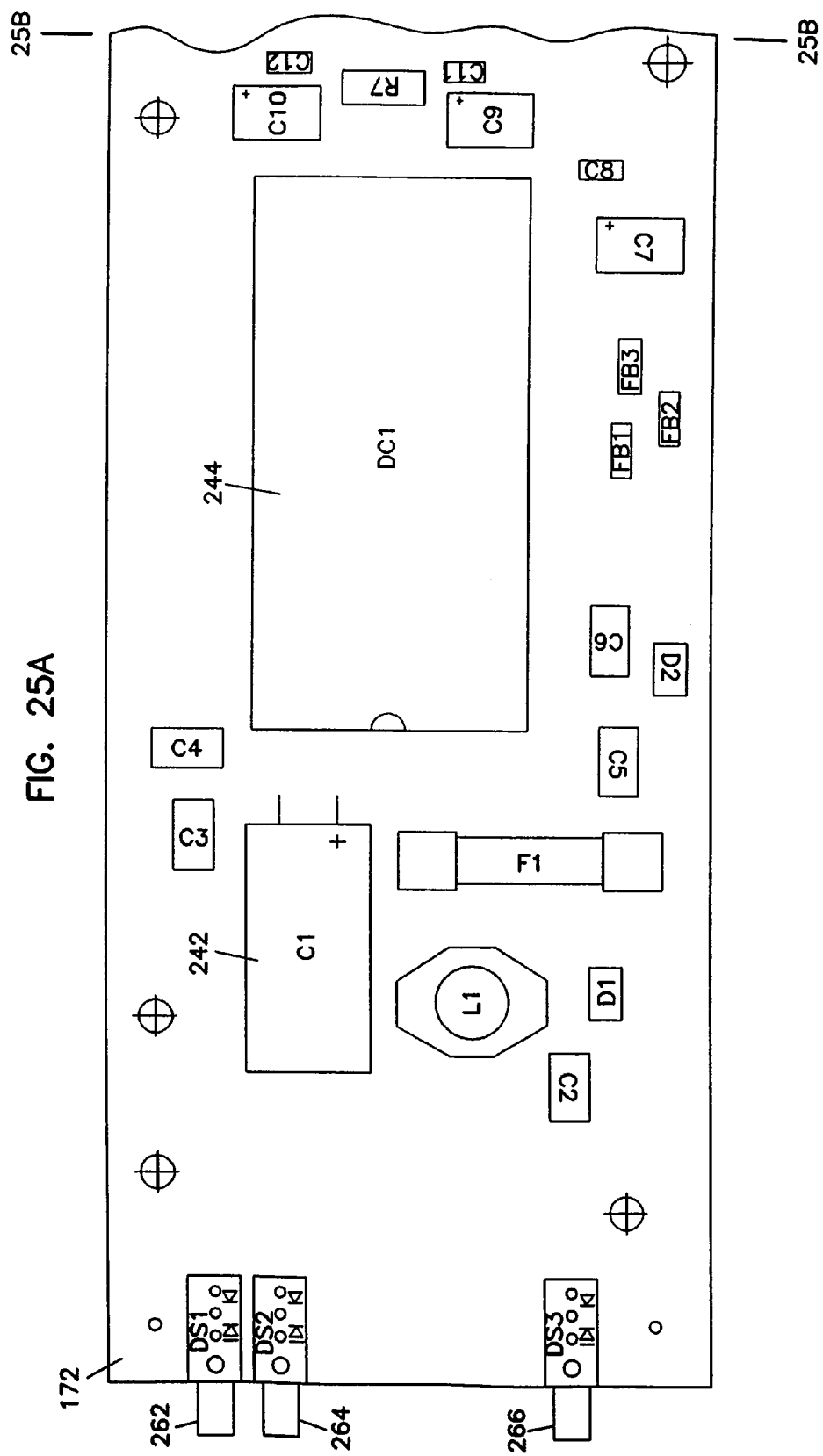
FIG. 25 is a side view of the circuit board of the circuit card showing the relative position of the components of a repeater circuit.
Figure 25B:
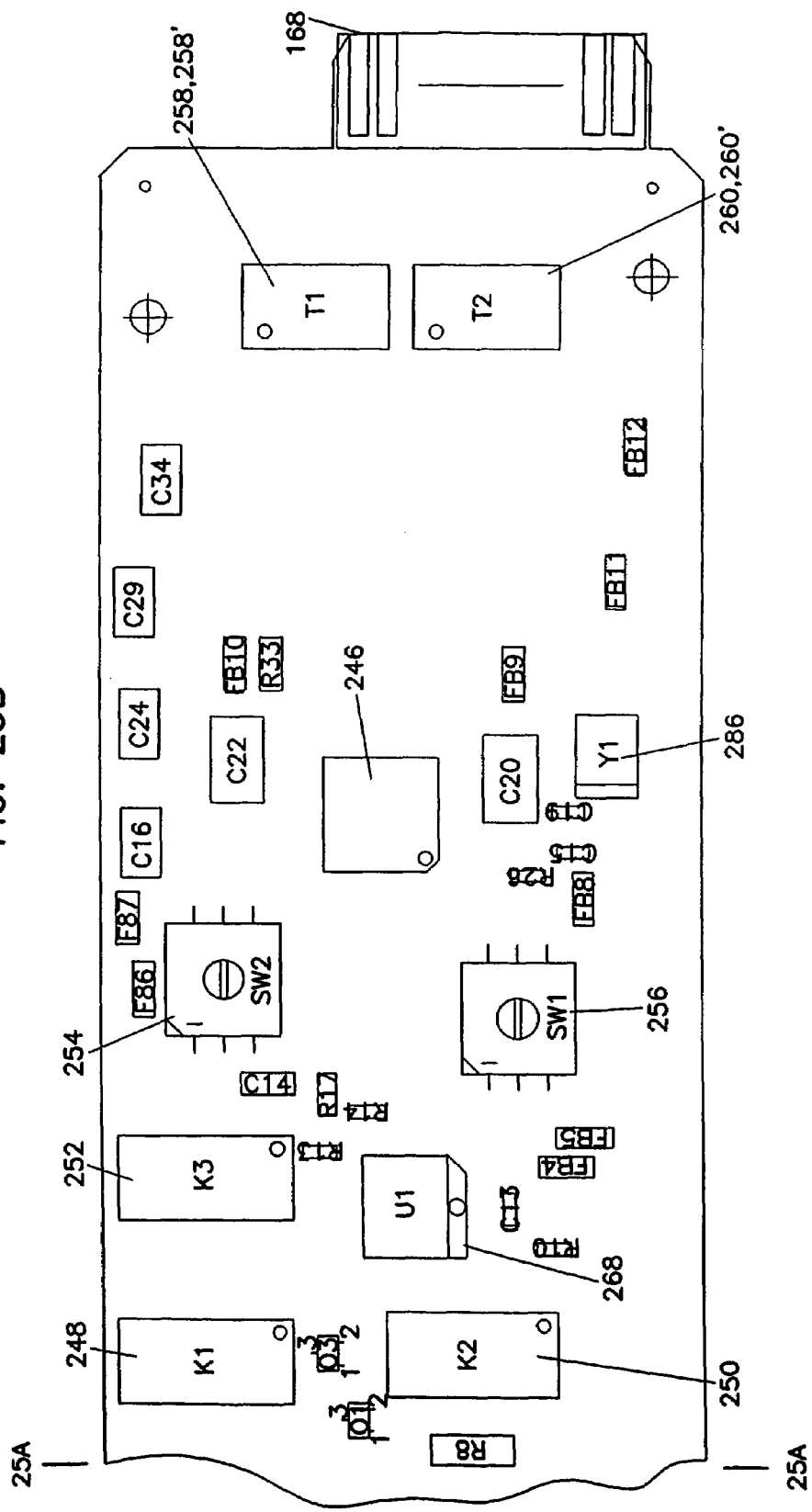
Figure 26A:
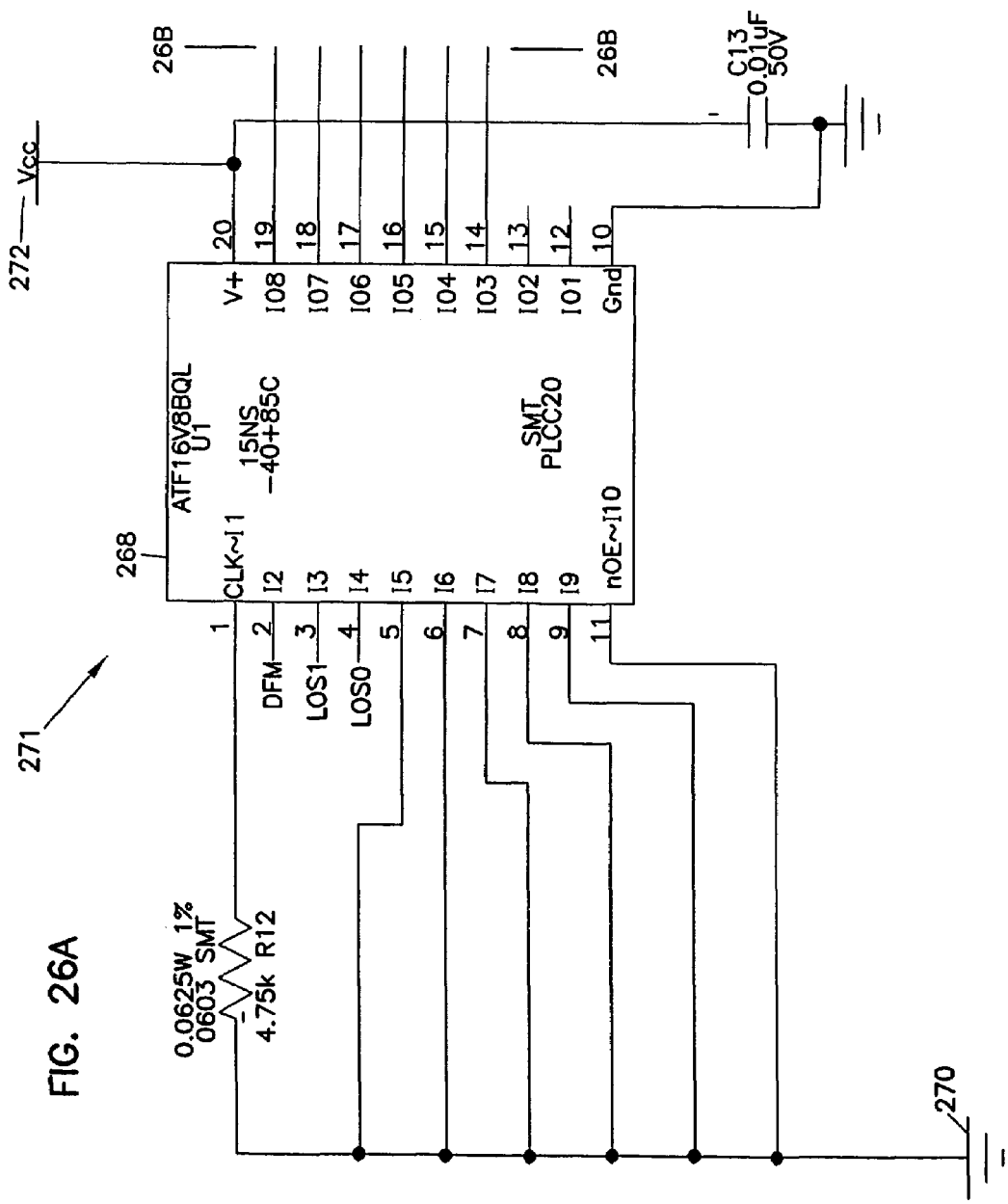
FIG. 26 is a schematic of alarm circuitry of the repeater circuit.
Figure 26B:
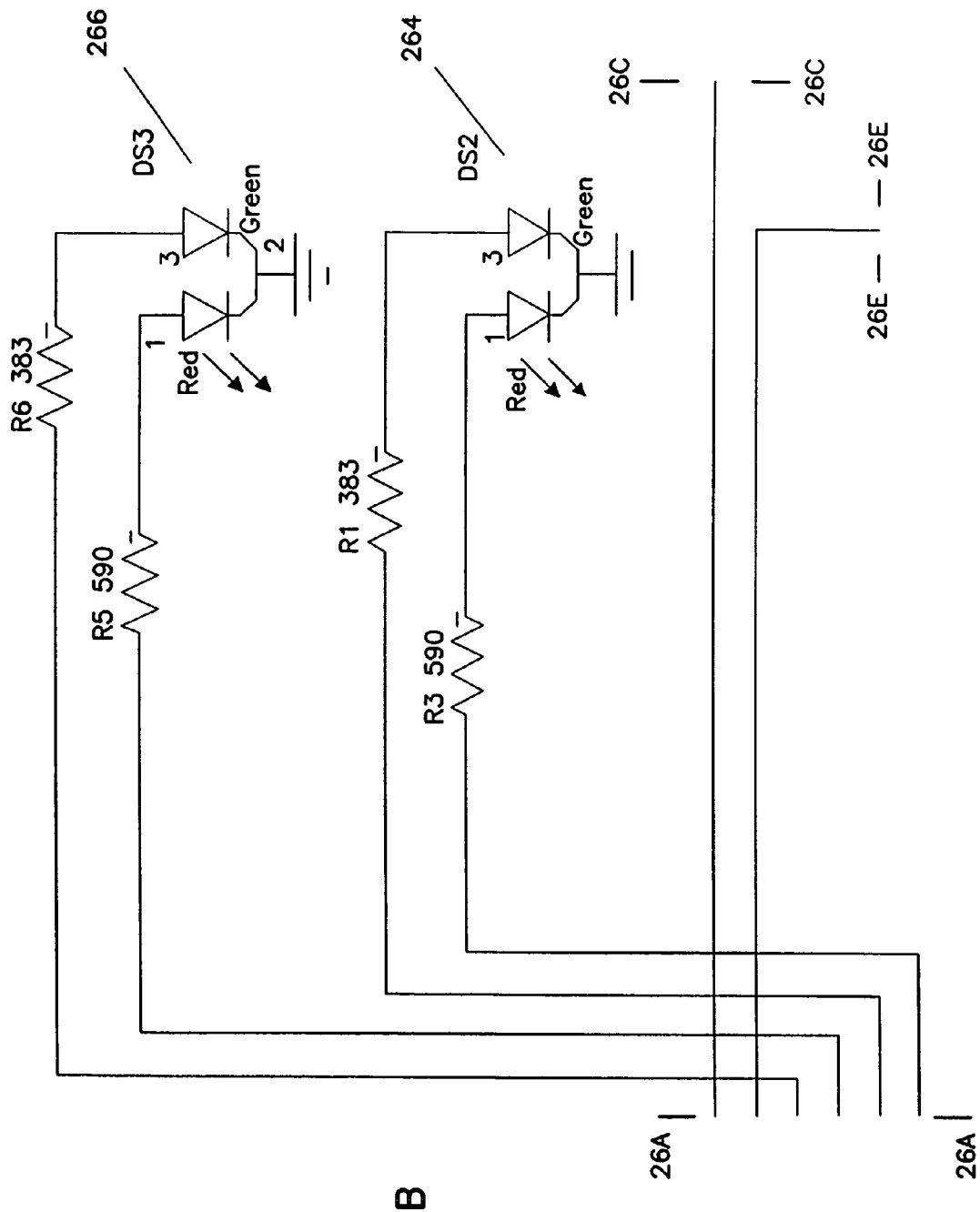
Figure 26C:
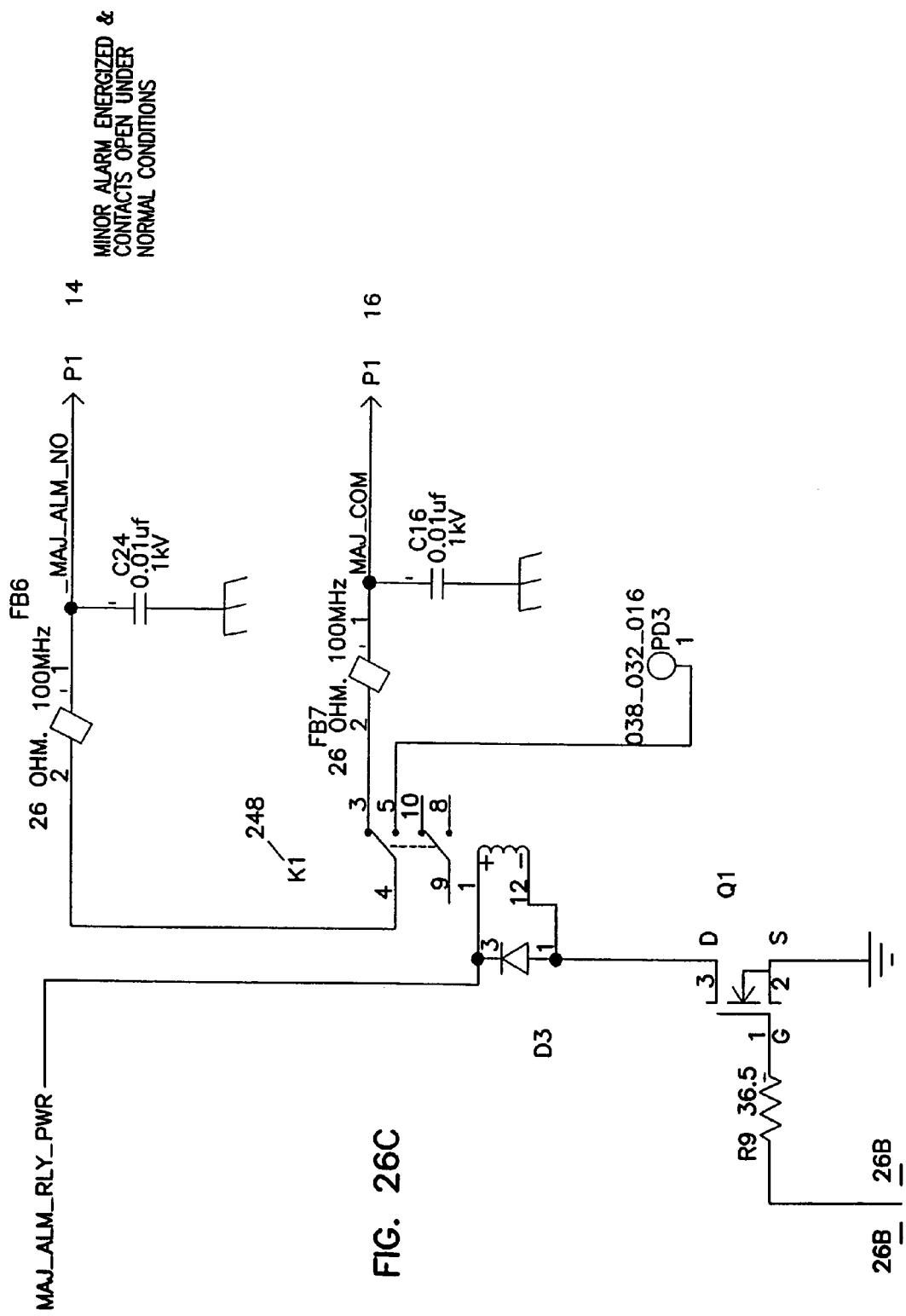
Figure 26D:
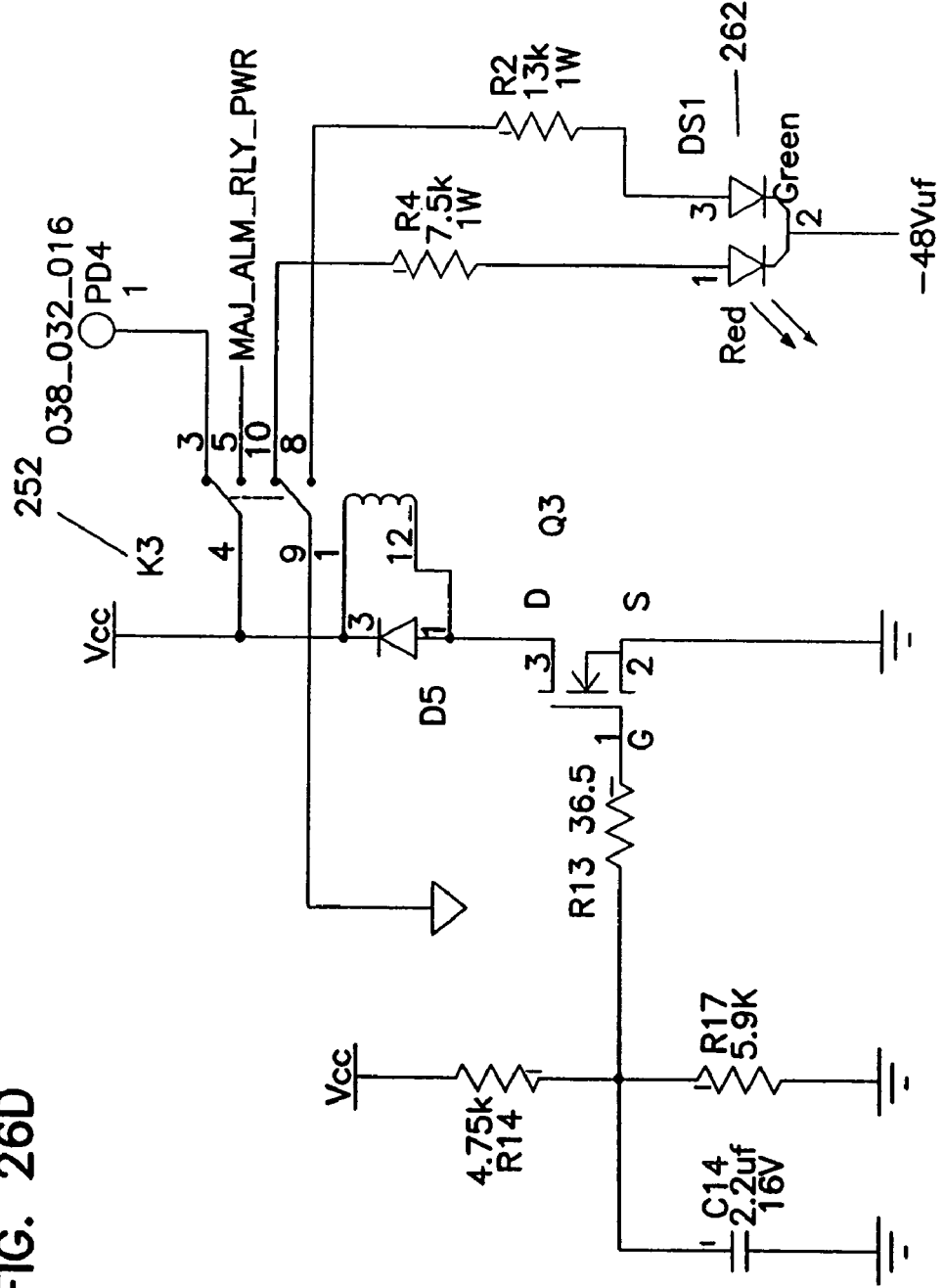
Figure 26E:
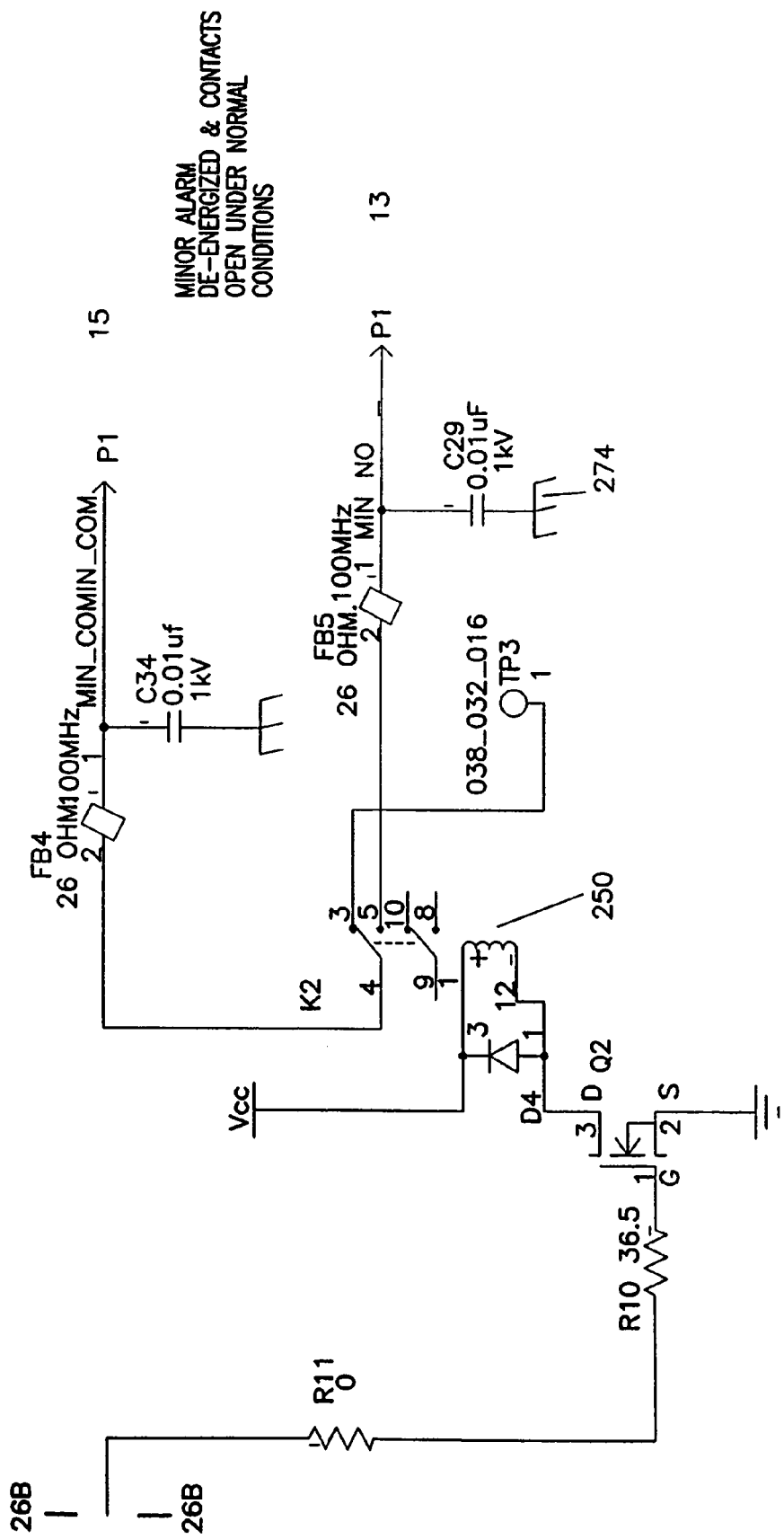
Figure 27A:
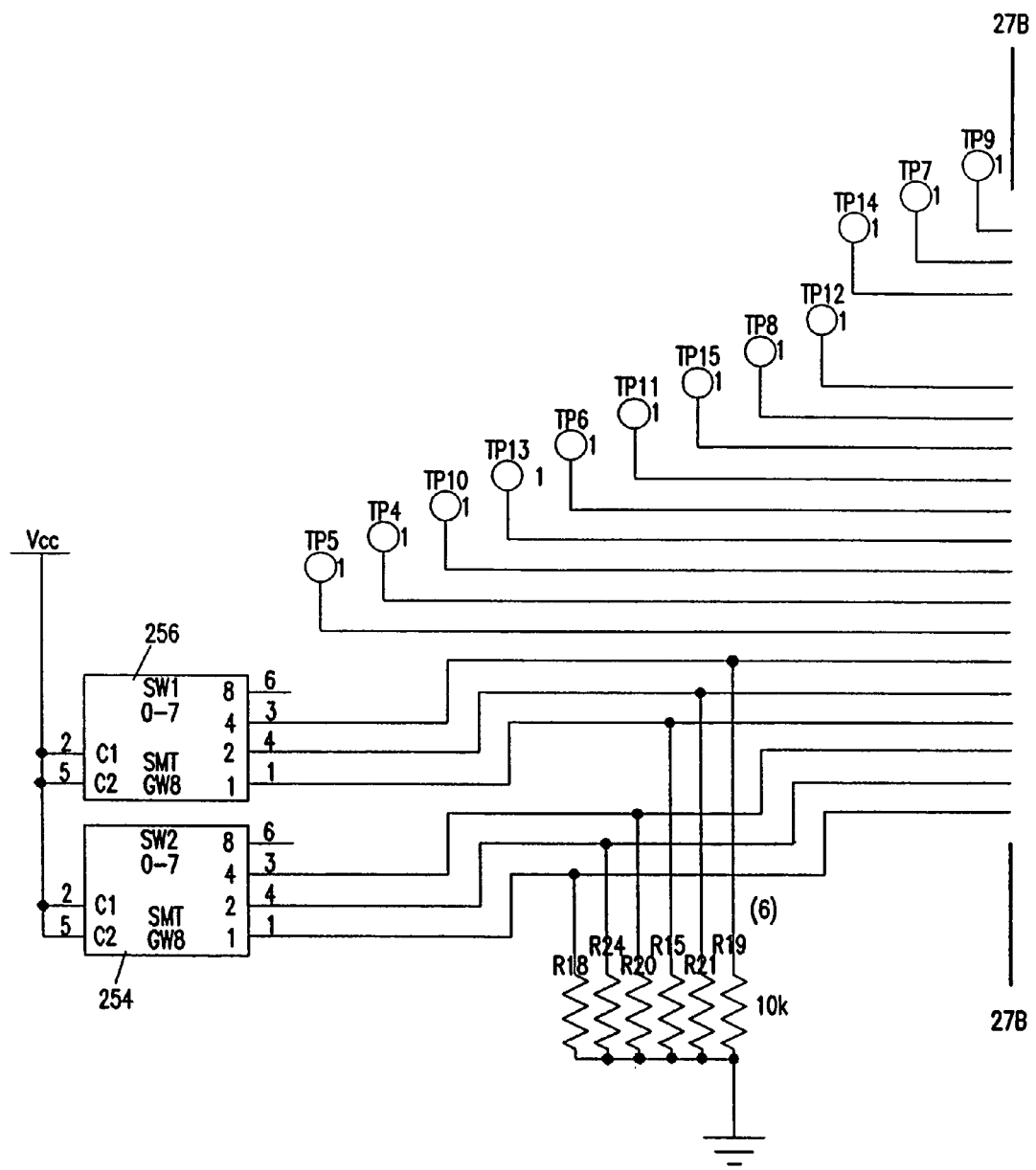
FIG. 27 is a schematic of transceiver configuration circuitry of the repeater circuit.
Figure 27B:
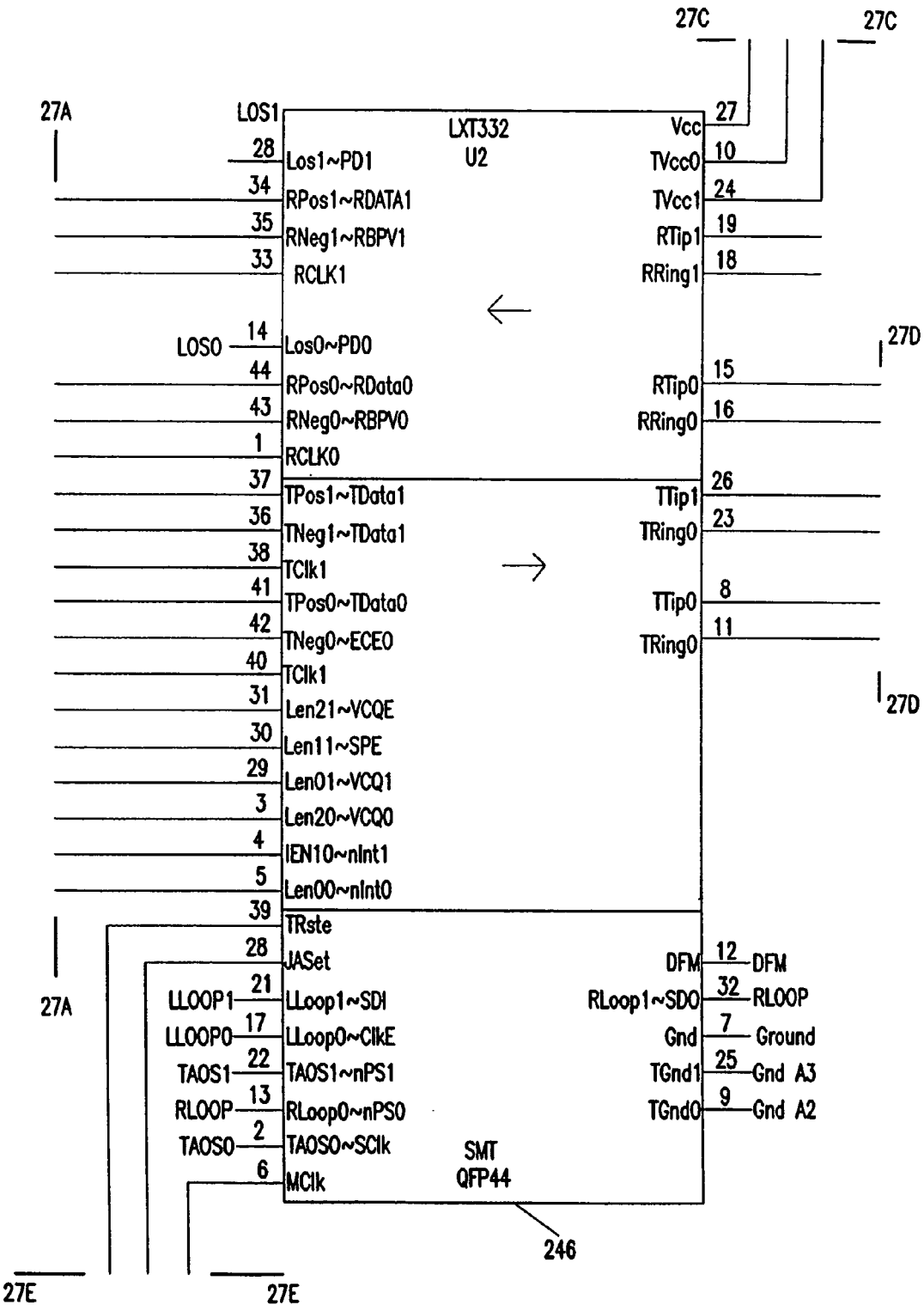
Figure 27C:
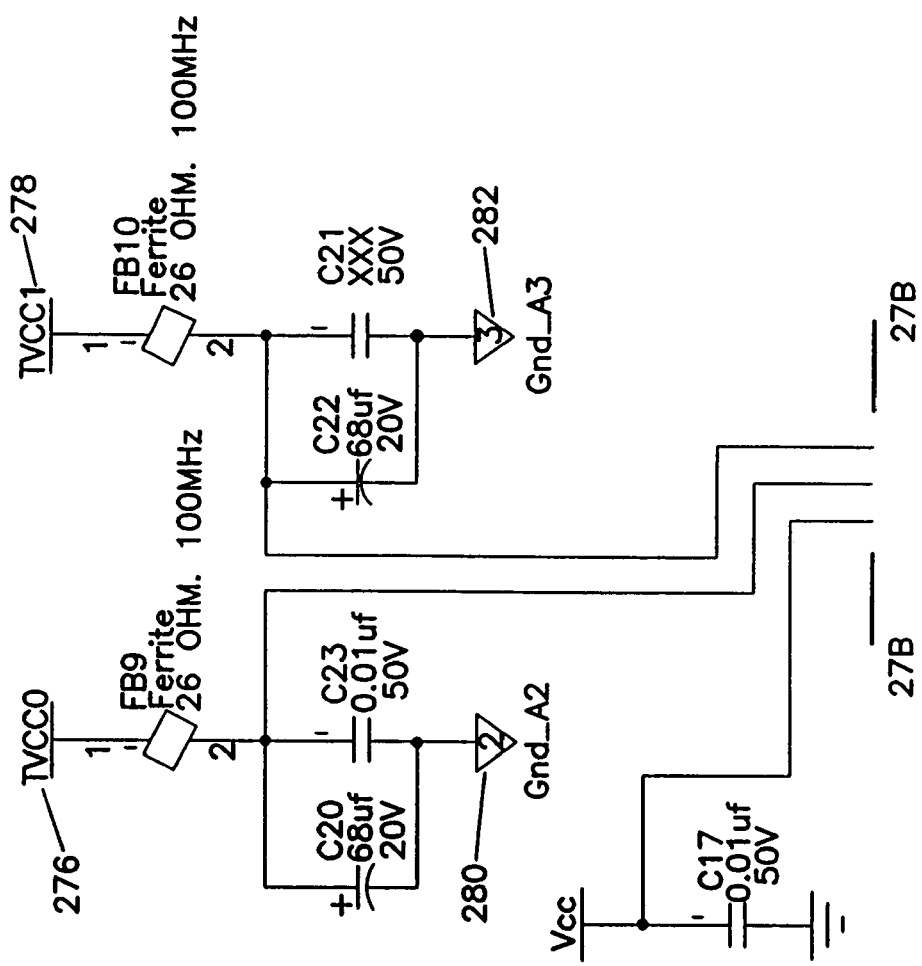
Figure 27D:
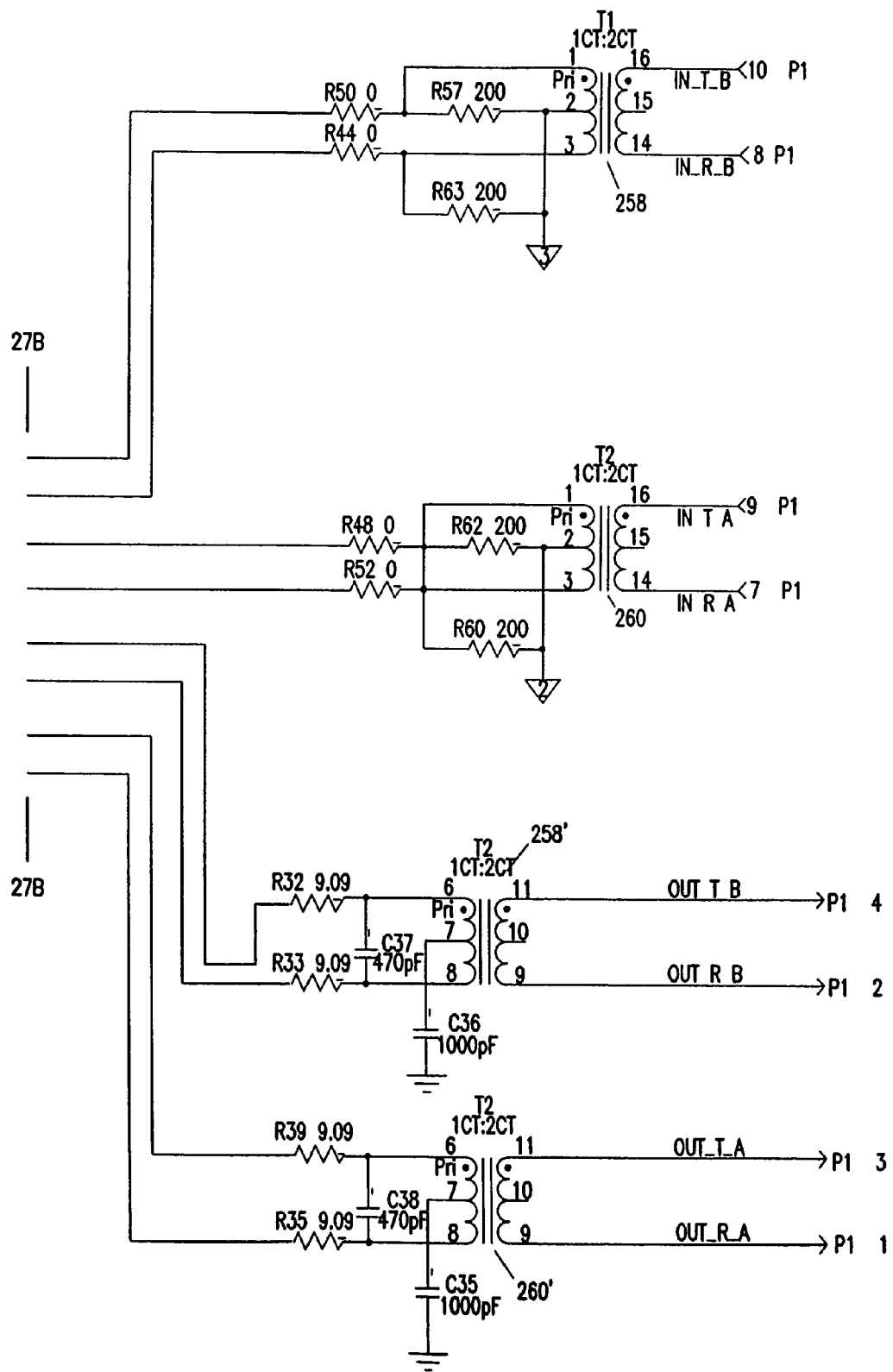
Figure 27E:
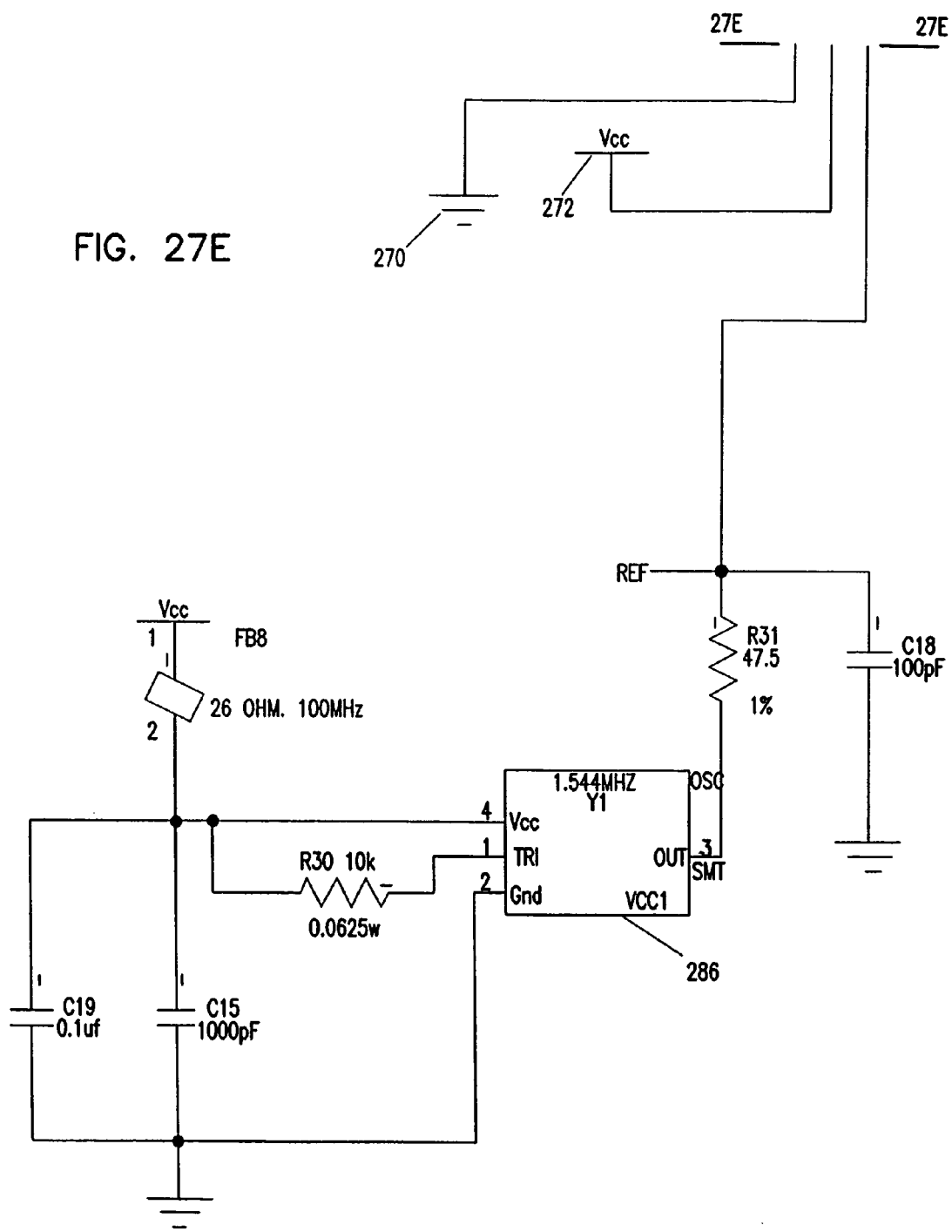

FIG. 25 shows a side view of a repeater circuit board 172 of a card 110 suitable for installation in the chassis 100. The repeater circuit board 172 has several components positioned on the board 172 in relation to the solid areas, rows of slots, and mesh strips of the horizontal surfaces of the chassis 100. The repeater circuit board 172 includes power supply capacitor 242, DC-DC converter 244, and transceiver 246 previously discussed. The board 172 has LEDs 262, 264, and 266 that provide external visual indications of the repeater circuit's operation. Other components of the board 172 include but are not limited to relays 248, 250, and 252, a programmable logic device (PLD) 268, multi-position switches 254 and 256, an oscillator 286, and isolation transformers 258, 258', 260, and 260'. These components and their functions are discussed in more detail below.

The capacitor 242 is positioned such that solid areas of the chassis 100 are above and below to prevent ventilating the capacitor 242. The solid areas direct air toward the rear of the board 172 past the DC-DC converter 244 and transceiver 246 with some air passing up through the first row and second rows of slots and the remainder passing up through the less restricted third row of slots. The DC-DC converter 244 may be a model that is highly flame resistant to further enhance the flame containment of the chassis 100. An epoxy encased DC-DC converter 244 such as the Ericsson PFK 4611SI is suitable. A monitor jack, which might ordinarily be placed between the LEDs 264 and 266, is absent in the embodiment shown to reduce the material on the board 172 that is susceptible to burning.

FIG. 26 shows the alarm circuitry 271 of the repeater circuit board 172. The alarm circuitry 271 controls the LEDs 262, 264, and 266. During normal operation, the LEDs 262, 264, and 266 are one color, such as green, to indicate normal operation. The power LED 262 turns red if the logic power plane 272 loses voltage from the output of the DC-DC converter 244. This occurs due to relay 252 changing state in response to the loss of logic power thereby causing voltage received directly from the backplane connector 168 to activate the red diode of LED 262 instead of the green diode.

The channel A LED 264 and channel B LED 266 are electrically connected to the PLD 268 and to a logic ground plane 270. The PLD 268 receives power from the logic power plane 272 and receives control signals from the transceiver 246. When a channel is operating normally, the PLD 268 causes the green diode of the LED to illuminate.

If the transceiver 246 detects that channel A has no signal, then LOS0 line passing from the transceiver 246 to the PLD 268 is triggered causing the PLD 268 to light the red diode along with the green diode of LED 264 to create a yellow illumination. If the transceiver 246 detects that channel B has no signal, then LOS1 line passing from the transceiver 246 to the PLD 268 is triggered causing the PLD 268 to light the red diode along with the green diode of LED 266 to create a yellow illumination. If either channel has a loss of signal, then a minor alarm signal is generated and provided through the backplane connector 168 by relay 250 changing state due to a control signal from the PLD 268. The minor alarm line is electrically linked to a chassis ground plane 274.

If the transceiver 246 detects that it has failed, then the DFM line passing from the transceiver 246 to the PLD 268 is triggered causing the PLD 268 to light the red diode and turn off the green diode of LEDs 264 and 266 to create a red illumination. A major alarm signal is also generated and provided through the backplane connector 168 by relay 248 changing state due to a control signal from the PLD 268. The major alarm line is electrically linked to the chassis ground plane 274 as well with coupling capacitors.

The PLD 268 and relays 248, 250, and 252 may be selected so as to minimize power consumption and reduce the amount of heat being generated by each circuit board 172 in the chassis 100. The Atmel model ATF16V8BQL PLD draws only 100 milliwatts when active and is a suitable PLD for controlling the relays 248 and 250 and LEDs 264 and 266. The NAIS TX-S relay draws only 50 milliwatts when active and is a suitable relay for controlling the LED 262 and the major and minor alarm signals.

FIG. 27 shows the transceiver circuitry located on the board 172. The transceiver 246, such as the Level One model LXT332, is electrically connected to the logic power plane 272 and the logic ground plane 270. The transceiver is also electrically linked to a channel A power plane 276, a channel A ground plane 280, a channel B power plane 278, and a channel B ground plane 282. Each channel has its own power and ground plane to avoid cross-talk and to avoid electrical noise from the power supply circuit of FIG. 28 and chassis 100.

The transceiver 246 is electrically linked to an oscillator 286 that is electrically connected to the logic power plane 272 and logic ground plane 270. The oscillator 286 provides a reference frequency signal to the transceiver 246. The transceiver 246 is also electrically connected to two multi-position switches 254 and 256. Each multi-position switch controls the line build-out function of the transceiver 246 for one of the channels.

The multi-position switch 254, 256 may be user adjusted to provide a connection between the logic power plane 272 and various pins of the transceiver 246. The transceiver 246 then determines the signal level and signal shape for the output signal of a channel based on which pins receive the logic power plane voltage. The signal level and signal shape varies depending upon the length of cable used to carry the output signal. The longer the cable, the stronger the output signal and the more its shape is altered from the shape desired at the other end of the output signal cable. For example, if a square wave is desired at the other end, then as cable length increases the output signal must have more overshoot and a greater amplitude due to the cable's impedance attenuating and rounding-off the signal.

The transceiver 246 receives its input signals for each channel from the backplane connector 168 through an isolation transformer. Channel A input signal passes through isolation transformer 260, and channel A output signal passes through isolation transformer 260'. Channel B input signal passes through isolation transformer 258, and channel B output signal passes through isolation transformer 258'. As shown in FIG. 25, the input isolation transformer 260 and output isolation transformer 260' of channel A are contained in one unit. Similarly, the input isolation transformer 258 and output isolation transformer 258' of channel B are contained in another unit.

Figure 28A:
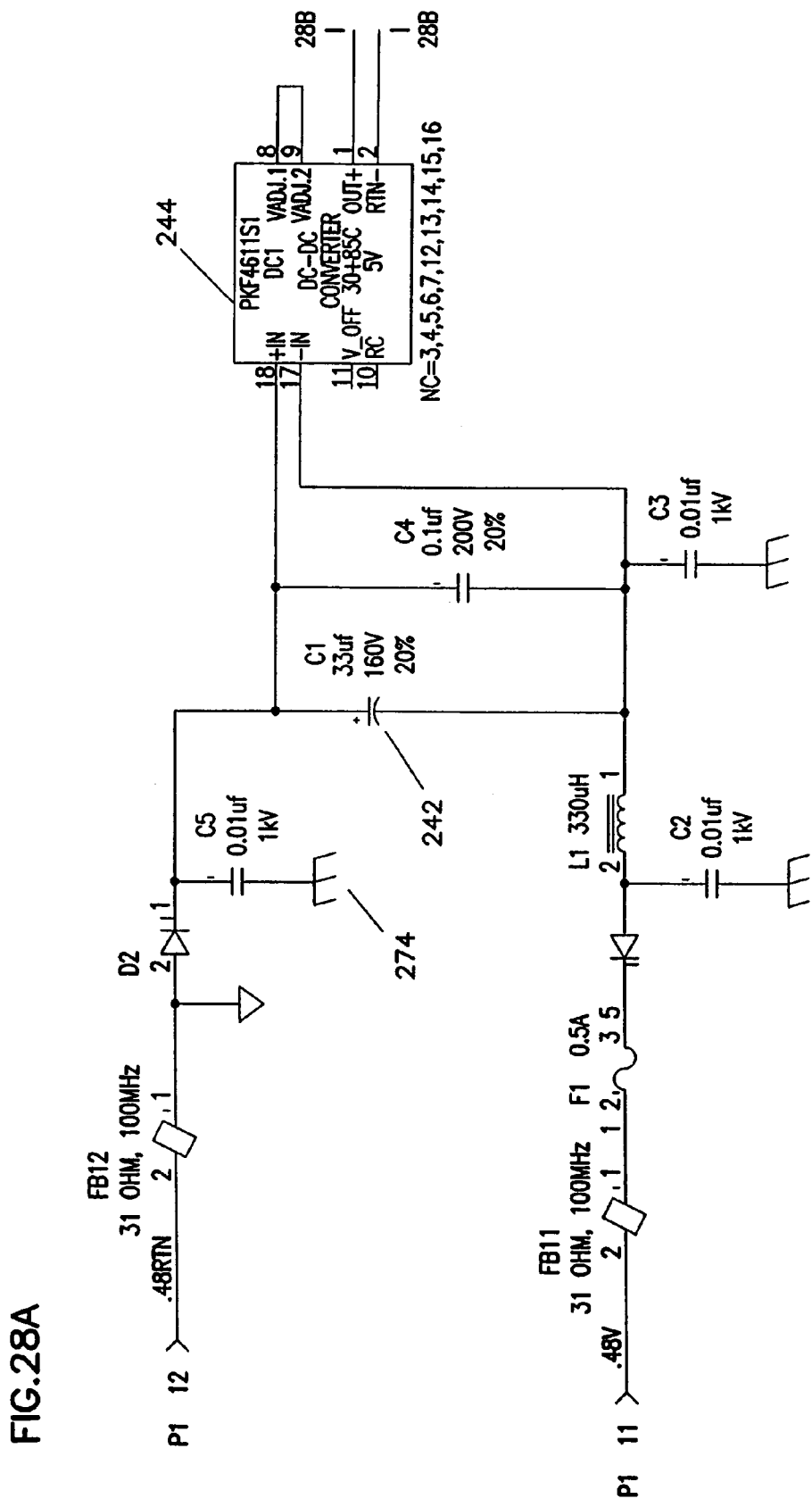
FIG. 28 is a schematic of power supply circuitry of the repeater circuit.
Figure 28B:
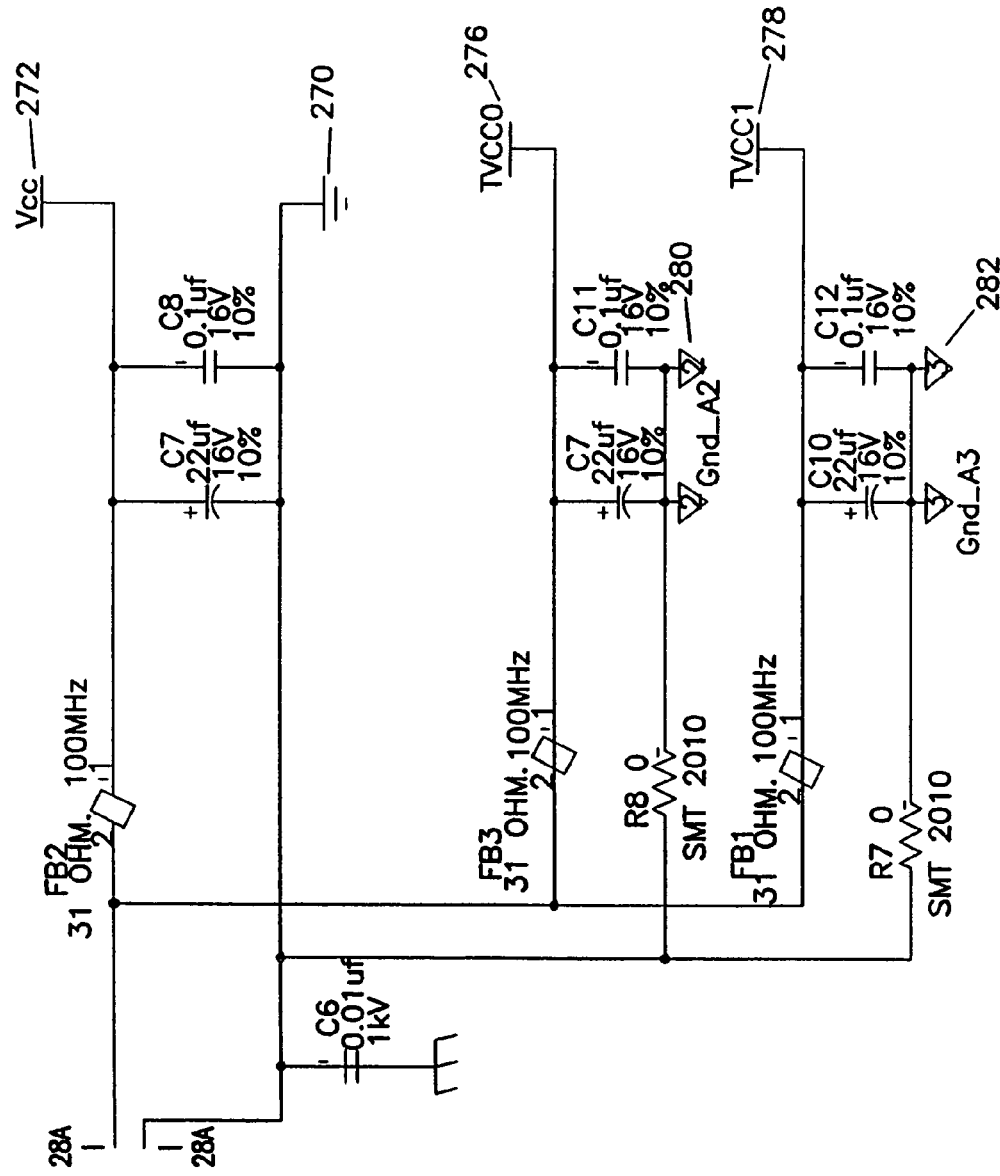

FIG. 28 shows the power supply circuitry. The backplane connector 168 receives −48V DC power and provides it through the board 172 to the DC-DC converter 244. The −48V line and the −48 V return line are linked by the capacitor 242 to eliminate ripple. These lines are also coupled to the chassis ground plane 274. The DC-DC converter 244 outputs a voltage that is electrically connected to the logic power plane 272, the channel A power plane 276, and the channel B power plane 278. The DC-DC converter 244 has a return that is electrically connected to the logic ground plane 270, the channel A ground plane 280, and the channel B ground plane 282. Ferrite beads are used to isolate each power plane connected to the DC-DC converter 244 and each power plane is AC coupled to each ground plane.

Figure 29:
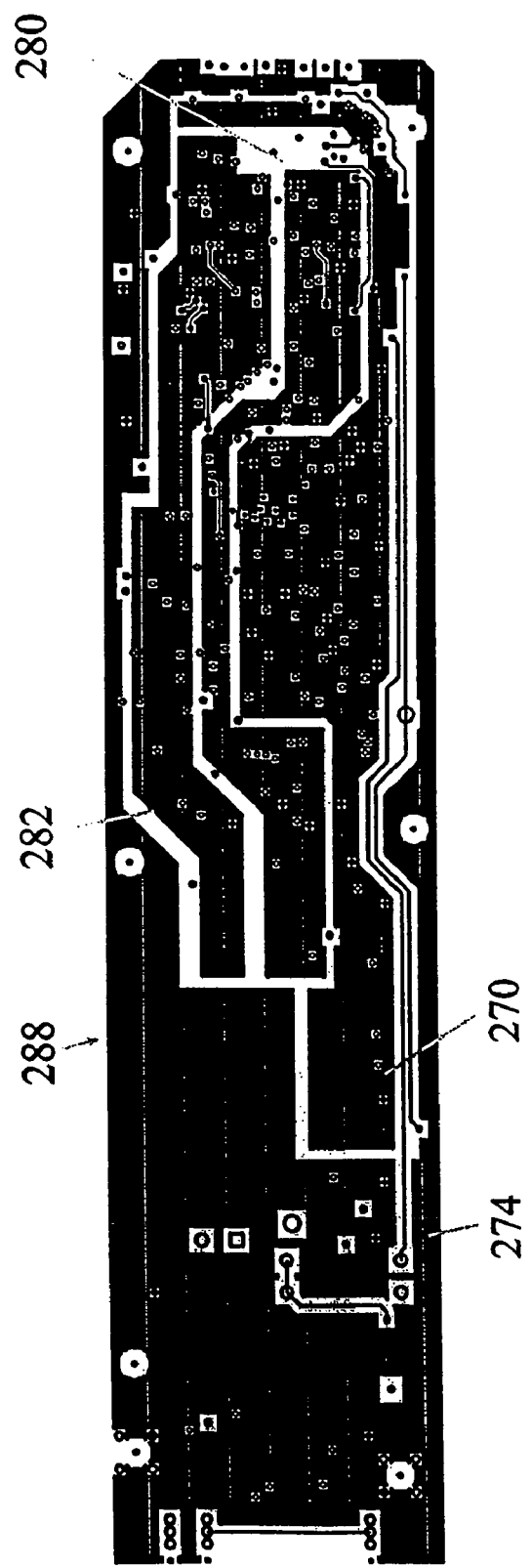
FIG. 29 is a view of a ground conductor layer of the printed circuit board supporting the repeater circuit.

FIG. 29 shows a ground layer of the circuit board 172. The ground layer includes the chassis ground plane 274 that extends around the periphery 288 of the circuit board 172 and is electrically connected to the chassis ground provided through the chassis ground connector 109 of the chassis 100. The chassis ground plane 274 surrounds the logic ground plane 270, the channel A ground plane 280, and the channel B ground plane 282. The chassis ground plane 274, logic ground plane 270, channel A ground plane 280, and channel B ground plane 282 are copper sheets that are isolated from each other within the single ground layer of the printed circuit board 172.

Figure 30:
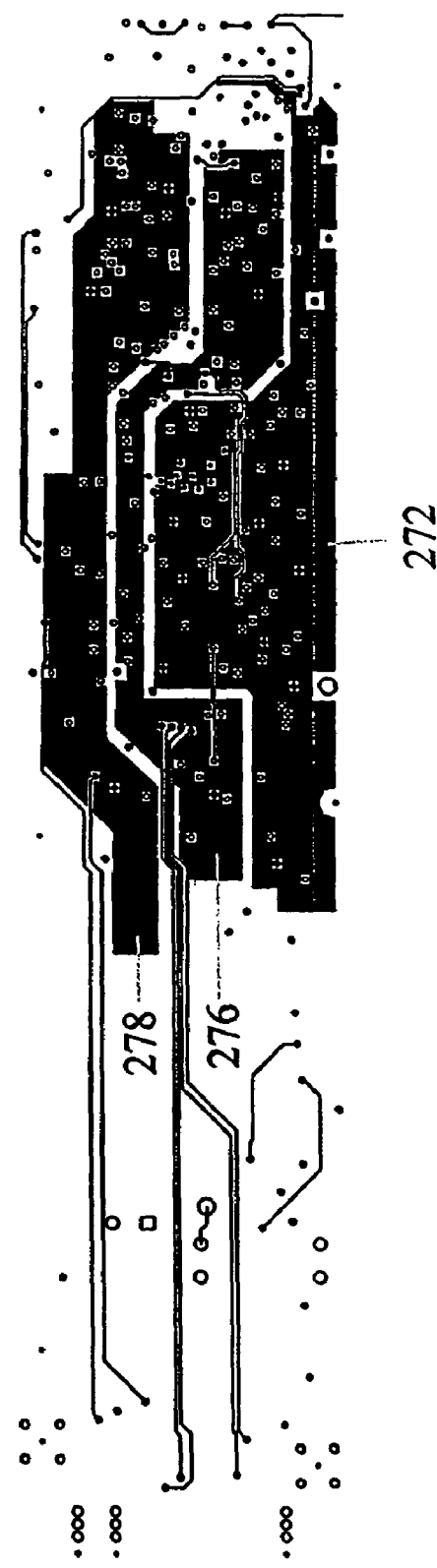
FIG. 30 is a view of a power conductor layer of the printed circuit board supporting the repeater circuit.

FIG. 30 shows a power layer of the circuit board 172 that is adjacent to the ground layer and separated from it by a dielectric layer. The power layer includes the logic power plane 272, the channel A power plane 276, and the channel B power plane 278. The logic power plane 272 substantially overlaps with the logic ground plane 270 of the ground layer. The channel A power plane 276 substantially overlaps with the channel A ground plane 280. Likewise, the channel B power plane 278 substantially overlaps with the channel B ground plane 282. This arrangement minimizes electrical noise and cross-talk.

Figure 31B:
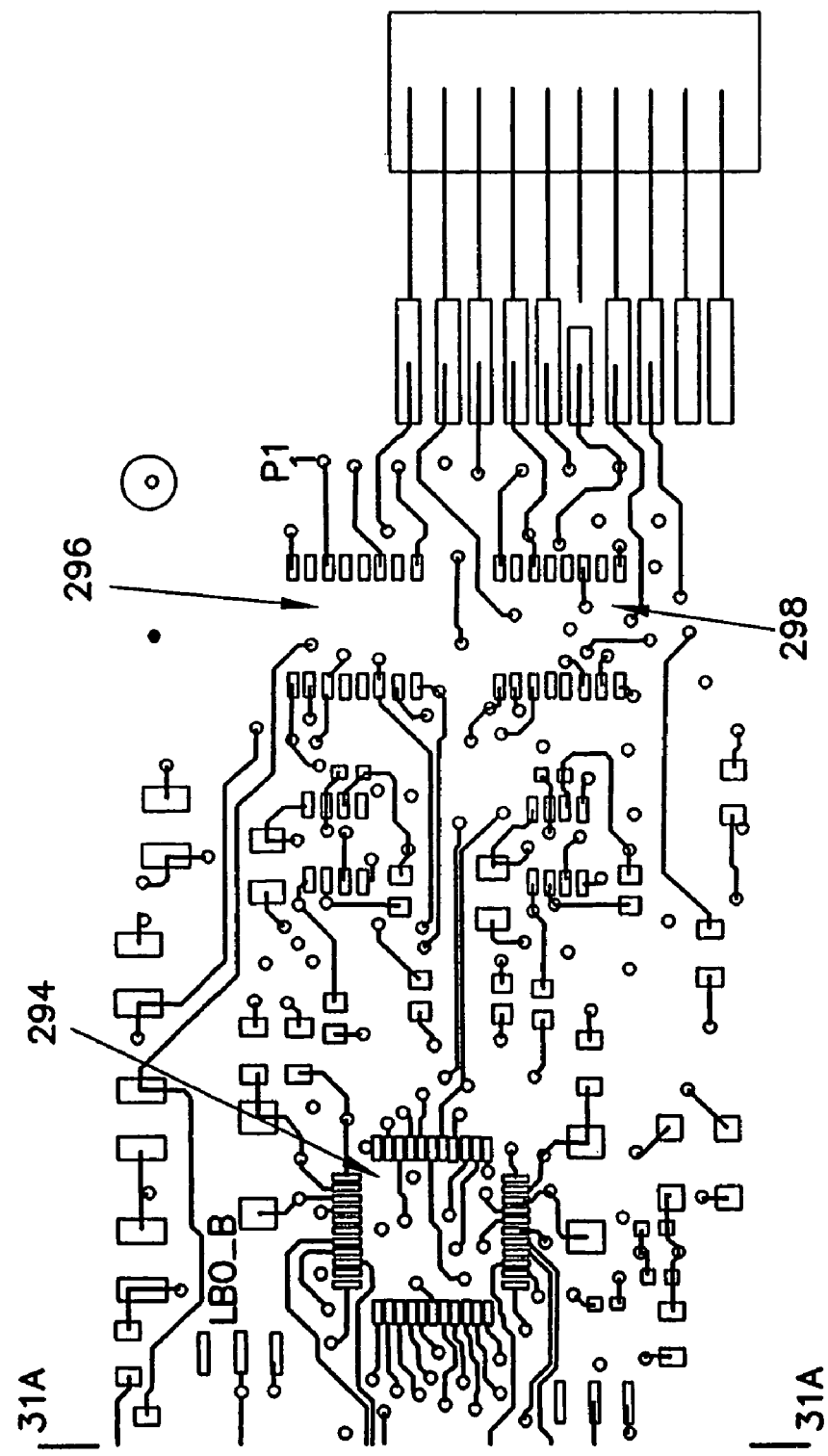
FIG. 31 is a view of a component layer of the printed circuit board supporting the repeater circuit.

FIG. 31 shows a component layer of the circuit board 172. The electrical components previously discussed are typically mounted to the component layer. The transceiver 246 is mounted in transceiver area 294. The isolation transformers 258, 258', 260, and 260' are mounted in transformer areas 296 and 298. It is generally desirable to minimize the distance between the isolation transformer areas 296, 298 and the transceiver area 294. A distance of one and one-third inches or less is suitable.

Also located on the component layer are chassis ground pads 290 and 292. These chassis ground pads 290 and 292 are electrically connected to the chassis ground plane 274. The metal faceplate 174 of the circuit card 110 mounts to holes within the chassis ground pads 290 and 292 and metal-to-metal contact is established between the chassis ground pads 290, 292 and the faceplate 174. This metal-to-metal contact maintains the faceplate 174 at chassis ground.

Figure 32A:
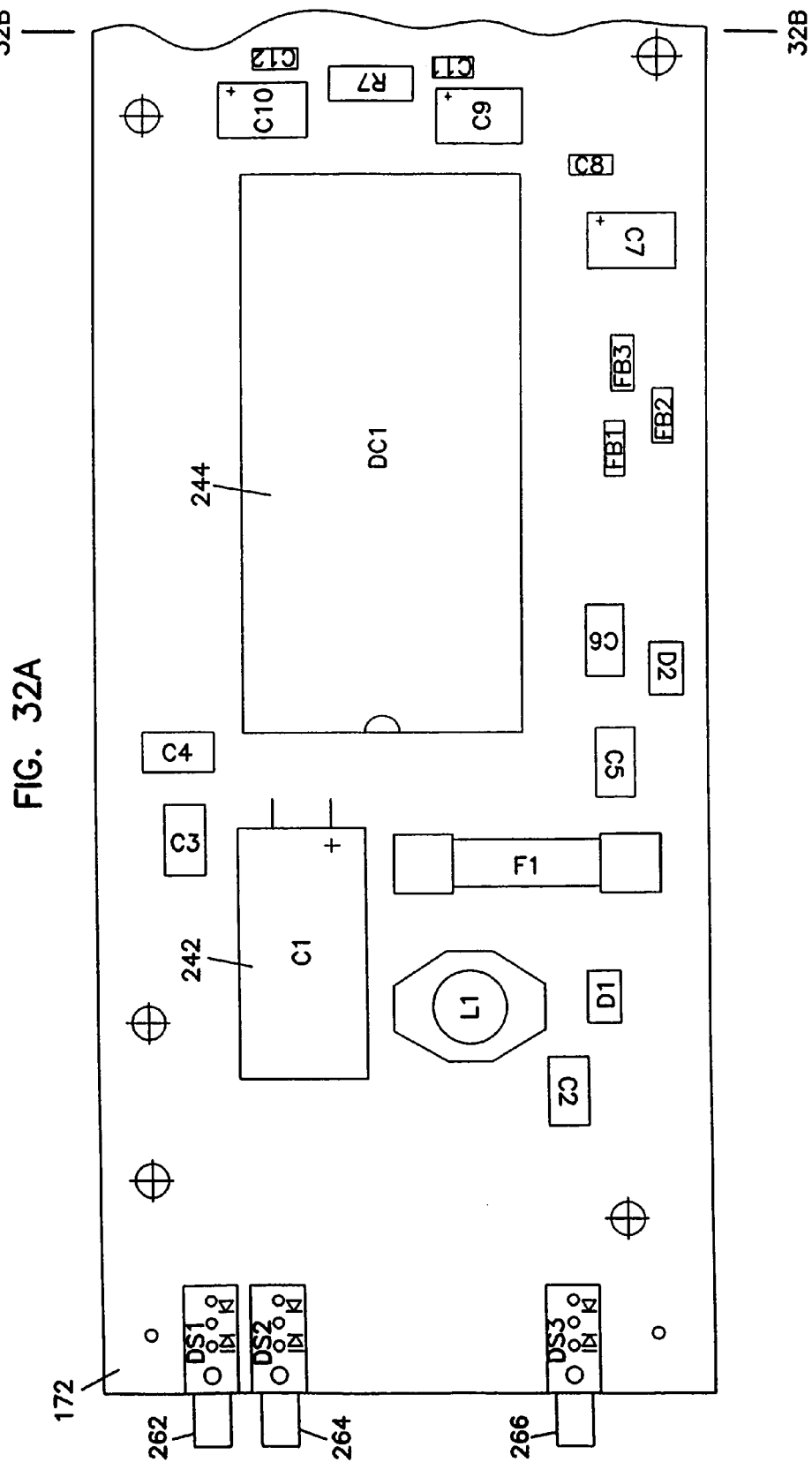
FIG. 32 is a side view of an alternative circuit board of the circuit card showing the relative position of the components of a repeater circuit.
Figure 32B:
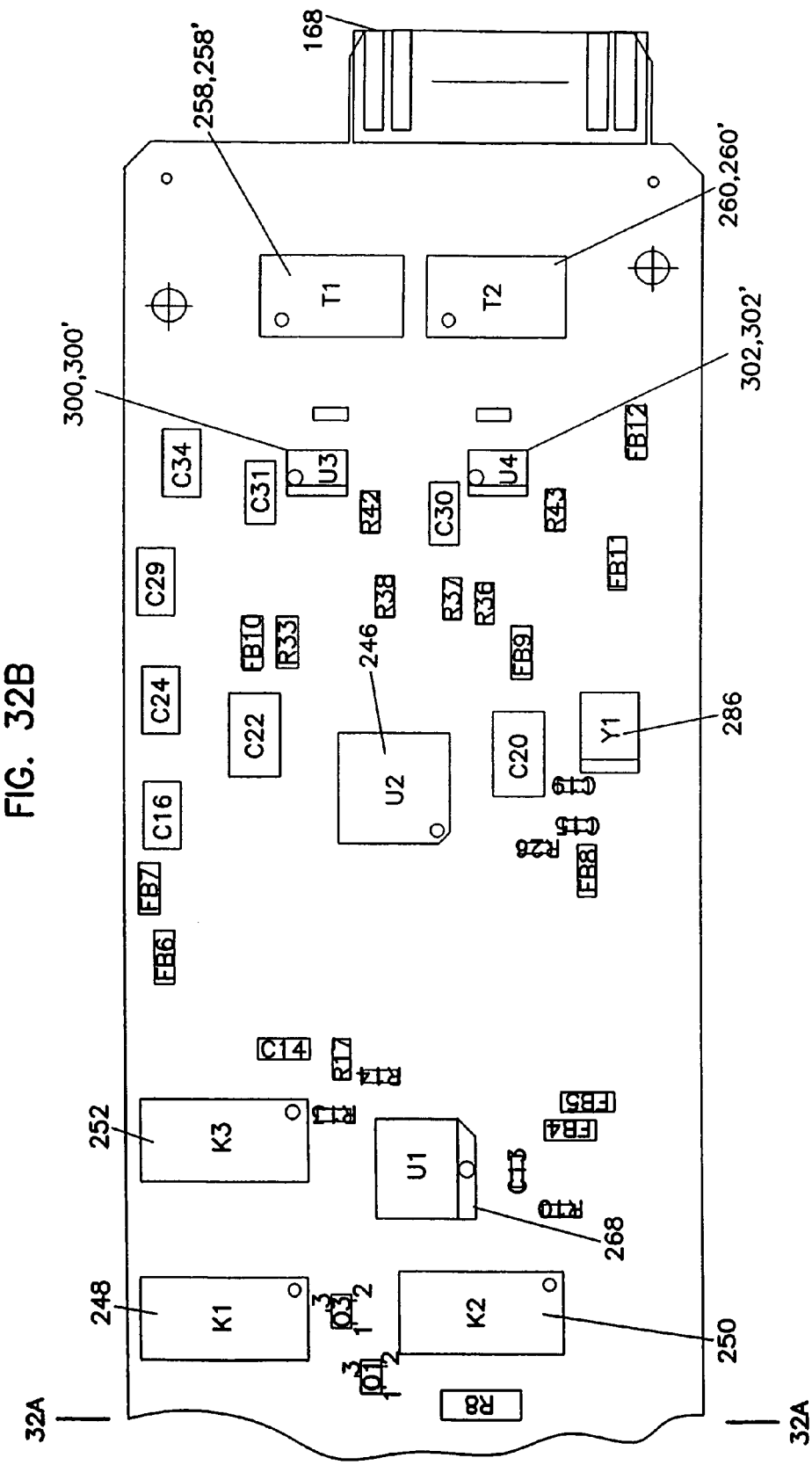
Figure 33A:
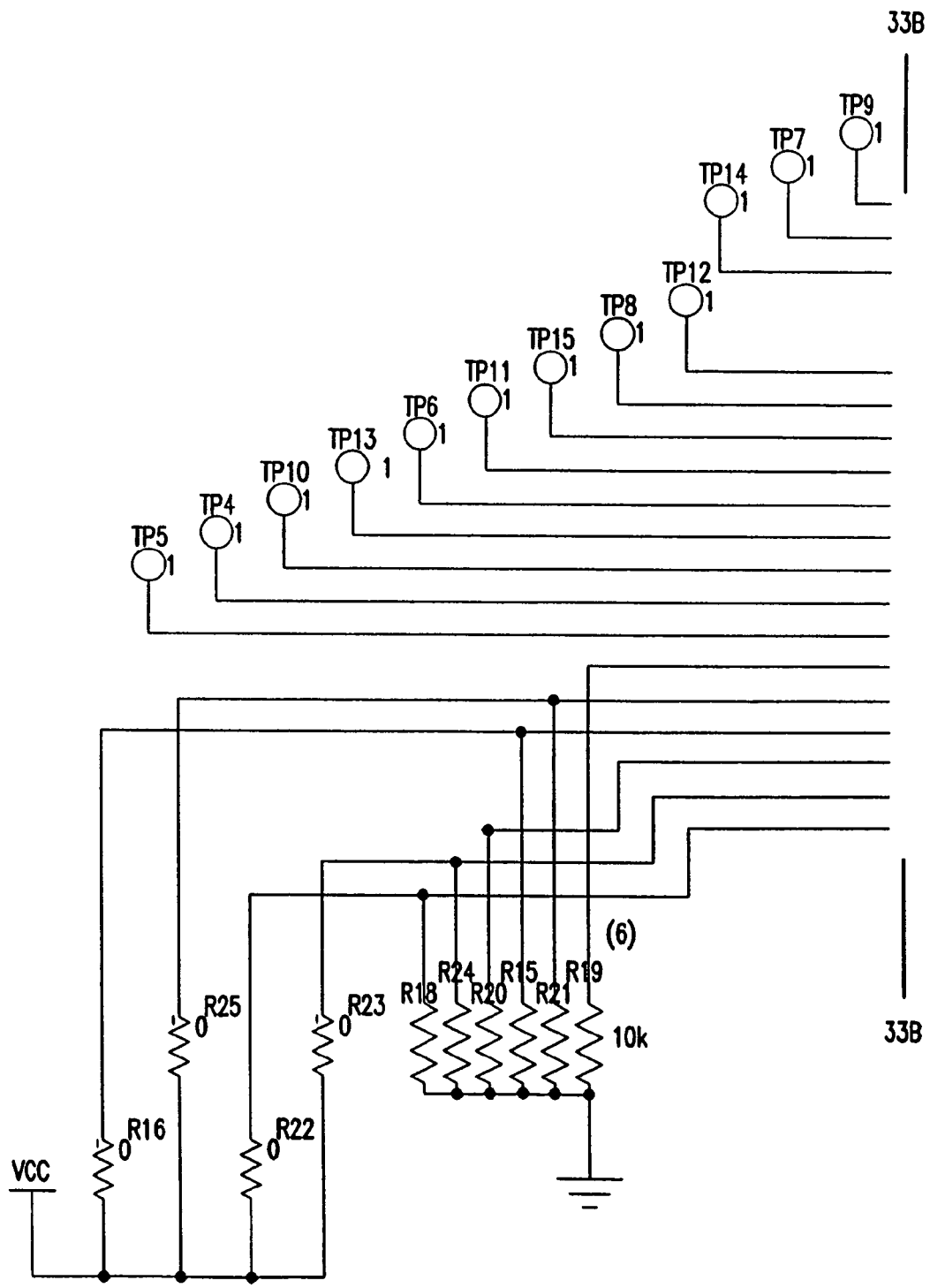
FIG. 33 is a schematic of an alternative transceiver configuration circuitry of the repeater circuit.
Figure 33B:
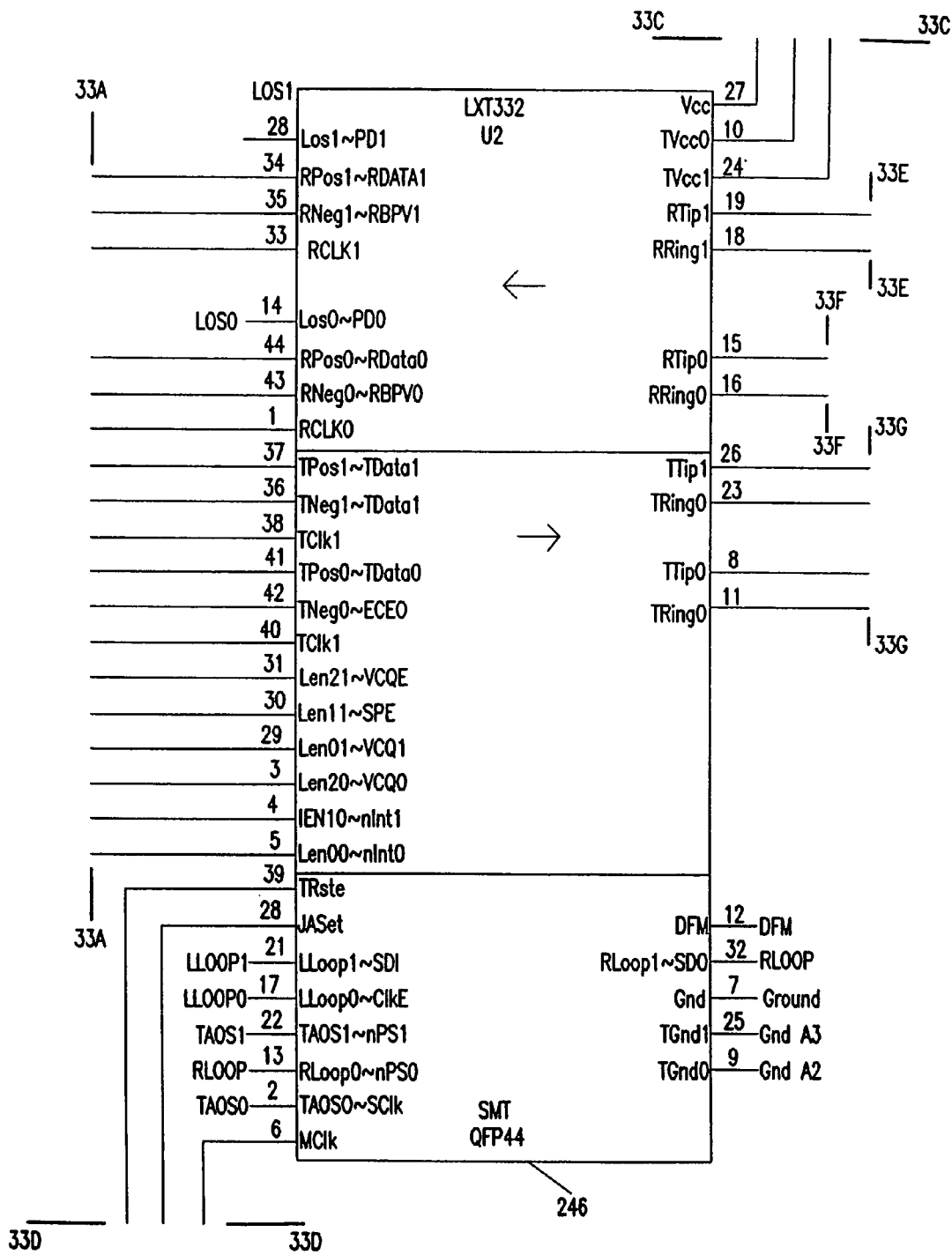
Figure 33C:
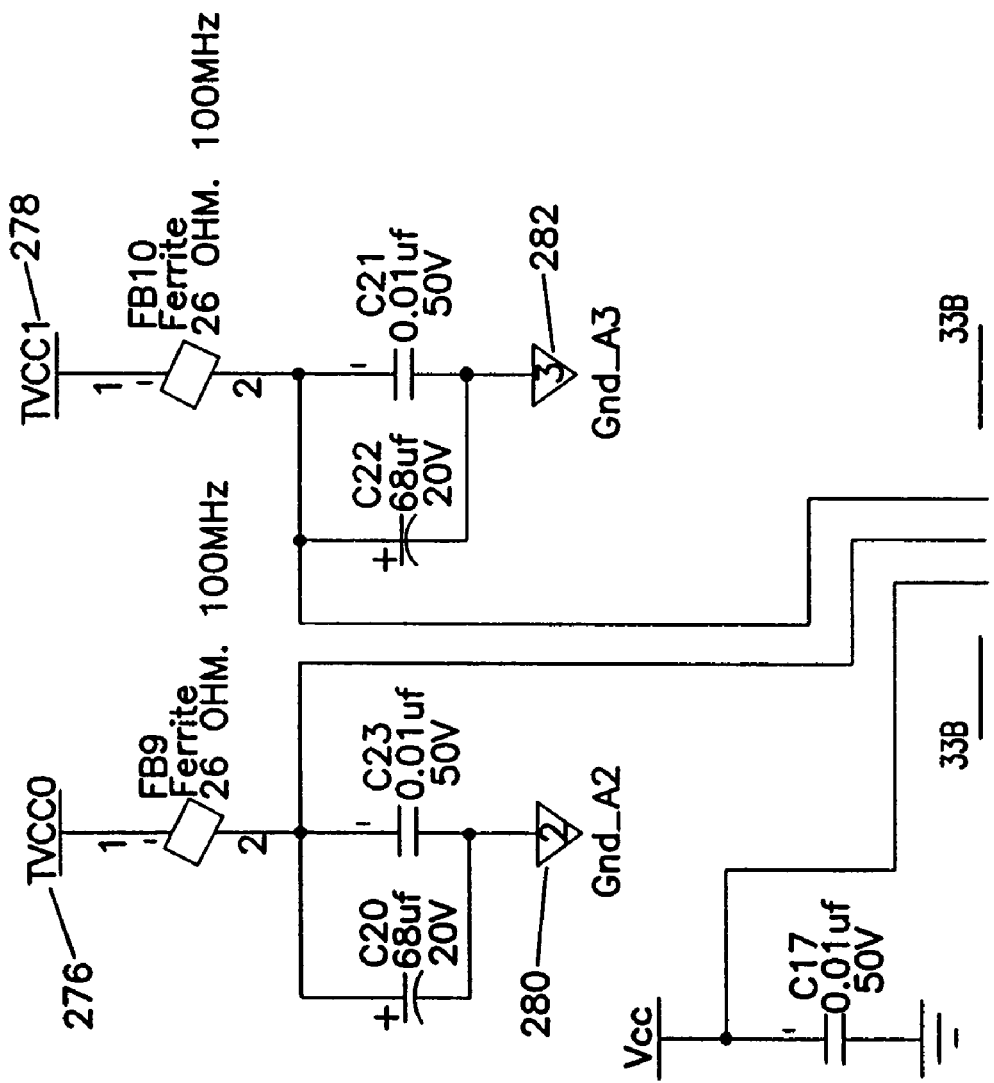
Figure 33D:
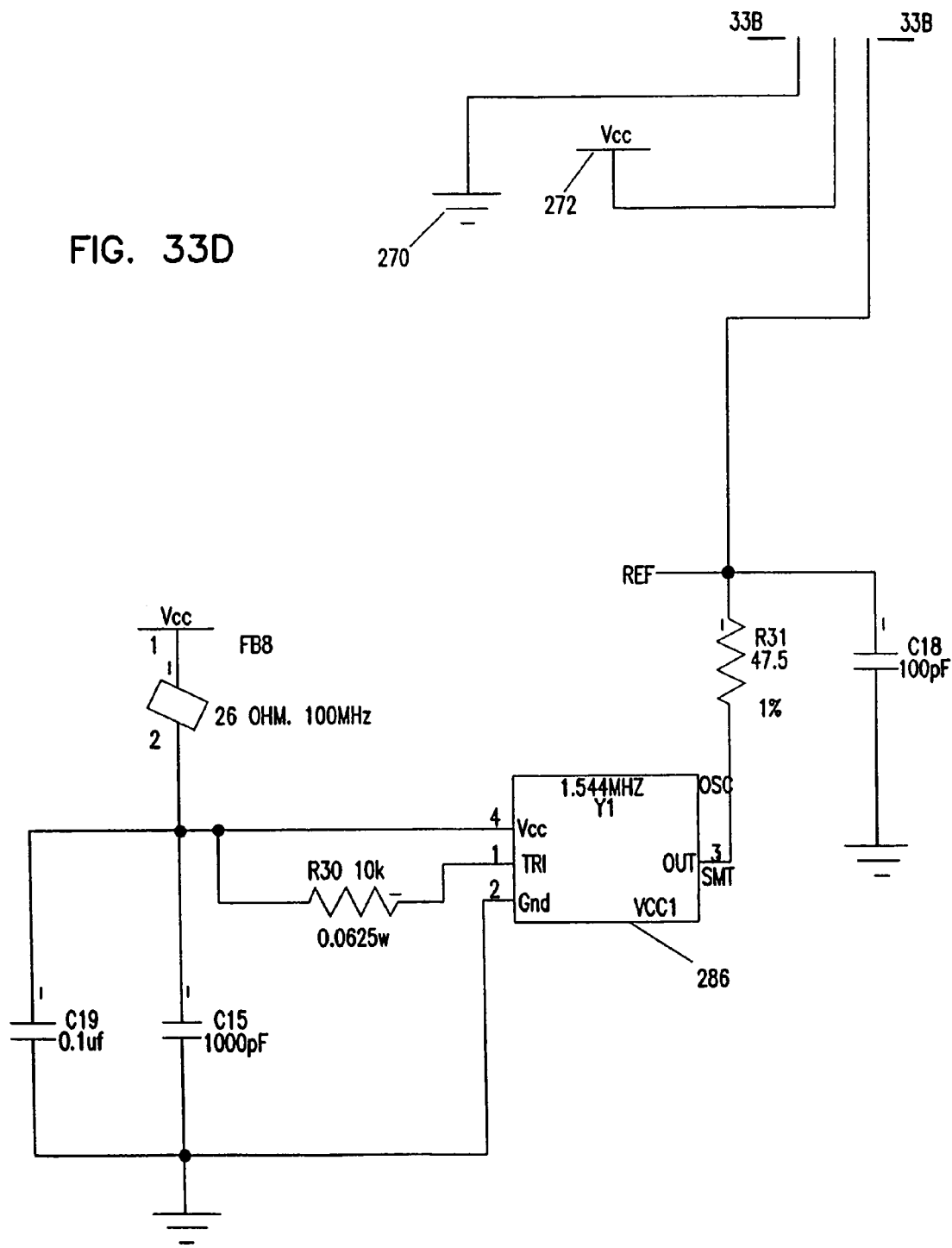
Figure 33E:
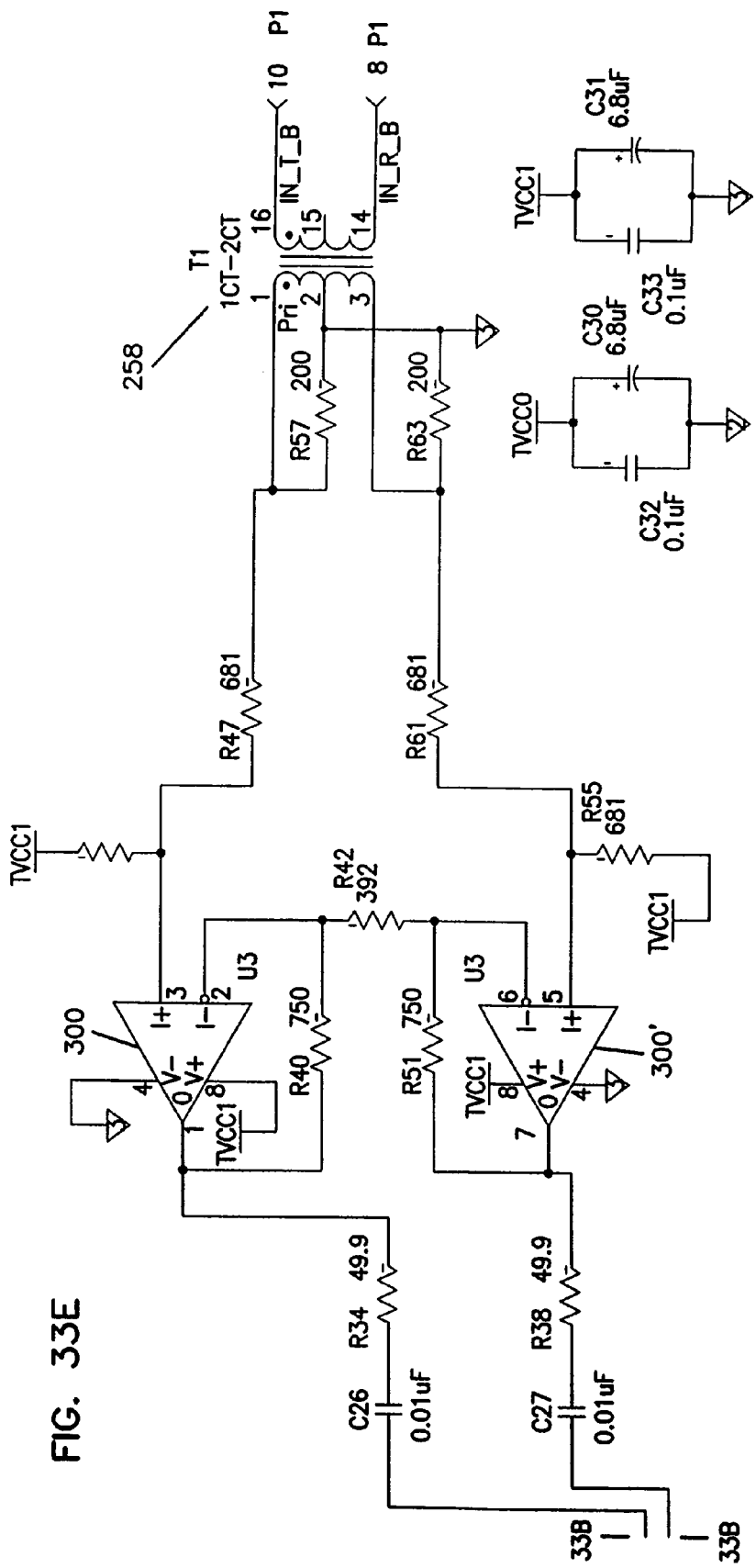
Figure 33F:
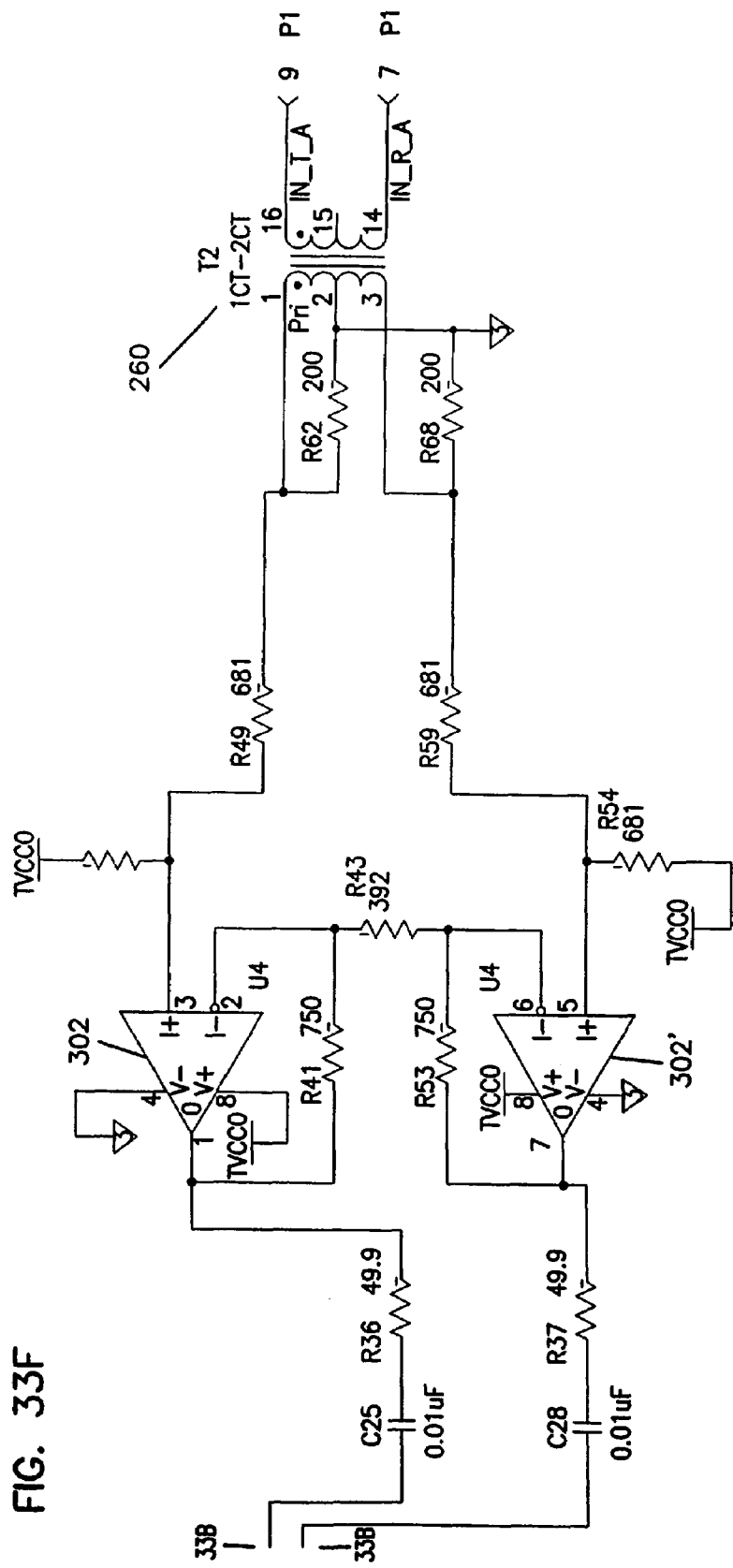
Figure 33G:
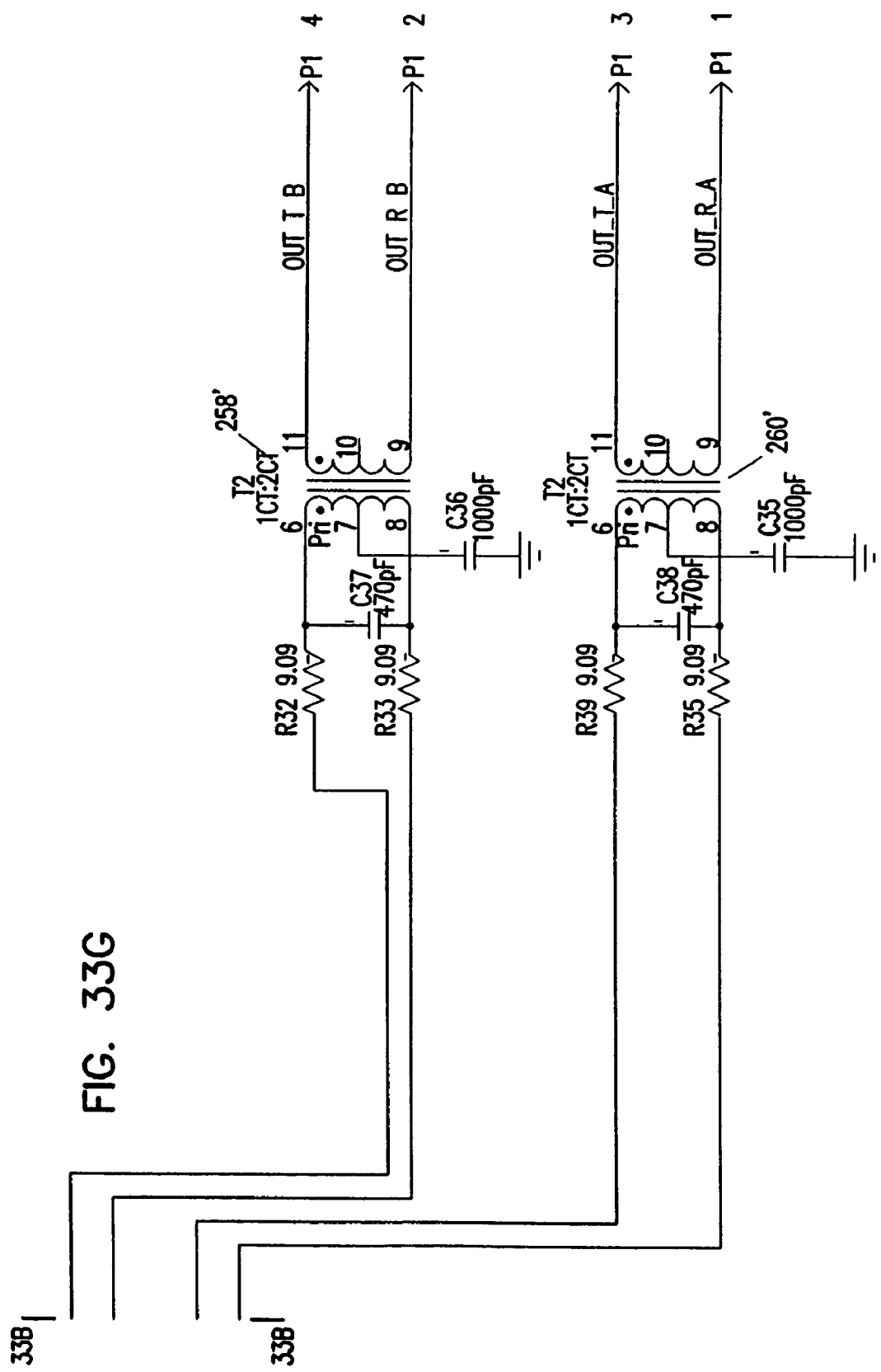

FIG. 32 shows a side view of an alternative embodiment of the repeater circuit board 172 of a card 110 suitable for installation in the chassis 100. The alternative repeater circuit board 172 also has several components positioned on the board 172 in relation to the solid areas, rows of slots, and mesh strips of the horizontal surfaces of the chassis 100. The repeater circuit board 172 includes the power supply capacitor 242, the DC-DC converter 244, and the transceiver 246 previously discussed. The board 172 has the LEDs 262, 264, and 266 that provide the external visual indications of the repeater circuit's operation. Other components of the board 172 include but are not limited to the relays 248, 250, and 252, the programmable logic device (PLD) 268, the oscillator 286, the isolation transformers 258, 258', 260, and 260', and first channel and second channel amplifiers 302, 302' and 300, 300' respectively.

The embodiment shown in FIG. 32 may be employed as a bridging repeater circuit that receives a low-level monitor signal through connector 168 and recreates the signal in a higher level suitable for network transmission and sends it out through connector 168. The bridging repeater circuit board 172 of FIG. 32 may be used where a digital signal cross-connect (DSX) becomes faulty and must be replaced without interrupting signal transfer. The bridging repeater circuit bypasses the faulty DSX without interrupting signal transfer by receiving monitor signals from healthy DSXs and providing high-level signals to the healthy DSXs until the healthy DSXs are permanently connected together.

The capacitor 242 is positioned in this alternative such that solid areas of the chassis 100 are above and below to prevent ventilating the capacitor 242. The solid areas direct air toward the rear of the board 172 past the DC-DC converter 244 and transceiver 246 with some air passing up through the first row and second rows of slots and the remainder passing beyond the amplifiers 300, 300' and 302, 302' and up through the less restricted third row of slots. The DC-DC converter 244 of this alternative embodiment may also be a model that is highly flame resistant to further enhance the flame containment of the chassis 100. An epoxy encased DC-DC converter 244 such as the Ericsson PFK 4611SI is suitable in this embodiment as well. A monitor jack, which might ordinarily be placed between the LEDs 264 and 266, is also absent in this embodiment to reduce the material on the board 172 that is susceptible to burning.

FIG. 33 shows an alternative embodiment of the transceiver circuitry located on the board 172. The transceiver 246, such as the Level One model LXT332, is electrically connected to the logic power plane 272 and the logic ground plane 270. The transceiver is also electrically linked to a channel A power plane 276, a channel A ground plane 280, a channel B power plane 278, and a channel B ground plane 282. Each channel of this alternative embodiment has its own power and ground plane to avoid cross-talk and to avoid electrical noise from the power supply circuit of FIG. 28 and chassis 100. The transceiver 246 is electrically linked to the oscillator 286 that is electrically connected to the logic power plane 272 and logic ground plane 270. The oscillator 286 provides a reference frequency signal to the transceiver 246.

The transceiver 246 receives its input signals for each channel from the input amplifiers 300, 300' and 302, 302'. The input amplifiers 300, 300' and 302, 302' receive input signals from the backplane connector 168 through the isolation transformers. Channel A input signal passes through isolation transformer 260 to the input amplifiers 302, 302', and channel A output signal passes through isolation transformer 260'. Channel B input signal passes through isolation transformer 258 to the input amplifiers 300, 300', and channel B output signal passes through isolation transformer 258'. As shown in FIG. 32, the input isolation transformer 260 and output isolation transformer 260' of channel A are contained in one unit. Similarly, the input isolation transformer 258 and output isolation transformer 258' of channel B are contained in another unit. Likewise, input amplifiers 300 and 300' of channel B are housed in one integrated circuit chip, and input amplifiers 302 and 302' of channel A are housed in another integrated circuit chip.

The input amplifiers 300, 300' for the tip and ring connections, respectively, of channel B are electrically connected to the channel B power plane 278 and also to the channel B ground plane 282. Likewise, the input amplifiers 302, 302' for the tip and ring connections, respectively, of channel A are electrically connected to the channel A power plane 276 and also to the channel A ground plane 280. Providing power to the amplifiers of differing channels from different power and ground planes reduces cross-talk and other electromagnetic interference. The input amplifiers 300, 300' and 302, 302' increase the amplitude of the monitor signal received by the bridging repeater circuit board 172 of FIG. 32 to a level within the sensitivity range of the transceiver 246. The transceiver 246 is then able to recreate the signal having the higher level suitable for network transmission.

In the bridging repeater circuit embodiment of FIG. 33, the line build-out function of the transceiver 246 is fixed at a specific signal level and shape because a consistent cable length is used when connecting the bridging repeater circuit to the healthy DSXs. Thus, line build-out variability is not needed. Resistors 304 are arranged to provide a fixed connection between certain line build-out pins of the transceiver 246 to the logic power plane 272 while providing a fixed connection between other line-build out pins of the transceiver 246 to the logic ground plane 270.

Figure 34A:
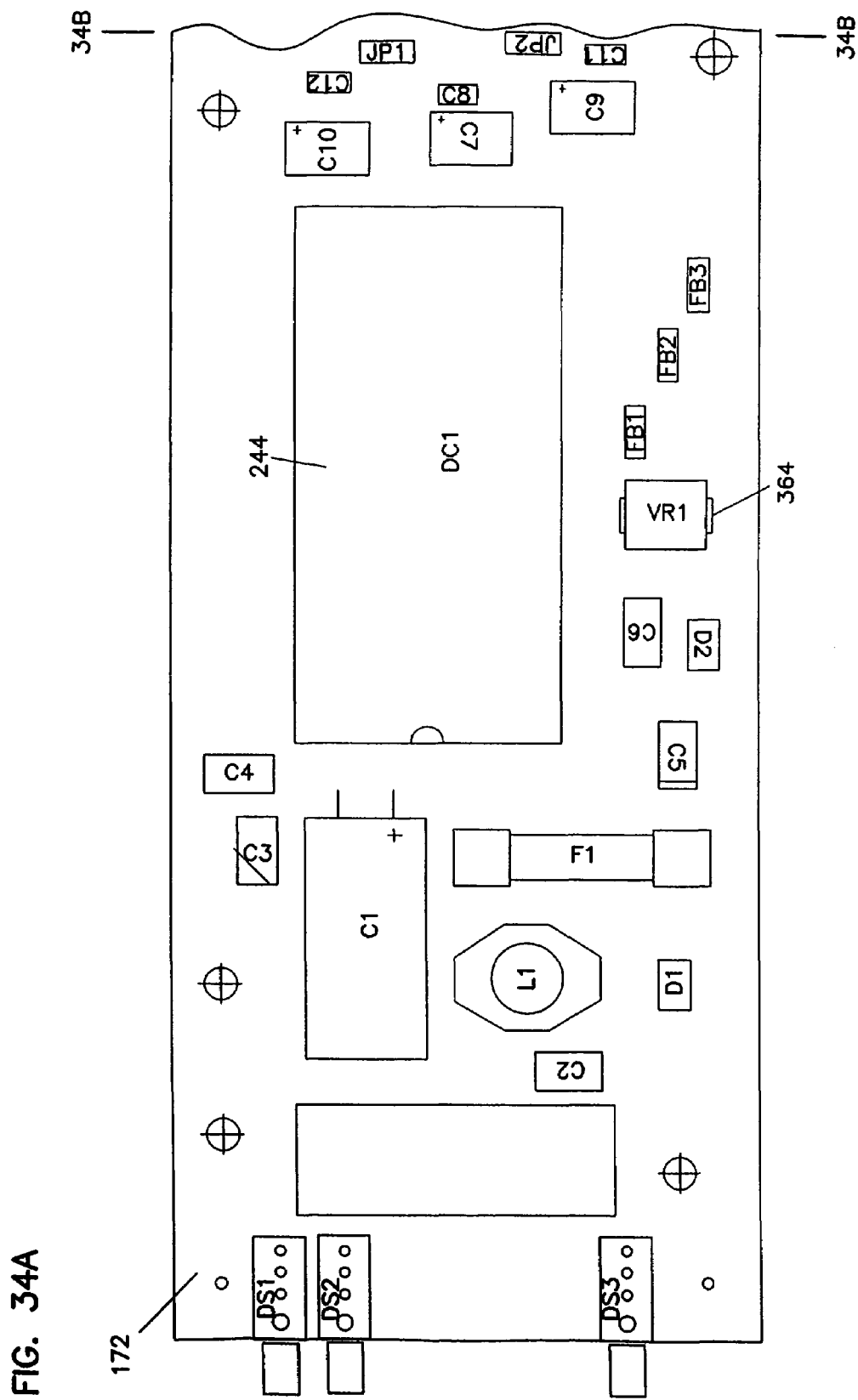
FIG. 34 is a side view of an alternative circuit board of the circuit card having line build-outs and additional surge protection components.
Figure 34B:
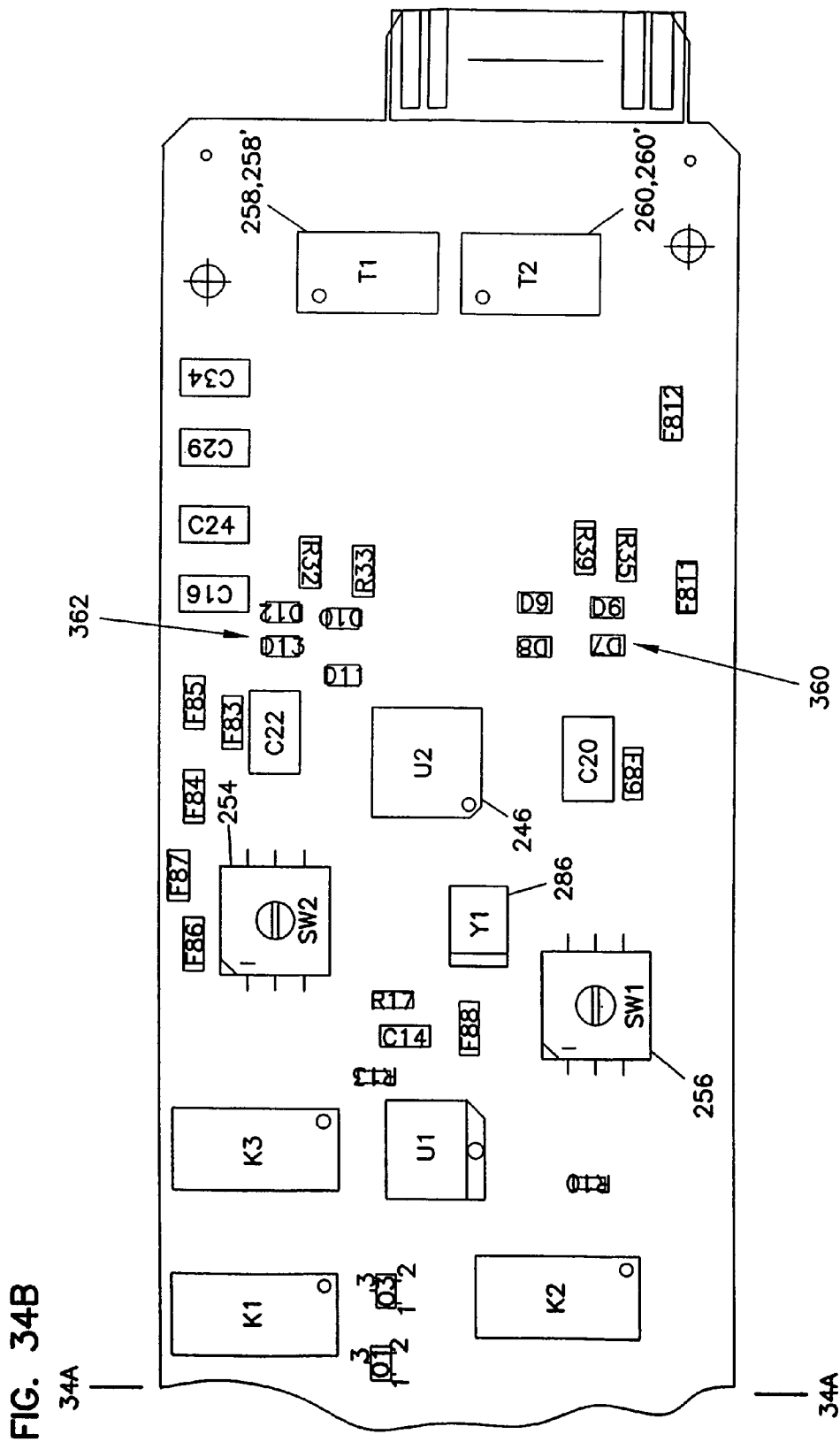
Figure 35A:
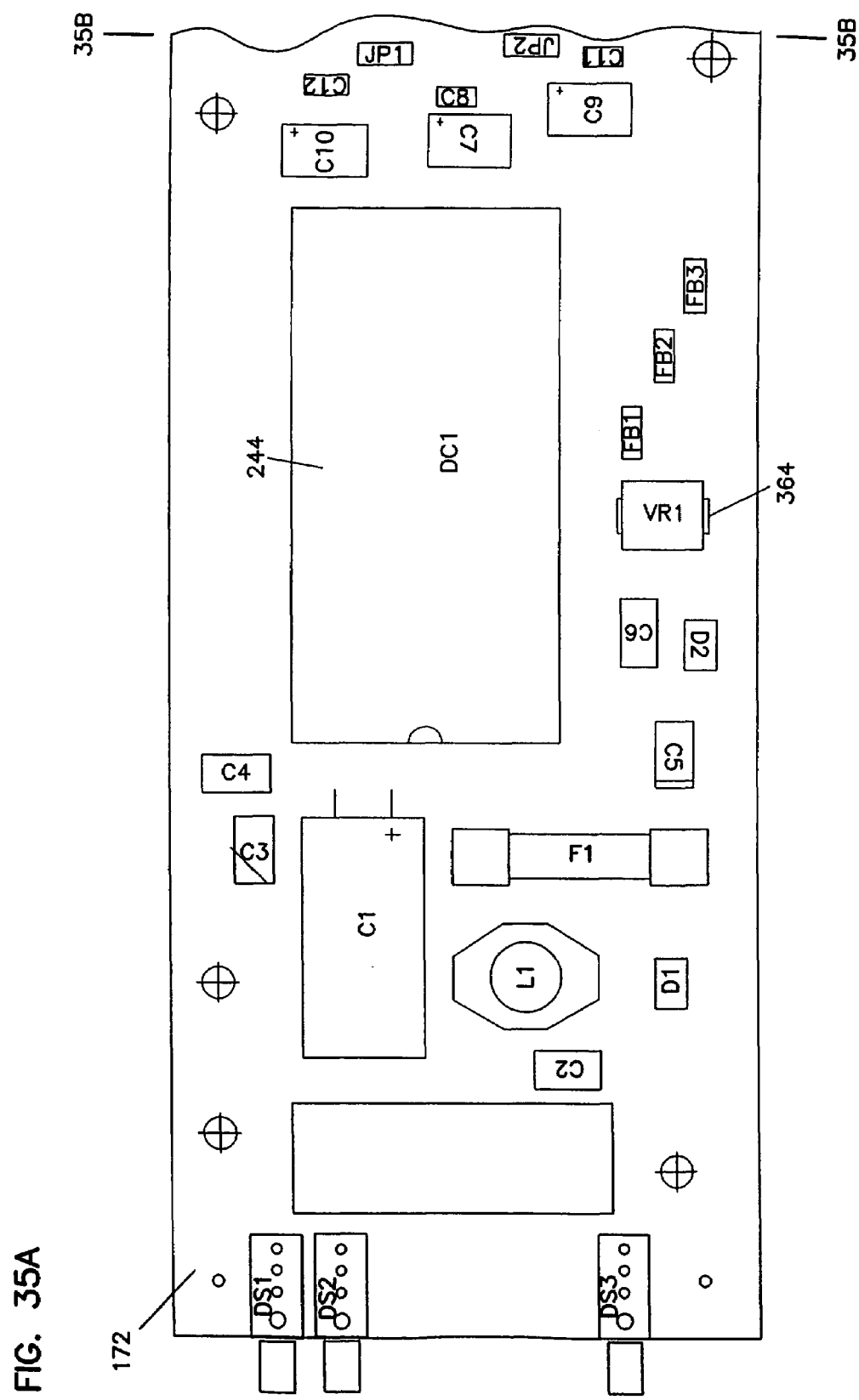
FIG. 35 is a side view of an alternative circuit board of the circuit card having input amplification and additional surge protection components.
Figure 35B:
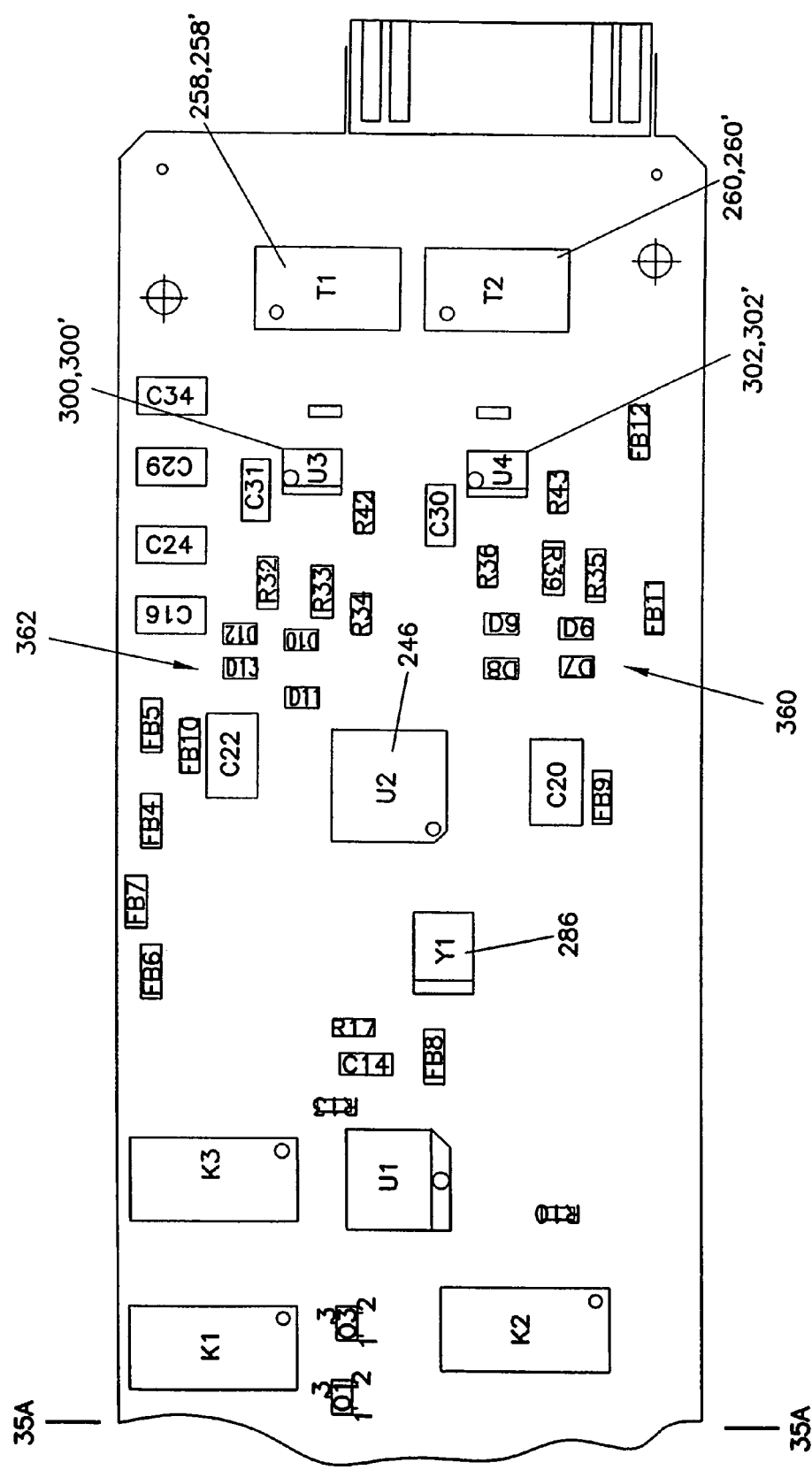

FIGS. 34 and 35 show alternative circuit board layouts whereby additional surge protection is provided. The embodiment shown in FIG. 34 contains line build-out switches 254 and 256 but lacks input amplifiers. The embodiment shown in FIG. 35 contains input amplifiers 300, 300' and 302, 302' but lacks line build-out switches. However, both of these embodiments have Schottky diode banks 360 and 362 positioned between the isolation transformers 258, 258' and 260, 260' and the transceiver 246. Each diode bank of this embodiment includes four Schottky diodes. Additionally, both of these embodiments have a transient voltage suppressor 364 positioned between the DC-DC converter 244 and the bottom of the circuit board 172 which is close to the surface 138 or surface 142 when installed in the chassis 100.

Figure 36A:
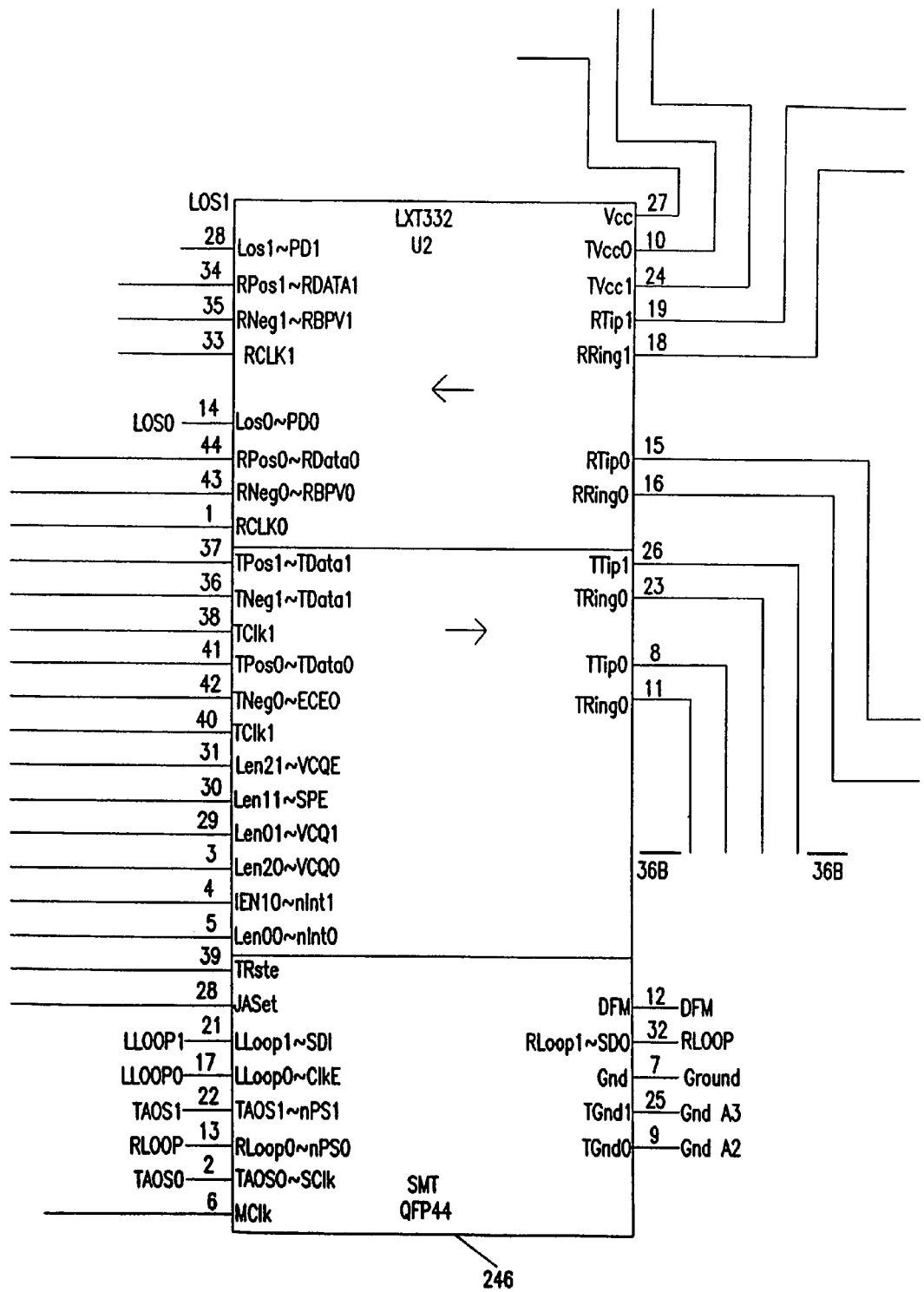
FIG. 36 is a schematic of transceiver configuration circuitry of the repeater circuit employing additional surge protection components.
Figure 36B:
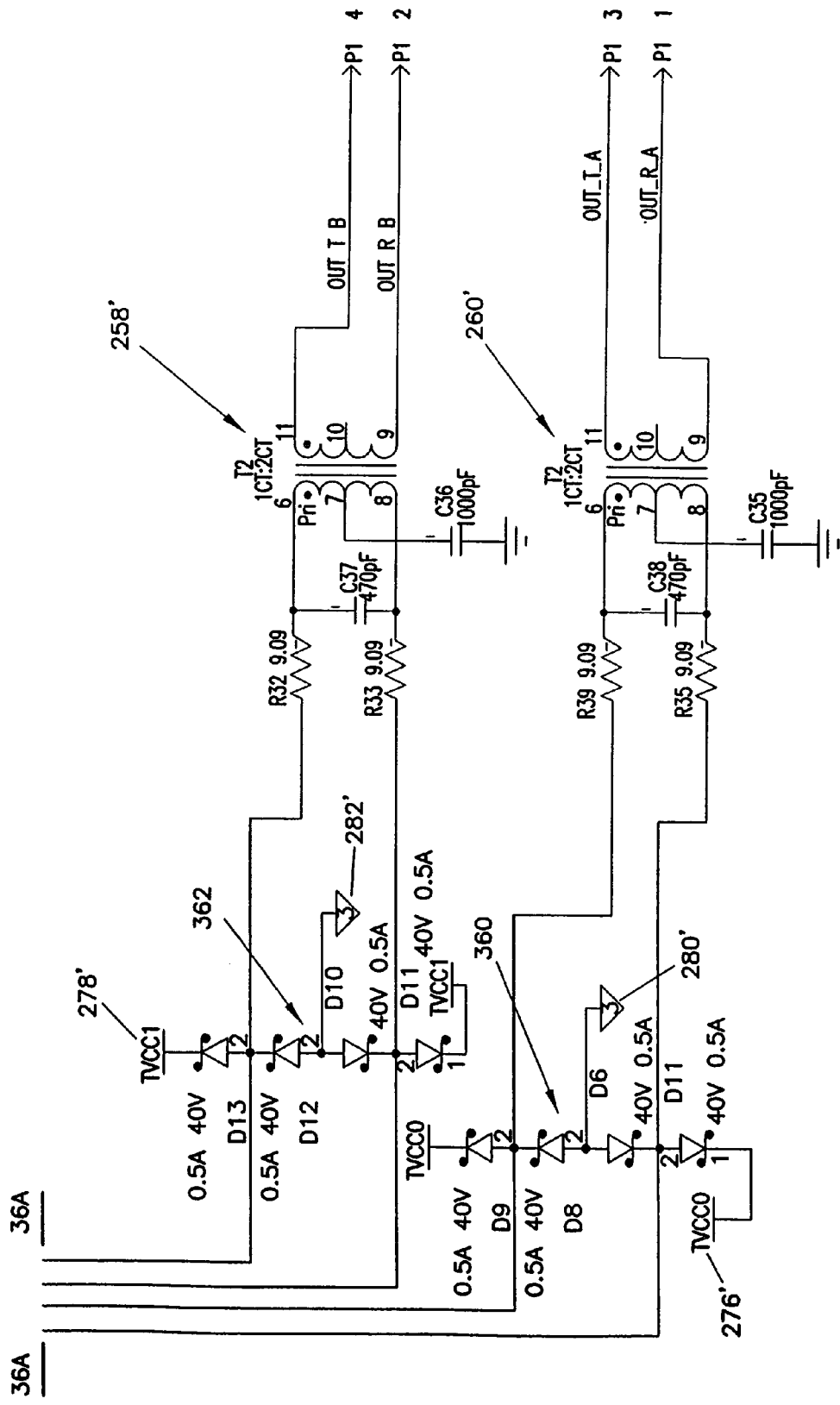

FIG. 36 shows the transceiver and the configuration of the Schottky diodes from each bank 360 and 362. This configuration of Schottky diodes can be used with either of the transceiver configurations shown in FIGS. 27 and 33. One Schottky diode of the bank 360 is tied between the channel A power plane 276' and the channel A tip output. Another Schottky diode of the bank 360 is tied between the channel A power plane 276' and the channel A ring output. Another Schottky diode of the bank 360 is tied between the channel A tip output and the channel A ground plane 280'. The last Schottky diode of the bank 360 is tied between the channel A ring output and the channel A ground plane 280'.

Channel B output is configured the same way with one Schottky diode of the bank 362 being tied between the channel B power plane 278' and the channel B tip output. Another Schottky diode of the bank 362 is tied between the channel B power plane 278' and the channel B ring output. Another Schottky diode of the bank 362 is tied between the channel B tip output and the channel B ground plane 282'. The last Schottky diode of the bank 362 is tied between the channel B ring output and the channel B ground plane 282'.

Figure 37A:
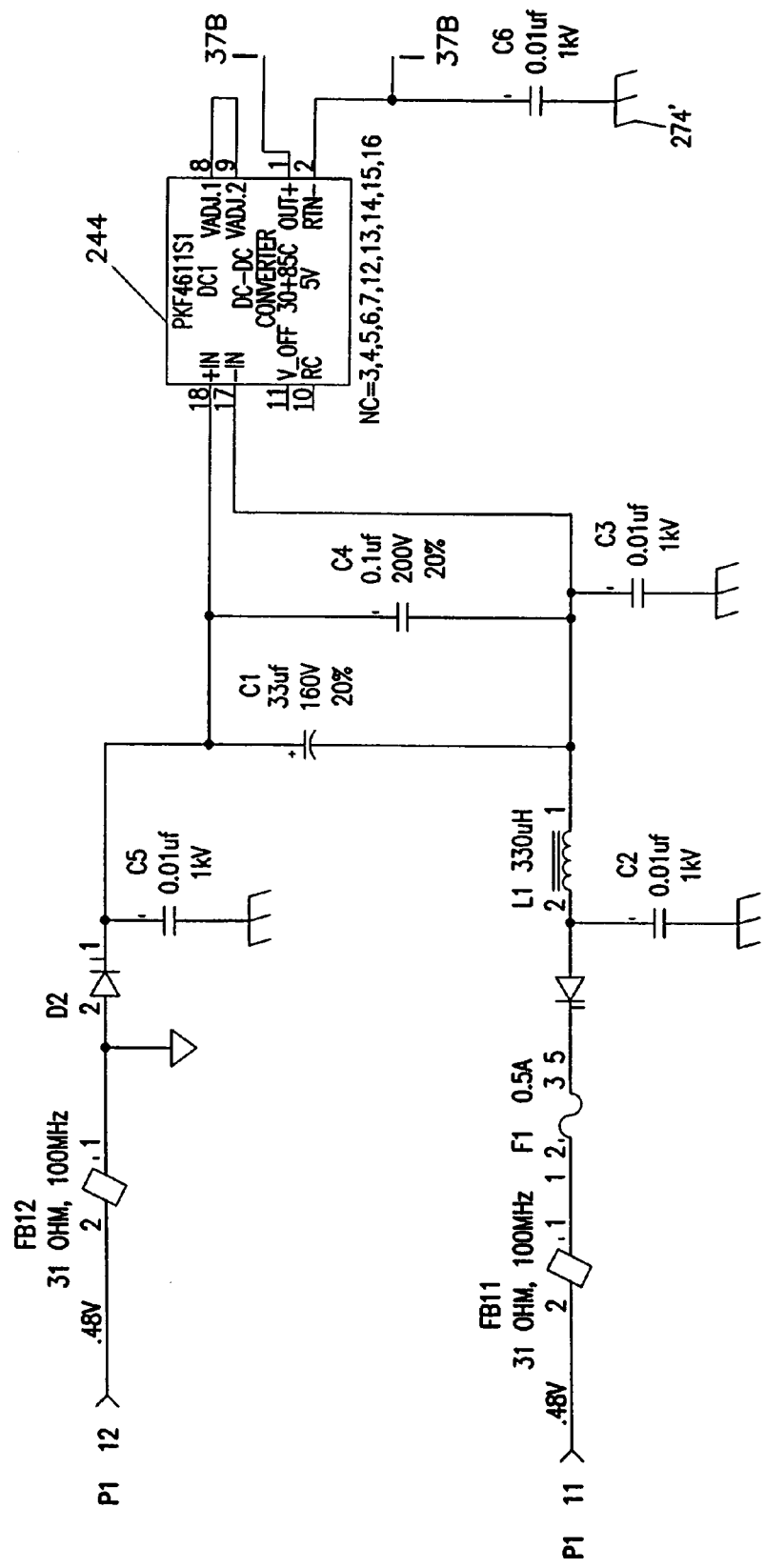
FIG. 37 is a schematic of power supply circuitry of the repeater circuit employing additional surge protection components.
Figure 37B:
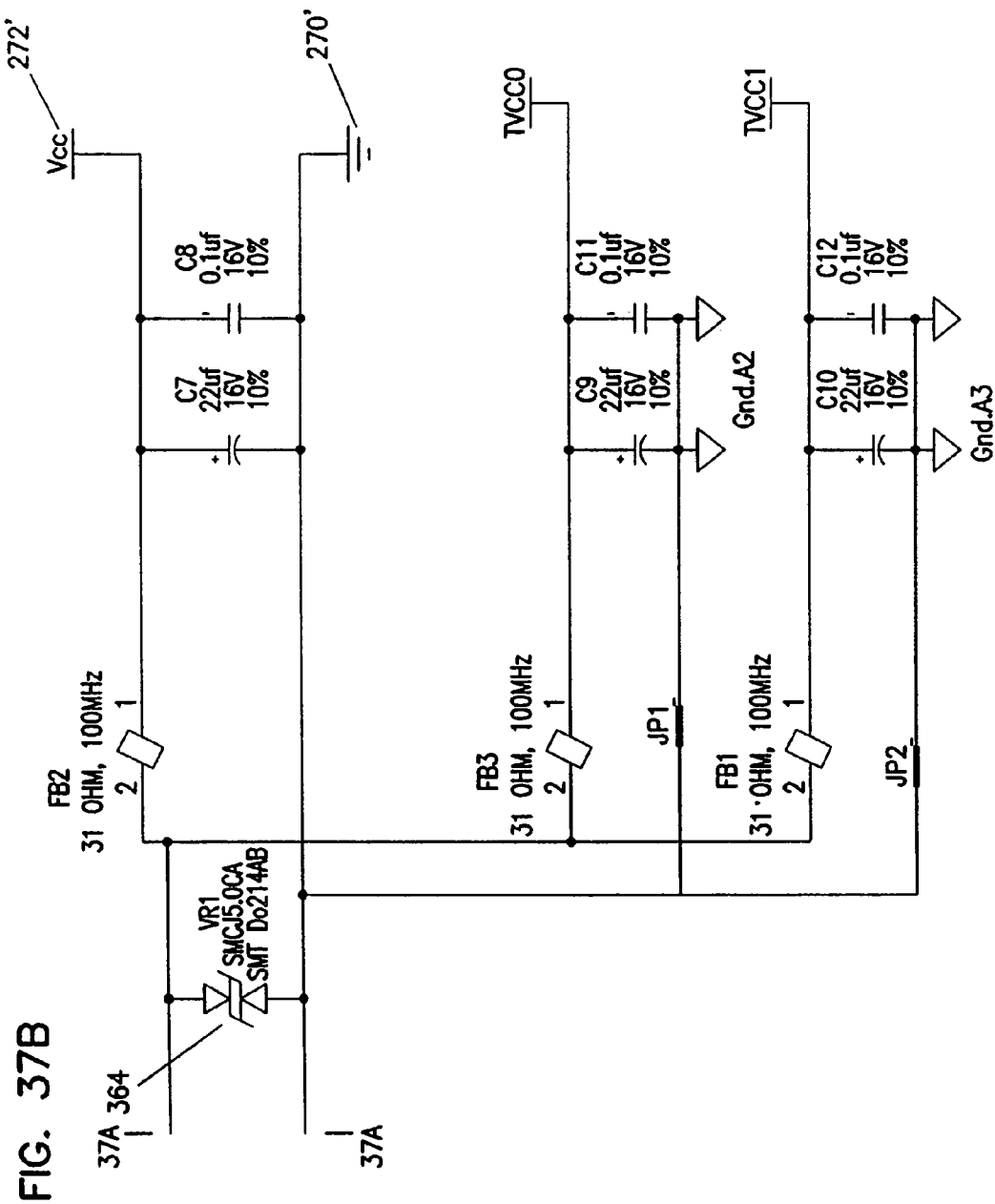

FIG. 37 illustrates the power supply circuit that includes additional surge protection. The DC-DC converter 244 of the circuit has an output line and a return line that ultimately provide the channel A power and ground, channel B power and ground, and the logic power and ground. A transient suppressor 364 is tied between the output line and the return line of the DC-DC converter 244.

Figure 38:
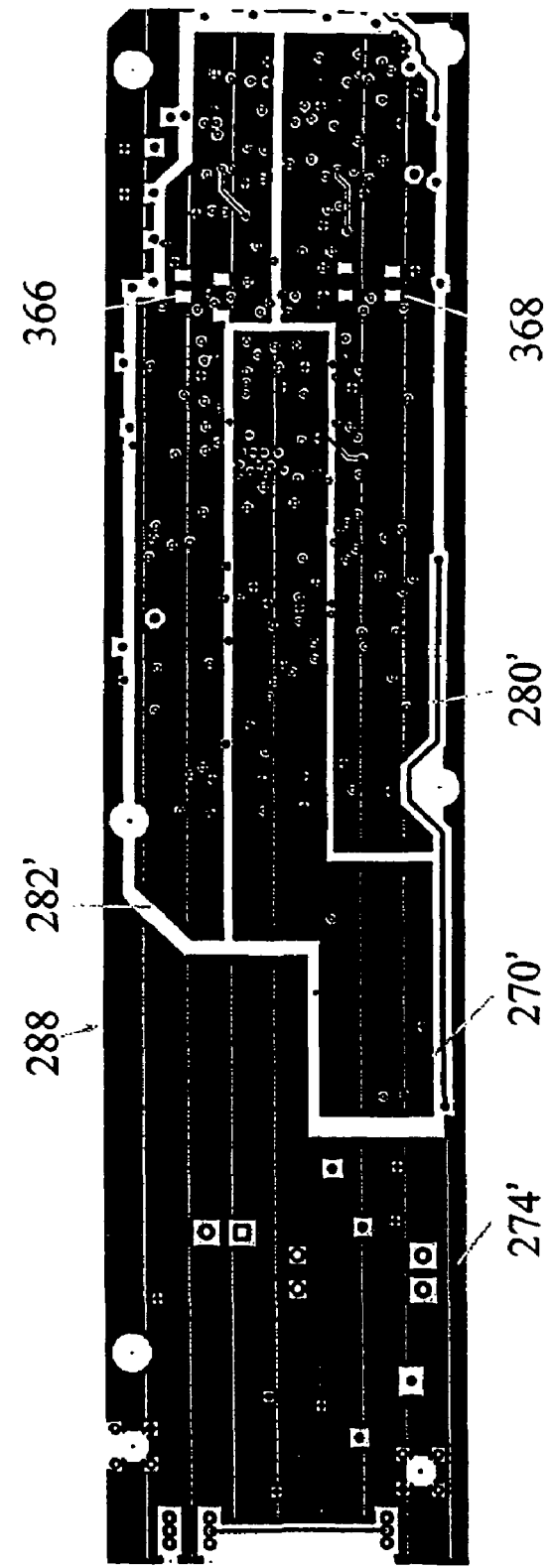
FIG. 38 is a view of an alternative ground conductor layer of the printed circuit board that employs the additional surge protection components.

FIG. 38 shows the ground layer of the circuit board 172 utilizing the additional surge protection. In this embodiment, the chassis ground plane 274 surrounds the periphery 288 of the ground layer and is electrically connected to the chassis ground provided through the chassis ground connector 109 of the chassis 100. The chassis ground plane 274' surrounds the channel A ground plane 280', logic ground plane 270', and the channel B ground plane 282'. As with the previous embodiment, chassis ground plane 274', logic ground plane 270', channel A ground plane 280', and channel B ground plane 282' are copper sheets that are isolated from each other within the single ground layer of the printed circuit board 172.

In this embodiment, the logic ground plane 270' is positioned such that it is partially between the channel A ground plane 280' and the channel B ground plane 282'. The diode bank 360 is located on the component layer and in the area 368 positioned over the channel A ground plane 280'. Similarly, the diode bank 362 is located in the area 366 positioned over the channel B ground plane 282'.

Figure 39:
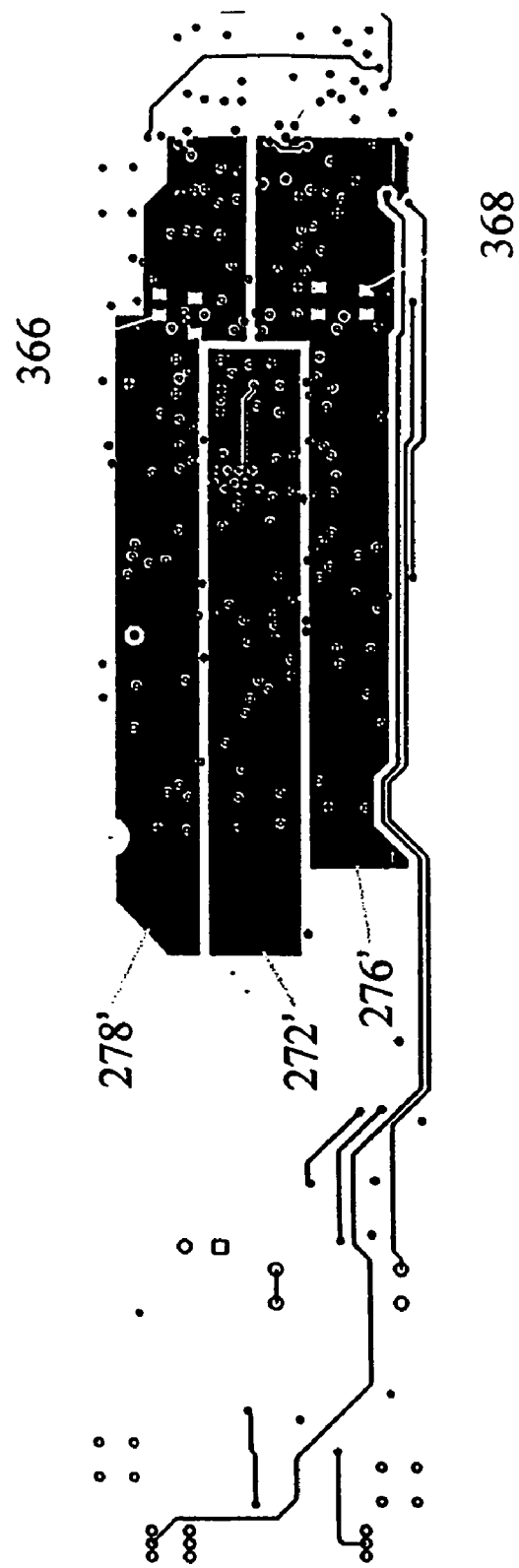
FIG. 39 is a view of an alternative power conductor layer of the printed circuit board that employs the additional surge protection components.

FIG. 39 shows a power layer of the circuit board 172 that is adjacent to the ground layer shown in FIG. 38 and separated from it by a dielectric layer. The power layer includes the logic power plane 272', the channel A power plane 276', and the channel B power plane 278'. The logic power plane 272' substantially overlaps with the logic ground plane 270' of the ground layer embodiment shown in FIG. 38. The channel A power plane 276' substantially overlaps with the channel A ground plane 280' of the ground layer embodiment shown in FIG. 38. Likewise, the channel B power plane 278' substantially overlaps with the channel B ground plane 282' of the ground layer embodiment shown in FIG. 38. As can be seen, the bank 360 of diodes is located on the component layer in the area 368 positioned over the channel A power plane 276'. The bank 362 of diodes is positioned over the channel B power plane 278'.

While the invention has been particularly shown and described with reference to preferred embodiments thereof, it will be understood by those skilled in the art that various other changes in the form and details may be made therein without departing from the spirit and scope of the invention.

What is claimed is:

1. A chassis for housing telecommunications cards, comprising:

first and second horizontal surfaces separated by first and second vertical sidewalls, the first horizontal surface having a first ridge substantially perpendicular to the first and second vertical sidewalls and defining recessed portions of the first horizontal surface on both sides of the first ridge wherein the first ridge and the recessed portions on both sides of the first ridge extend from the first vertical sidewall to the second vertical sidewall, the first horizontal surface also having a plurality of grooves extending across at least a portion of the first horizontal surface, each groove of the plurality being substantially perpendicular to the first ridge and extending through the first horizontal surface, and wherein one or more slots are positioned between adjacent grooves of the plurality.

2. The chassis of claim 1, further comprising:
a plurality of projections extending from the second horizontal surface.

3. The chassis of claim 1, further comprising:
a first cover overlaying the first horizontal surface, the first cover being a mesh material.

4. The chassis of claim 1 further comprising:
a second cover overlaying the first cover, the second cover being a mesh material.

5. The chassis of claim 1, further comprising:
a bottom cover underlaying the second horizontal surface, the bottom cover being a mesh material.

6. The chassis of claim 1, wherein the plurality of grooves are configured to guide the telecommunications cards, and wherein the one or more slots are sized to allow air to pass through the first horizontal surface.

* * * * *